(12) United States Patent
Hwang et al.

(10) Patent No.: US 10,892,422 B2
(45) Date of Patent: Jan. 12, 2021

(54) COMPOUND FOR ORGANIC OPTOELECTRONIC DEVICE, ORGANIC LIGHT EMITTING DIODE INCLUDING THE SAME, AND DISPLAY INCLUDING THE ORGANIC LIGHT EMITTING DIODE

(71) Applicants: SAMSUNG ELECTRONICS CO., LTD., Suwon-si (KR); CHEIL INDUSTRIES INC., Gumi-si (KR)

(72) Inventors: Kyu Young Hwang, Ansan-si (KR); O Hyun Kwon, Yongin-si (KR); Young Kwon Kim, Euiwang-si (KR); Hyeon Ho Choi, Seoul (KR); Byoung Ki Choi, Hwaseong-si (KR)

(73) Assignees: SAMSUNG ELECTRONICS CO., LTD., Gyeonggi-Do (KR); CHEIL INDUSTRIES INC., Gyeongsangbuk-Do (KR)

( * ) Notice: Subject to any disclaimer, the term of this patent is extended or adjusted under 35 U.S.C. 154(b) by 562 days.

(21) Appl. No.: 14/152,153

(22) Filed: Jan. 10, 2014

(65) Prior Publication Data
US 2014/0203257 A1 Jul. 24, 2014

(30) Foreign Application Priority Data

Jan. 18, 2013 (KR) .................. 10-2013-0006061
Nov. 6, 2013 (KR) .................. 10-2013-0134421

(51) Int. Cl.
*H01L 51/00* (2006.01)
*H01L 51/50* (2006.01)

(52) U.S. Cl.
CPC ...... *H01L 51/0067* (2013.01); *H01L 51/0071* (2013.01); *H01L 51/0094* (2013.01); *H01L 51/5012* (2013.01); *H01L 51/5016* (2013.01)

(58) Field of Classification Search
USPC ...................................................... 428/690
See application file for complete search history.

(56) References Cited

U.S. PATENT DOCUMENTS

| 7,834,198 B2 | 11/2010 | Takimiya et al. |
| 8,084,624 B2 | 12/2011 | Takimiya et al. |
| 8,440,713 B2 | 5/2013 | Goto et al. |
| 8,766,248 B2 | 7/2014 | Hotta et al. |
| 2009/0001357 A1 | 1/2009 | Takimiya et al. |
| 2011/0024731 A1 | 2/2011 | Takimiya et al. |
| 2011/0040107 A1 | 2/2011 | Goto et al. |
| 2012/0273764 A1 | 11/2012 | Yu et al. |
| 2013/0150576 A1* | 6/2013 | Hotta .................. C07D 487/04 544/209 |
| 2013/0200350 A1* | 8/2013 | Sawada ................ C07D 487/04 257/40 |
| 2014/0167026 A1* | 6/2014 | Kato ................... H01L 51/0072 257/40 |

FOREIGN PATENT DOCUMENTS

| JP | 2007-299980 A | 11/2007 |
| JP | 2010-270084 A | 12/2010 |
| KR | 1020070098909 A | 10/2007 |
| KR | 2010-0131745 A | 12/2010 |
| KR | 1020100135834 A | 12/2010 |
| KR | 1020110048838 | 5/2011 |
| KR | 1020110116635 A | 10/2011 |
| WO | 2011132866 A1 | 10/2011 |
| WO | 2012-035853 A1 | 3/2012 |
| WO | 2012035934 A1 | 3/2012 |
| WO | WO 2012/035853 * | 3/2012 |
| WO | WO 2012/035934 * | 3/2012 |

OTHER PUBLICATIONS

Korean Office Action dated Dec. 20, 2016 issued for the corresponding Korean Patent Application No. 10-2013-0134421, with English Translation.
Notice of Allowance dated Jul. 27, 2017, issued for the corresponding Korean Patent Application No. 10-2013-0134421, with English Translation.

* cited by examiner

*Primary Examiner* — Austin Murata
(74) *Attorney, Agent, or Firm* — Cantor Colburn LLP

(57) ABSTRACT

A compound for an organic optoelectronic device represented by Chemical Formula 1:

Chemical Formula 1

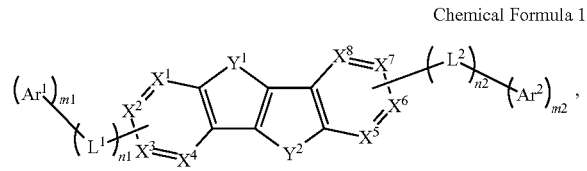

wherein groups $X^1$ to $X^8$, $Y^1$, $Y^2$, $L^1$, $L^2$, $Ar^1$, $Ar^2$, and variables m1, m2, n1, and n2 are described in the specification.

9 Claims, 2 Drawing Sheets

COMPOUND FOR ORGANIC OPTOELECTRONIC DEVICE, ORGANIC LIGHT EMITTING DIODE INCLUDING THE SAME, AND DISPLAY INCLUDING THE ORGANIC LIGHT EMITTING DIODE

CROSS-REFERENCE TO RELATED APPLICATION

This application claims priority to Korean Patent Application No. 10-2013-0006061 filed on Jan. 18, 2013, and Korean Patent Application No. 10-2013-0134421 filed on Nov. 6, 2013, and all the benefits accruing therefrom under 35 U.S.C. § 119, the contents of which are incorporated herein in their entirety by reference.

BACKGROUND

1. Field

A compound for an organic optoelectronic device, an organic light emitting diode including the compound, and a display device including the organic light emitting diode and having excellent life-span, efficiency, electrochemical stability, and thermal stability are disclosed.

2. Description of the Related Art

An organic photoelectric device is a device requiring a charge exchange between an electrode and an organic material by using holes or electrons.

An organic optoelectronic device may be classified in accordance with its driving principles. A first organic optoelectronic device is an electronic device driven as follows: excitons are generated in an organic material layer by photons from an external light source, the excitons are separated into electrons and holes, and the electrons and holes are transferred to different electrodes as a current source (voltage source).

A second organic optoelectronic device is an electronic device driven as follows: a voltage or a current is applied to at least two electrodes to inject holes and/or electrons into an organic material semiconductor positioned at an interface of the electrodes, and the device is driven by the injected electrons and holes.

Examples of the organic optoelectronic device include an organic light emitting diode, an organic solar cell, an organic photoconductor drum, an organic transistor, and the like, which require a hole injecting or transport material, an electron injecting or transport material, or a light emitting material.

Particularly, an organic light emitting diode ("OLED") has recently drawn attention due to an increasing demand for flat panel displays. In general, organic light emission refers to conversion of electrical energy into photo-energy.

Such an organic light emitting diode converts electrical energy into light by applying a current to an organic light emitting material. It has a structure in which a functional organic material layer is interposed between an anode and a cathode. The organic material layer includes a multi-layer including different materials, for example a hole injection layer ("HIL"), a hole transport layer ("HTL"), an emission layer, an electron transport layer ("ETL"), and an electron injection layer ("EIL"), in order to improve efficiency and stability of an organic light emitting diode.

In such an organic light emitting diode, when a voltage is applied between an anode and a cathode, holes from the anode and electrons from the cathode are injected into an organic material layer and recombined to generate excitons having high energy. The generated excitons generate light having certain wavelengths while shifting to a ground state.

Recently, it has become known that a phosphorescent light emitting material may be used for a light emitting material of an organic light emitting diode in addition to the fluorescent light emitting material. Such a phosphorescent material emits lights by transporting the electrons from a ground state to an exited state, non-radiance transiting of a singlet exciton to a triplet exciton through intersystem crossing, and transiting a triplet exciton to a ground state to emit light.

As described above, in an organic light emitting diode, an organic material layer includes a light emitting material and a charge transport material, for example a hole injection material, a hole transport material, an electron transporting material, an electron injection material, and the like.

The light emitting material is classified as blue, green, and red light emitting materials according to emitted colors, and yellow and orange light emitting materials to emit colors approaching natural colors.

When one material is used as a light emitting material, a maximum light emitting wavelength is shifted to a long wavelength or color purity decreases because of interactions between molecules, or device efficiency decreases because of a light emitting quenching effect. Therefore, a host/dopant system is included as a light emitting material in order to improve color purity and increase luminous efficiency and stability through energy transfer.

In order to achieve excellent performance in an organic light emitting diode, a material constituting an organic material layer, for example a hole injection material, a hole transport material, a light emitting material, an electron transporting material, an electron injection material, and a light emitting material such as a host and/or a dopant, should be stable and have good efficiency. However, development of an organic material layer forming material for an organic light emitting diode has thus far not been entirely satisfactory and thus there is a need for a novel material. This material development is also required for other organic optoelectronic devices.

A low molecular organic light emitting diode is manufactured as a thin film in a vacuum deposition method, and can have good efficiency and life-span performance. A polymer organic light emitting diode manufactured in an Inkjet or spin coating method has an advantage of low initial cost and being applicable to a large display.

Both low molecular organic light emitting and polymer organic light emitting diodes have advantages of self-light emission, high speed response, wide viewing angle, ultra-thinness, high image quality, durability, large driving temperature range, and the like. In particular, the organic light emitting diodes have good visibility due to the self-light emission characteristic compared with a conventional LCD (liquid crystal display), and have an advantage of decreasing thickness and weight of an LCD by up to a third, because they can function without a backlight.

In addition, since the organic light emitting diodes have a response speed of a microsecond unit, which is 1,000 times faster than an LCD, they can realize a perfect motion picture without an after-image. Based on these advantages, the organic light emitting diodes have been developed to have a remarkable 80 times the efficiency and more than 100 times the life-span since they first came out in the late 1980s. Recently, the organic light emitting diodes have become rapidly larger, so making and using a 40-inch organic light emitting diode panel is now possible.

The organic light emitting diodes are simultaneously required to have improved luminous efficiency and life-span in order to be larger. Such luminous efficiency requires smooth combination between holes and electrons in an emission layer. However, since an organic material in general has slower electron mobility than hole mobility, it has a drawback of inefficient combination between the holes and the electrons. Accordingly, increasing electron injection and mobility from a cathode and simultaneously preventing movement of holes is desired.

Particularly, in order to improve the life-span of the organic light emitting diode, it is desired to prevent material crystallization caused by Joule heat generated during device operation. Accordingly, there has been a strong need for an organic compound having excellent electron injection properties, mobility, and high electrochemical stability.

SUMMARY

A compound for an organic optoelectronic device that may act as a light emitting or electron injection and/or transport material, and also act as a light emitting host along with an appropriate dopant, is provided.

An organic light emitting diode having excellent life-span, efficiency, driving voltage, electrochemical and thermal stability and a display device including the same are provided.

In an embodiment, a compound for an organic optoelectronic device represented by Chemical Formula 1 is provided.

Chemical Formula 1

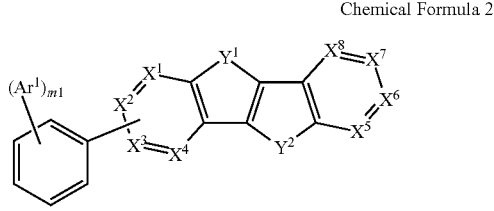

In Chemical Formula 1, $Y^1$ and $Y^2$ are independently —O—, —S—, —S(O$_2$)—, —CR'R''—, —SiR'R''—, or —NR'—, $X^1$ to $X^8$ are independently —CR'— or —N—, any two adjacent $X^1$ to $X^8$ optionally form a fused ring, $Ar^1$, $Ar^2$, R', and R'' are independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthio group, a substituted or unsubstituted C6 to C20 arylthio group, a substituted or unsubstituted C1 to C20 heterocyclothio group, a substituted or unsubstituted C1 to C20 ureide group, a substituted or unsubstituted C3 to C40 silyl group, or a combination thereof, one of $X^1$ to $X^4$ is —CR'—, wherein R' forms a bond with an adjacent substituent, one of $X^5$ to $X^8$ is —CR'—, wherein the R' forms a bond with an adjacent substituent, at least one of $Ar^1$ and $Ar^2$ is a substituted or unsubstituted C2 to C30 heteroaryl group having electron properties, $L^1$ and $L^2$ are independently a substituted or unsubstituted C2 to C20 alkenylene group, a substituted or unsubstituted C2 to C20 alkynylene group, a substituted or unsubstituted C6 to C30 arylene group, a substituted or unsubstituted C2 to C30 heteroarylene group, or a combination thereof, n1 and n2 are independently integers ranging from 0 to 3, m1 and m2 are independently integers ranging from 0 to 3, and m1 and m2 are not simultaneously 0.

The $Y^1$ and $Y^2$ may be independently —O—, —S—, —S(O$_2$)—, or —NR'—.

The $Y^1$ and $Y^2$ may be different from each other.

The compound for an organic optoelectronic device may be represented by Chemical Formula 2.

Chemical Formula 2

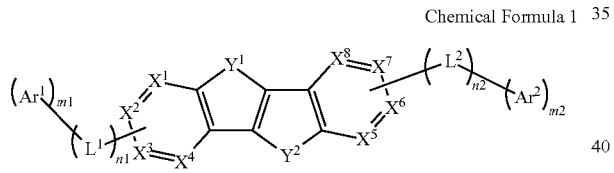

In Chemical Formula 2, $Y^1$ and $Y^2$ are independently —O—, —S—, —S(O)$_2$—, —CR'R''—, —SiR'R''—, or —NR'—, $X^1$ to $X^8$ are independently —CR'— or —N—, any two adjacent $X^1$ to $X^8$ optionally form a fused ring, $Ar^1$, R' and R'' are independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthio group, a substituted or unsubstituted C6 to C20 arylthio group, a substituted or unsubstituted C1 to C20 heterocyclothio group, a substituted or unsubstituted C1 to C20 ureide group, a substituted or unsubstituted C3 to C40 silyl group, or a combination thereof, and one of $X^1$ to $X^4$ is —CR'—, wherein R' forms a bond with an adjacent substituent, at least one Ar¹ is a substituted or unsubstituted C2 to C30 heteroaryl group having electron properties, and m1 is 1 or 2.

The compound for an organic optoelectronic device may be represented by Chemical Formula 3.

Chemical Formula 3

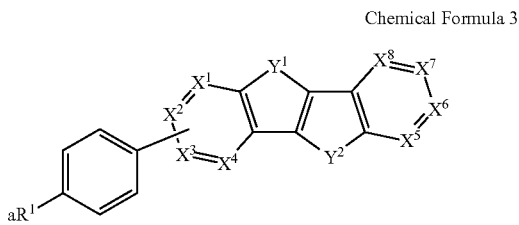

In Chemical Formula 3,

Y¹ and Y² are independently —O—, —S—, —S(O₂)—, —CR'R"—, —SiR'R"—, or —NR'—,

X¹ to X⁸ are independently —CR'— or —N—, any two adjacent X¹ to X⁸ optionally form a fused ring, R' and R" are independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthio group, a substituted or unsubstituted C6 to C20 arylthio group, a substituted or unsubstituted C1 to C20 heterocyclothio group, a substituted or unsubstituted C1 to C20 ureide group, a substituted or unsubstituted C3 to C40 silyl group, or a combination thereof, one of X¹ to X⁴ is —CR'—, wherein the R' forms a bond with an adjacent substituent, and Ar¹ is a substituted or unsubstituted C2 to C30 heteroaryl group having electron properties.

The compound for an organic optoelectronic device may be represented by
Chemical Formula 4.

Chemical Formula 4

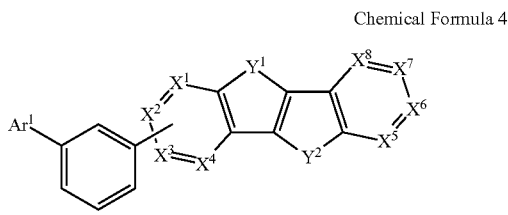

In Chemical Formula 4,

Y¹ and Y² are independently —O—, —S—, —S(O₂)—, —CR'R"—, —SiR'R"—, or —NR'—,

X¹ to X⁸ are independently —CR'— or —N—, any two adjacent X¹ to X⁸ optionally form a fused ring, R' and R" are independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthio group, a substituted or unsubstituted C6 to C20 arylthio group, a substituted or unsubstituted C1 to C20 heterocyclothio group, a substituted or unsubstituted C1 to C20 ureide group, a substituted or unsubstituted C3 to C40 silyl group, or a combination thereof, one of X¹ to X⁴ is —CR'—, wherein R' forms a bond with an adjacent substituent, and Ar¹ is a substituted or unsubstituted C2 to C30 heteroaryl group having electron properties.

All X¹ to X⁸ may be —CR'—.

At least one of X¹ to X⁸ may be N.

The Y² may be —NR'—, and the Y¹ may be —NR'— or —S—.

Both Y¹ and Y² may be —NR'—.

The Y² may be —NR'—, and the Y¹ may be —CR'R"— or —SiR'R"—.

The Y² may be —CR'R"—, and the Y¹ may be —SiR'R"—.

The substituted or unsubstituted C2 to C30 heteroaryl group having electron properties may be a substituted or unsubstituted quinolinyl group, a substituted or unsubstituted isoquinolinyl group, a substituted or unsubstituted pyridyl group, a substituted or unsubstituted pyrimidinyl group, a substituted or unsubstituted triazinyl group, or a combination thereof.

The substituted or unsubstituted C2 to C30 heteroaryl group having electron properties may be one of Chemical Formulae X-1 to X-15.

Chemical Formula X-1

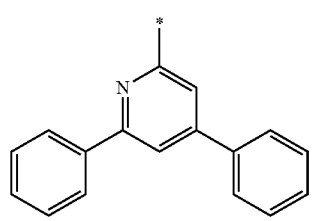

Chemical Formula X-2
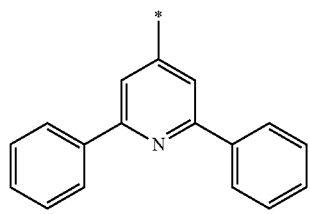
Chemical Formula X-3
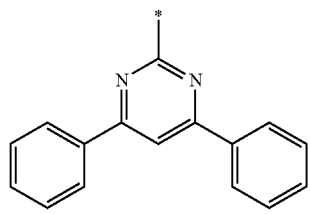
Chemical Formula X-4
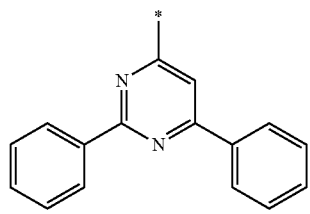
Chemical Formula X-5
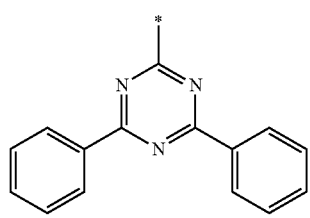
Chemical Formula X-6
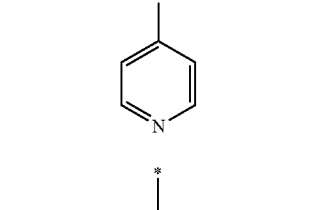
Chemical Formula X-7
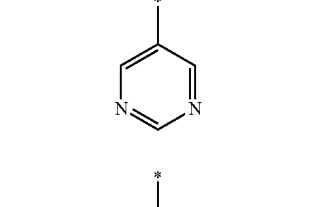
Chemical Formula X-8
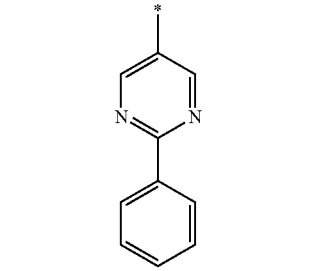
Chemical Formula X-9
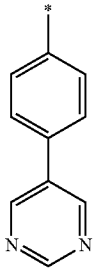
Chemical Formula X-10
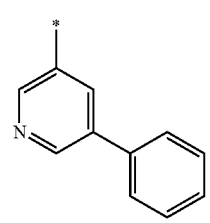
Chemical Formula X-11
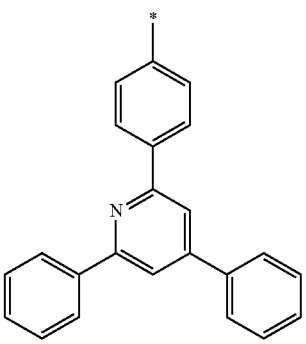
Chemical Formula X-12
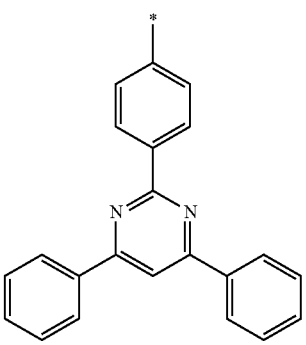
Chemical Formula X-13
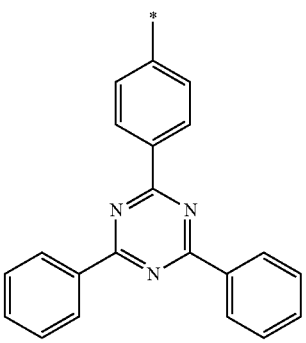

Chemical Formula X-14
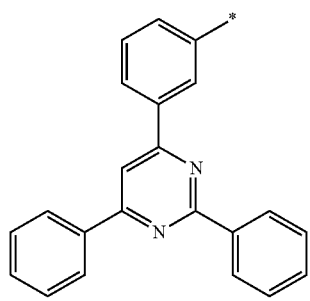
Chemical Formula X-15
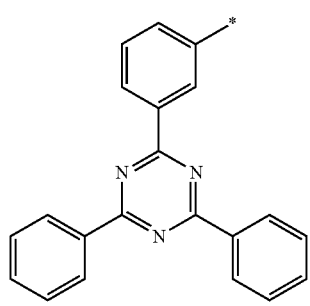
The compound for an organic optoelectronic device may be represented by one of Chemical Formulae A-1 to A-145.
A-1
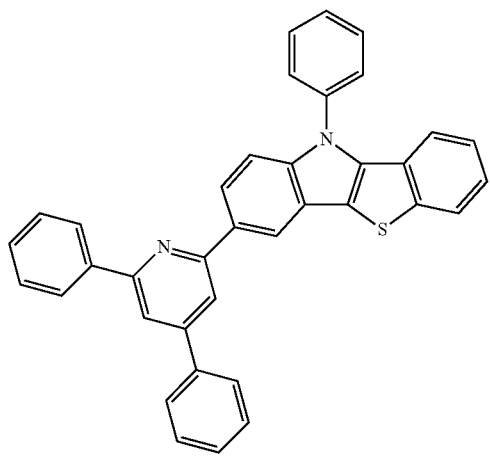
A-2
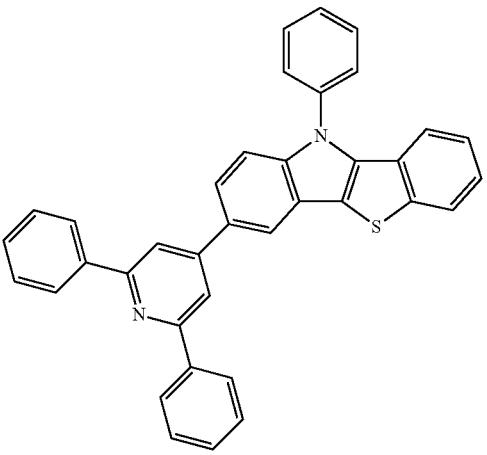
A-3
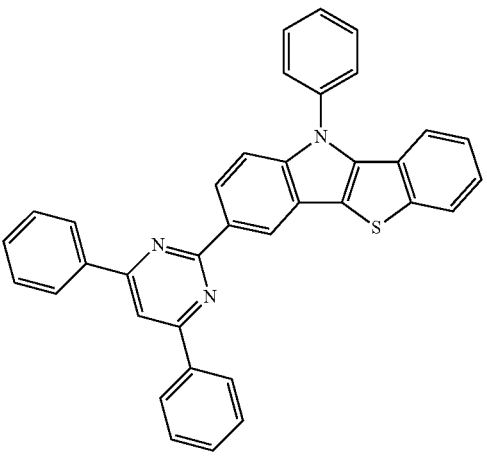
A-4
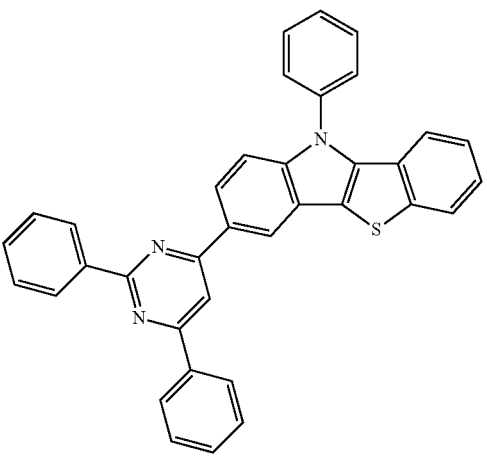

A-5
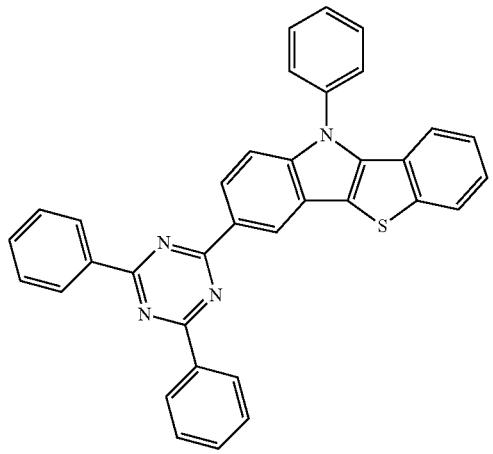
A-6
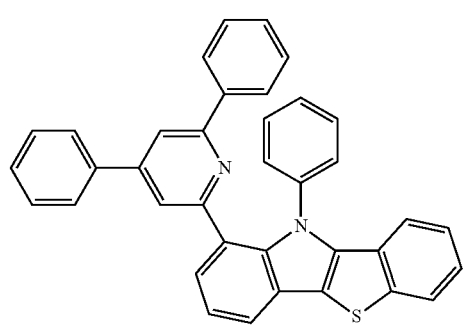
A-7
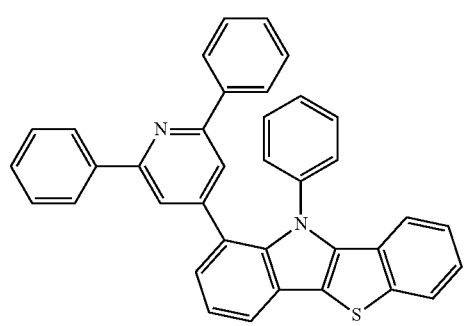
A-8
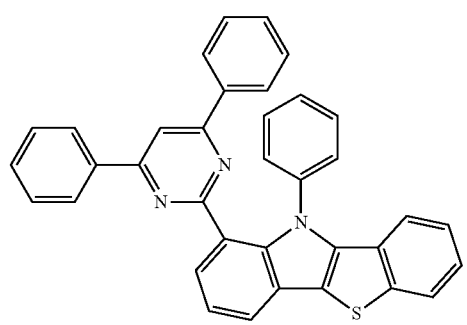
A-9
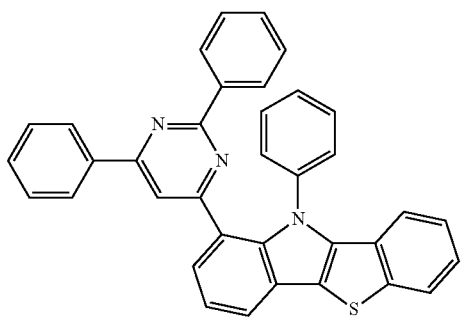
A-10
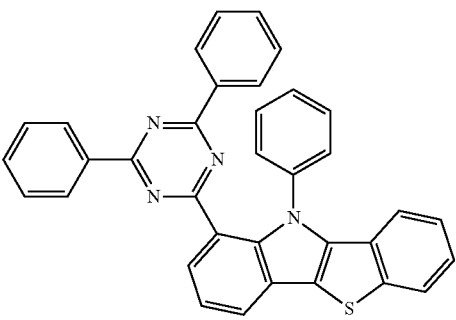
A-11
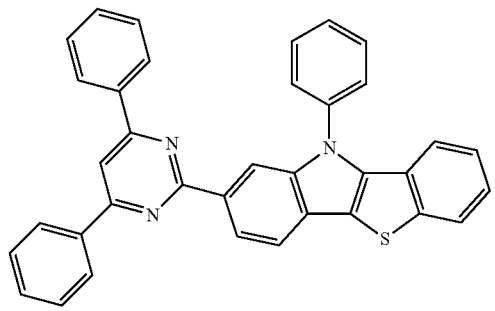
A-12
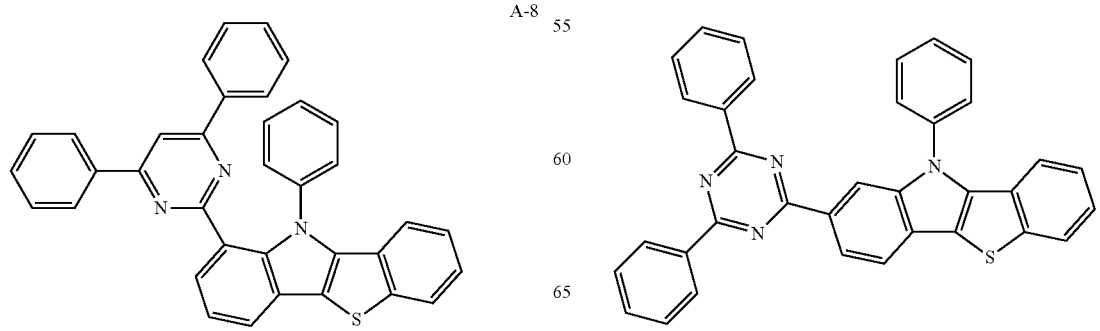

A-13
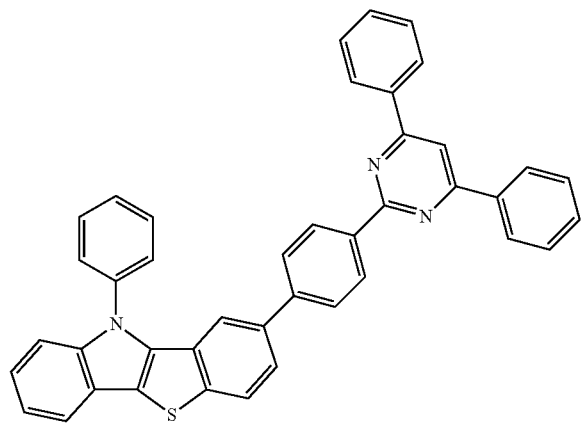
A-17
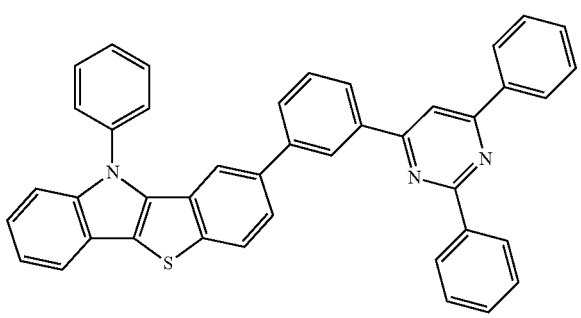
A-14
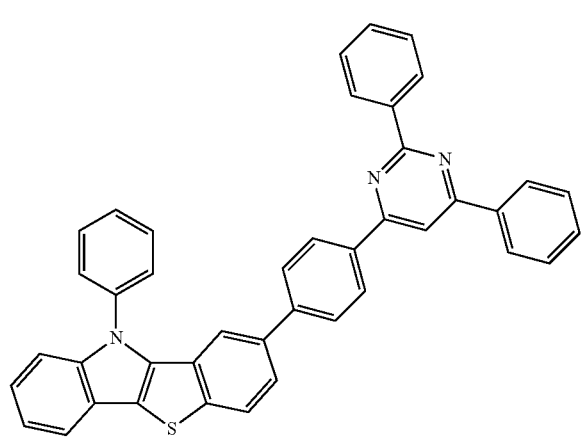
A-18
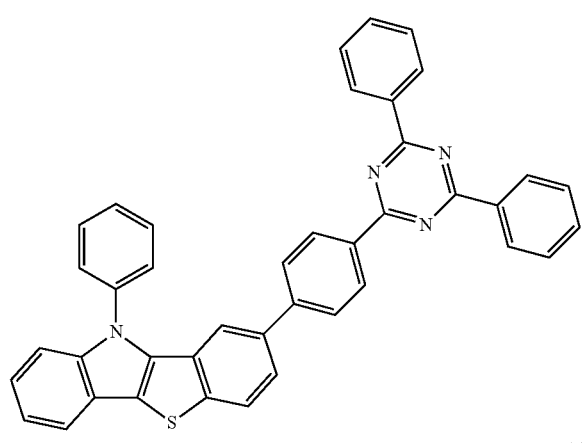
A-15
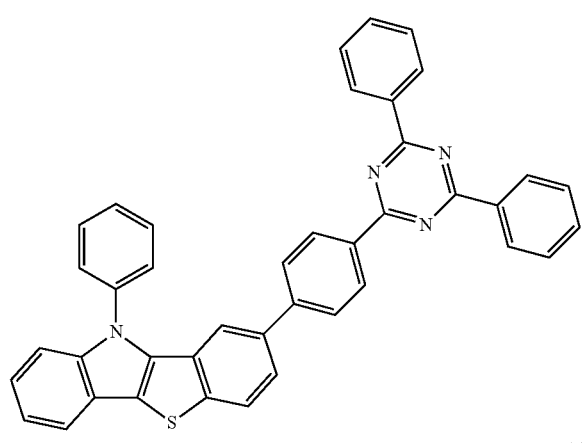
A-19
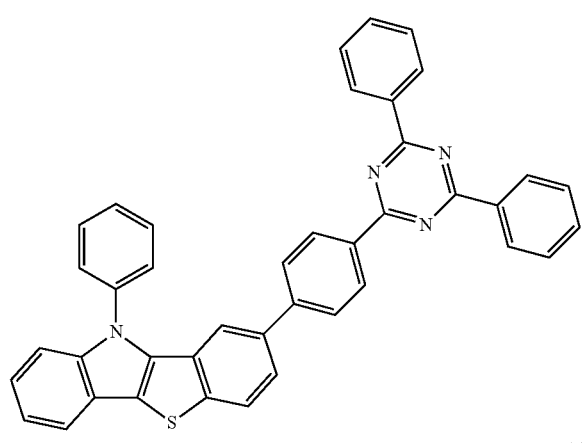
A-16
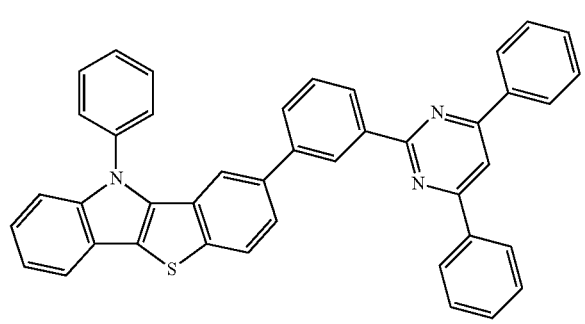
A-20
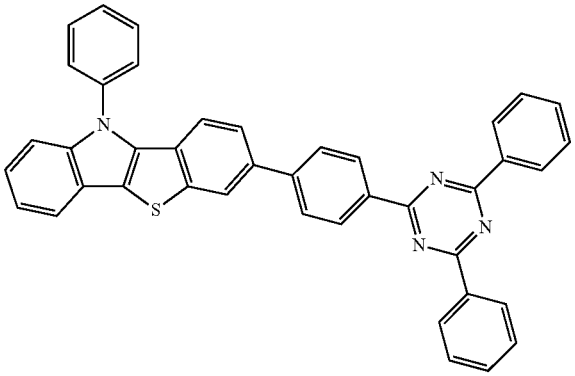

A-21
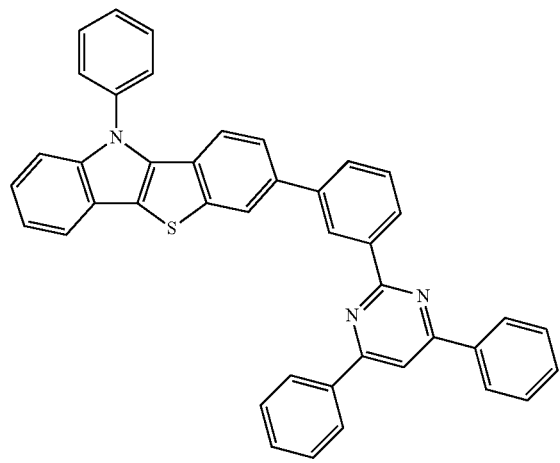
A-22
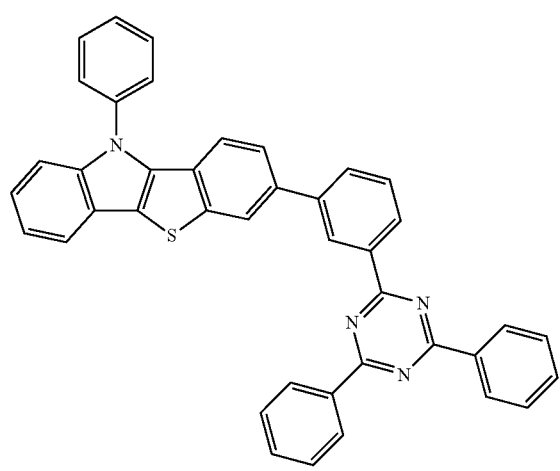
A-23
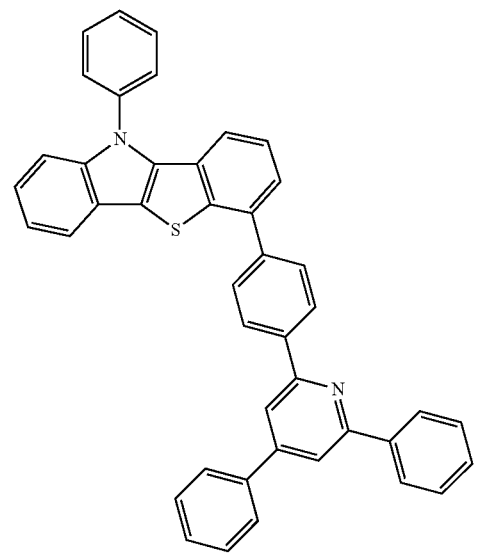
A-24
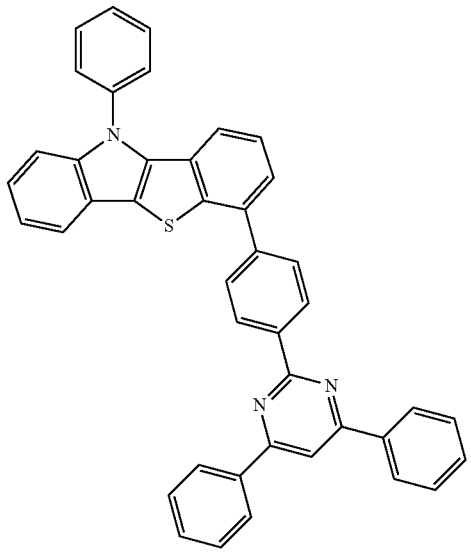
A-25
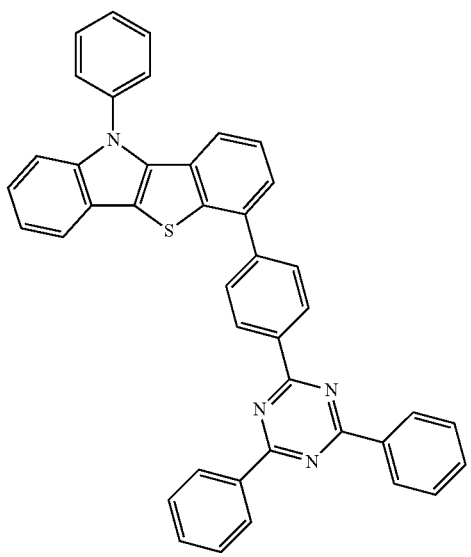
A-26
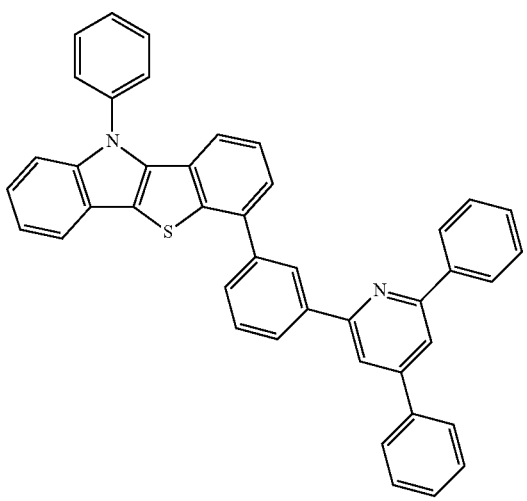

A-27
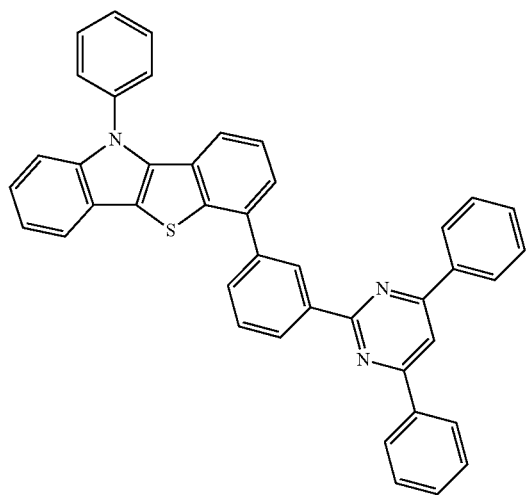
A-28
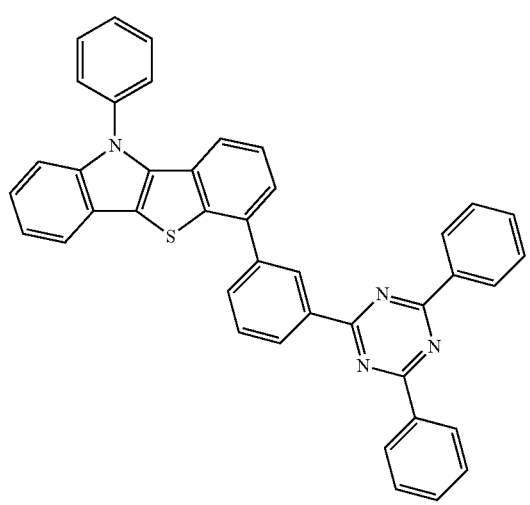
A-29
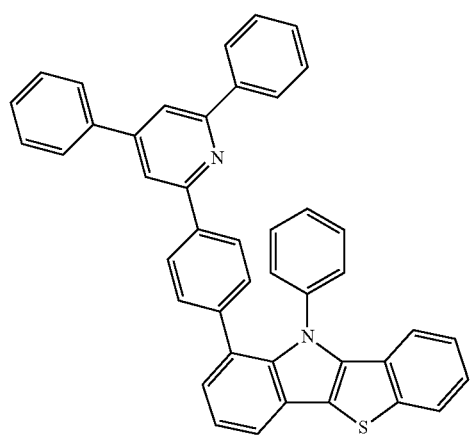
A-30
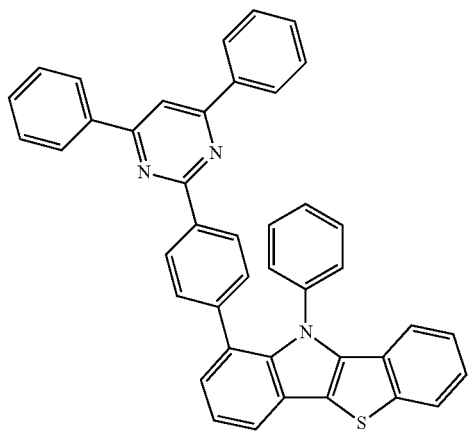
A-31
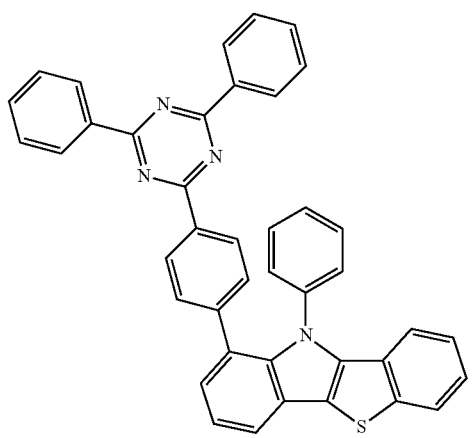
A-32
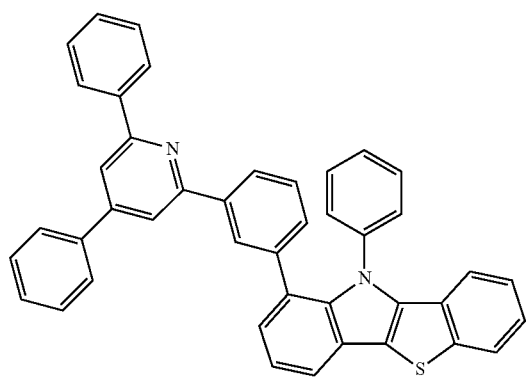
A-33
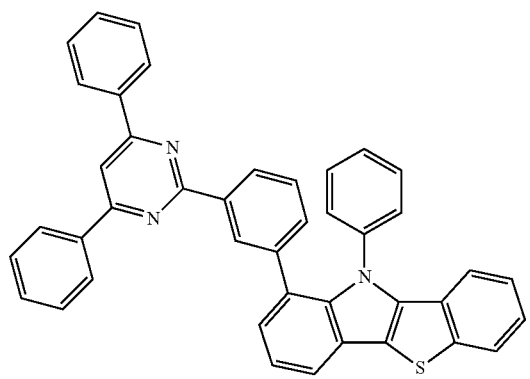

A-34
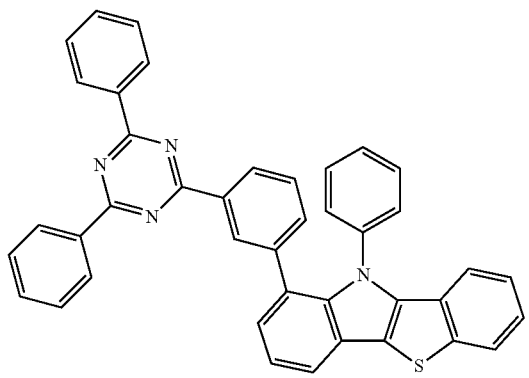
A-35
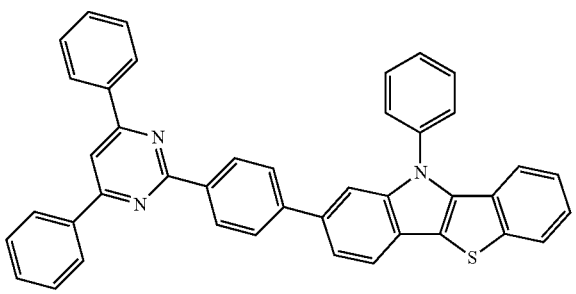
A-36
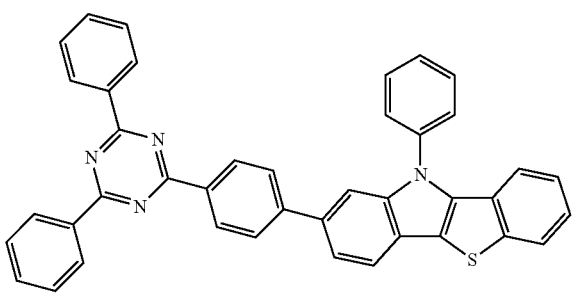
A-37
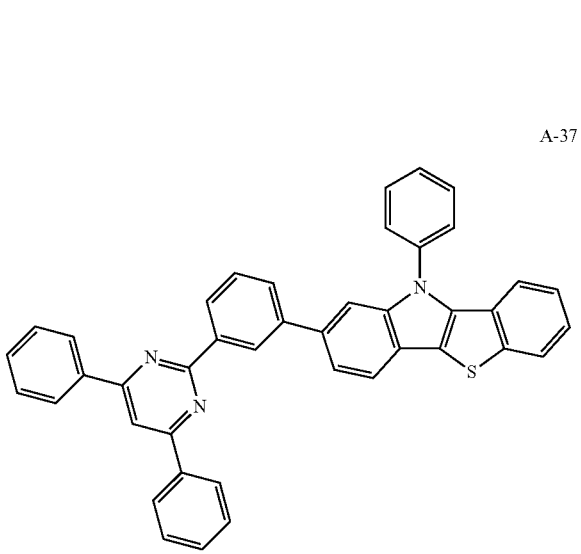
A-38
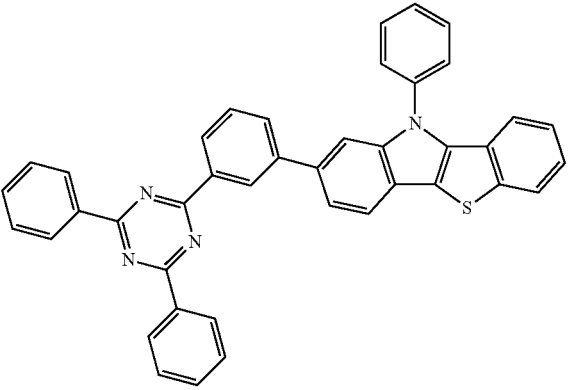
A-39
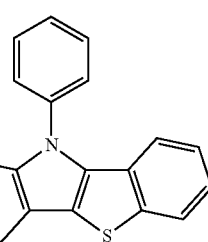
A-40
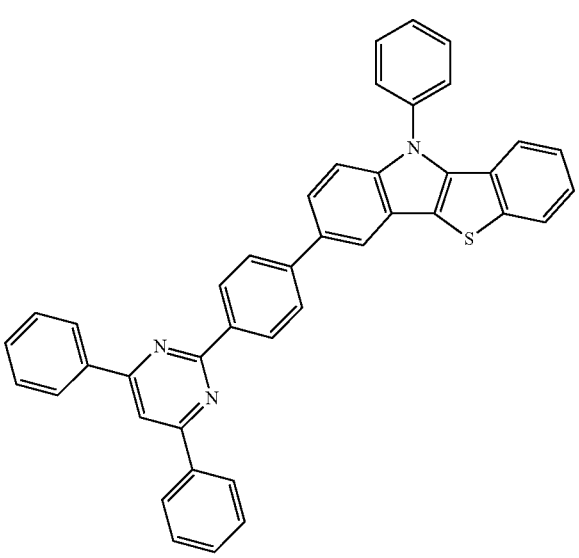

-continued
A-41
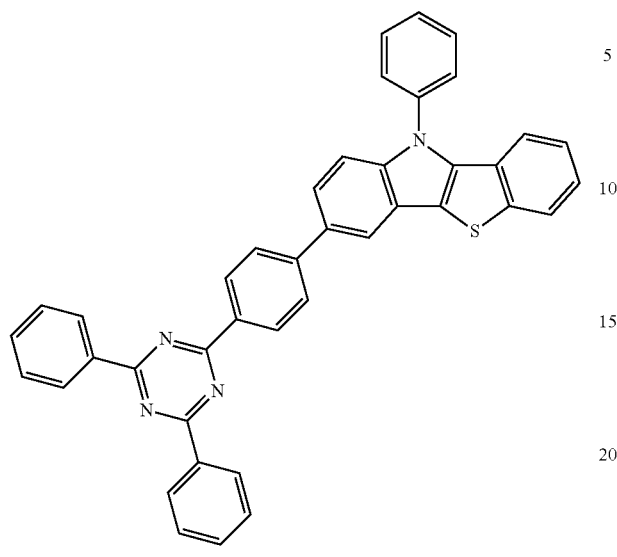
A-41
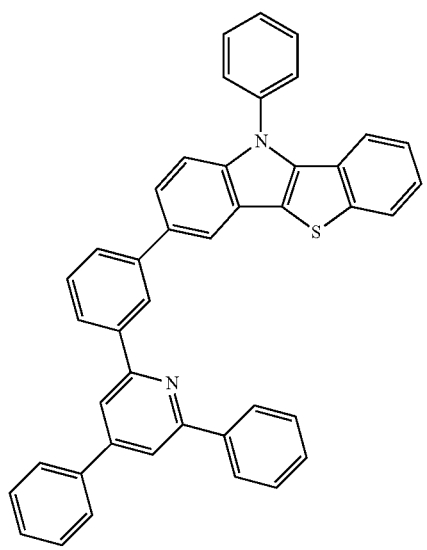
A-42
A-43
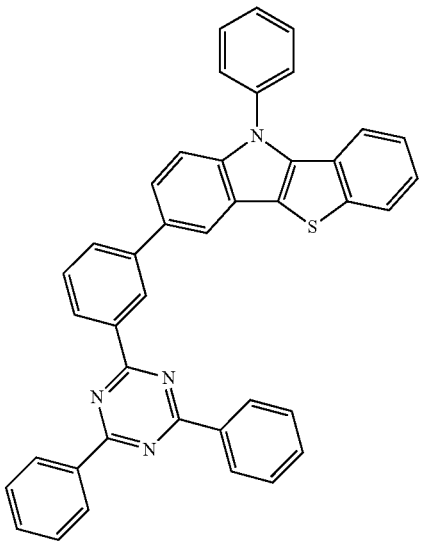
A-44
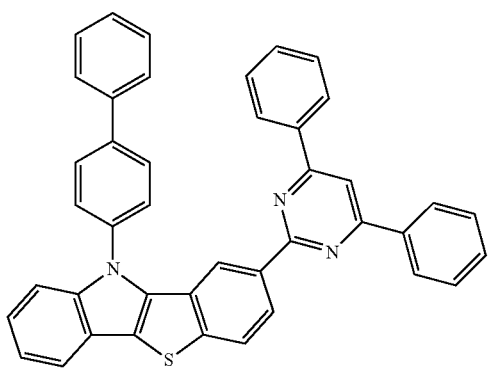
A-45
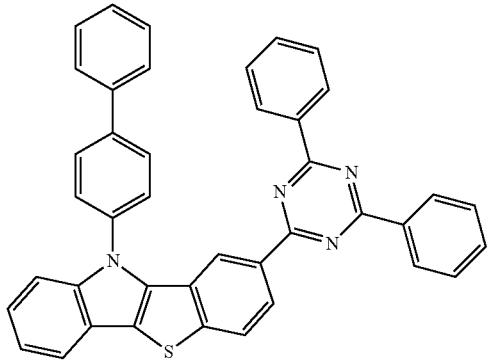
A-46
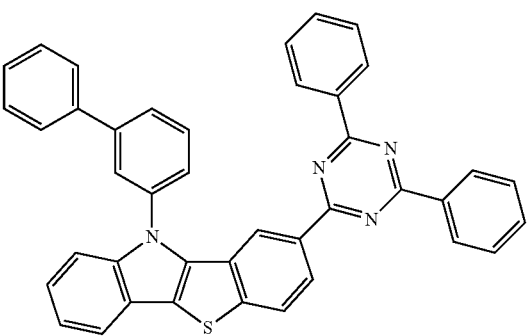

A-47
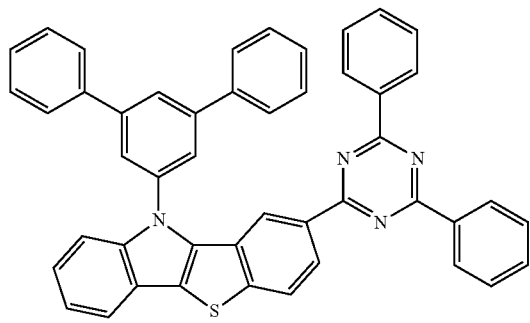
A-48
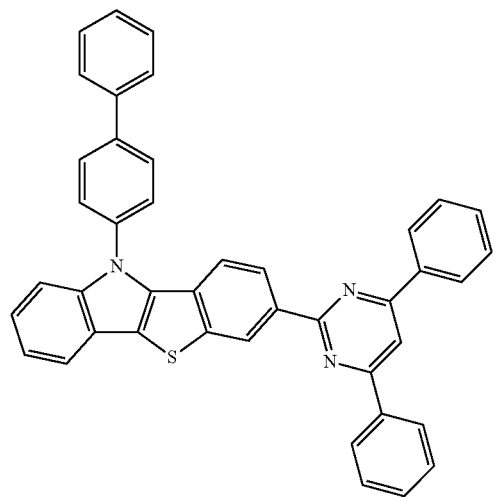
A-49
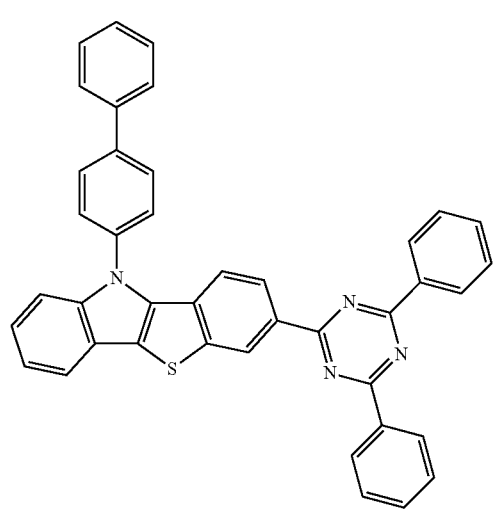
A-50
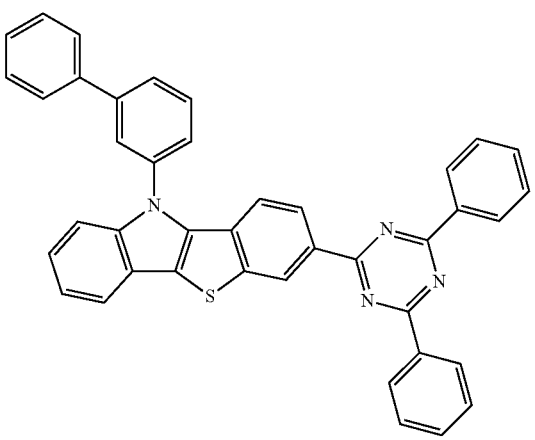
A-51
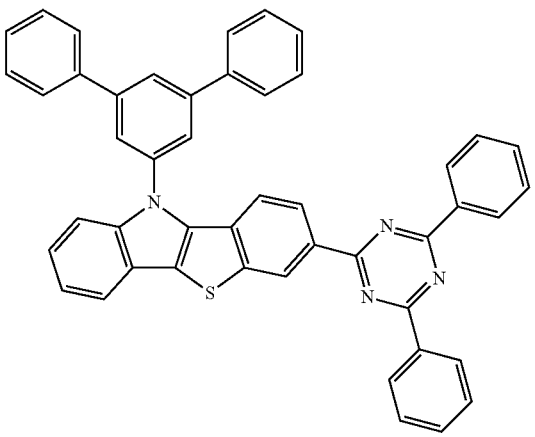
A-52
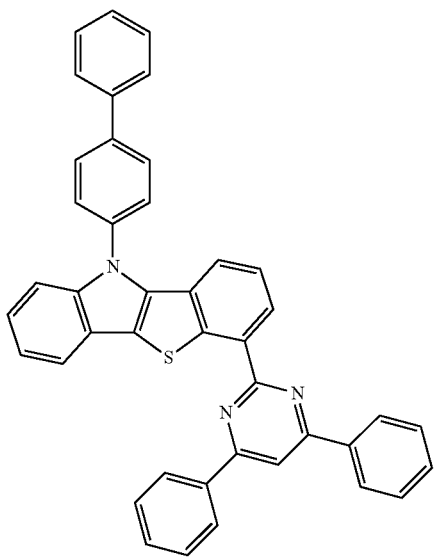

A-53
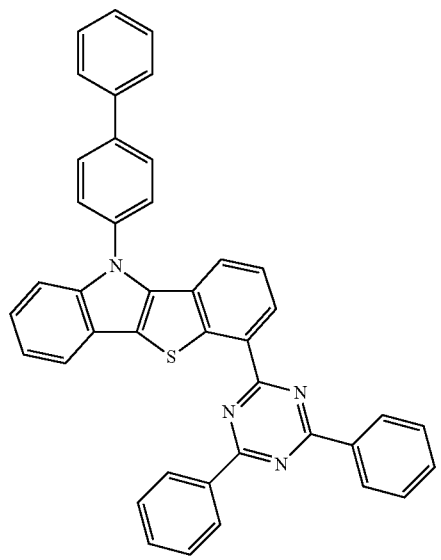
A-54
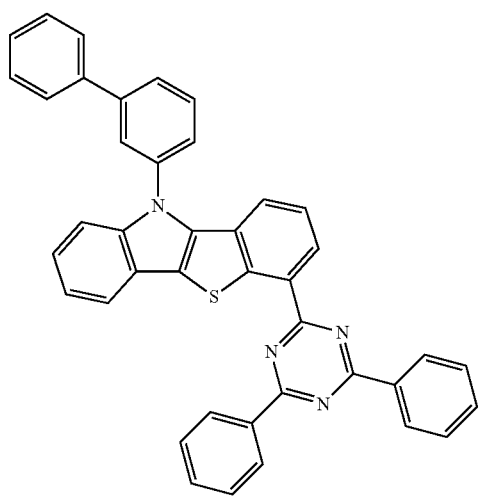
A-55
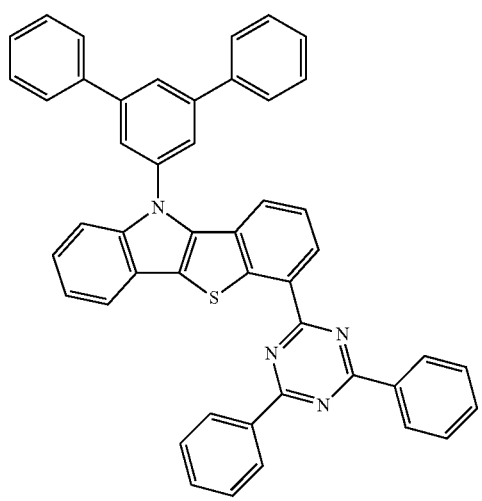
A-56
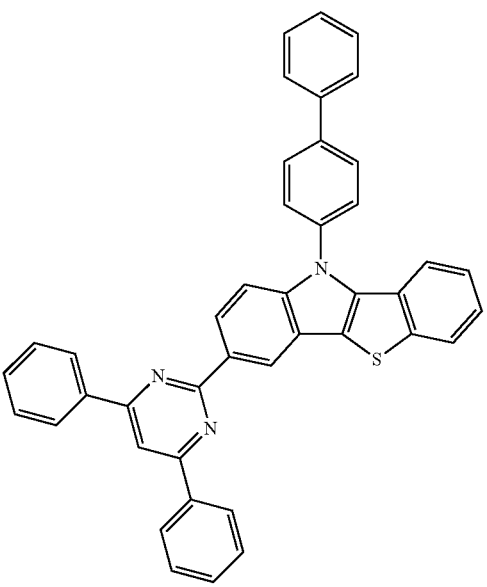
A-57
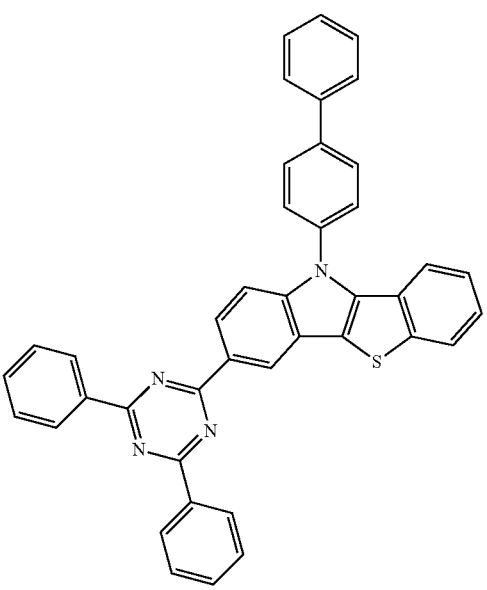

A-58
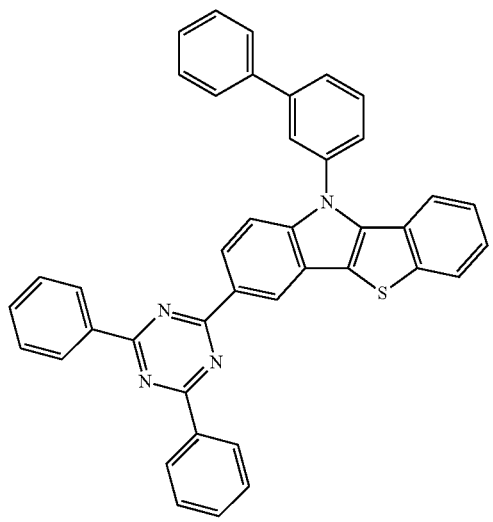
A-59
A-60
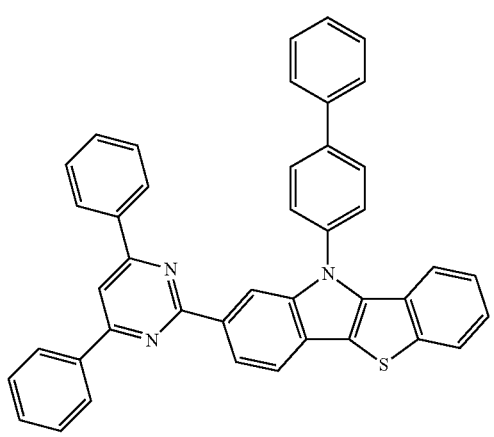
A-61
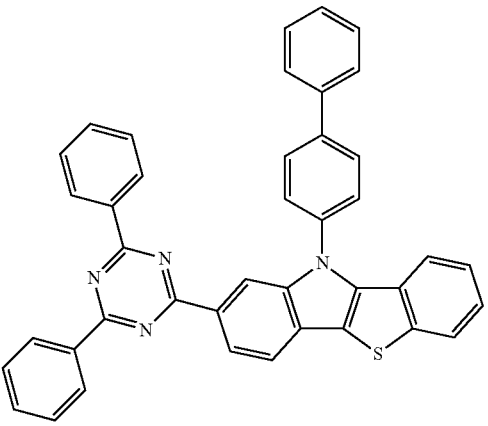
A-62
A-63
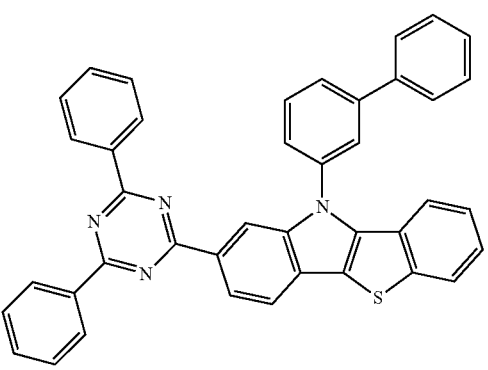
A-64
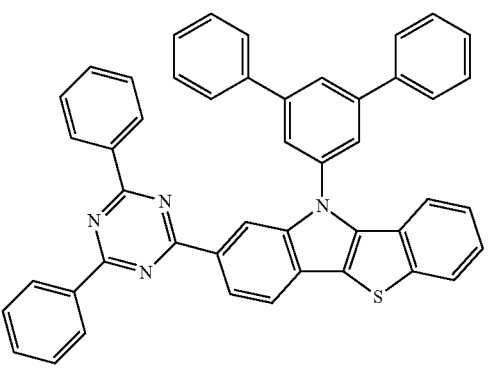

A-65
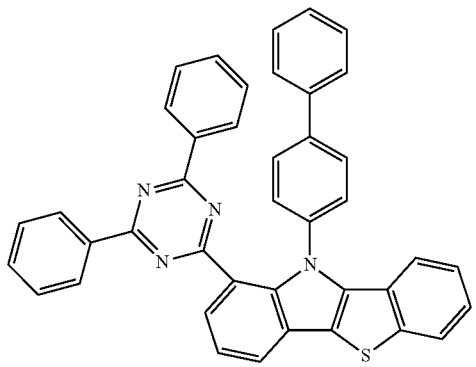
A-66
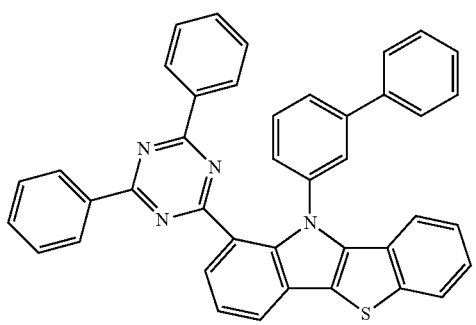
A-67
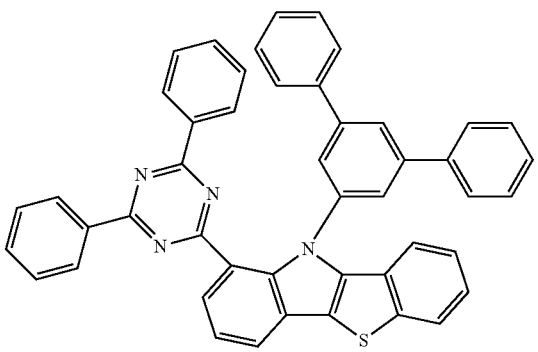
A-68
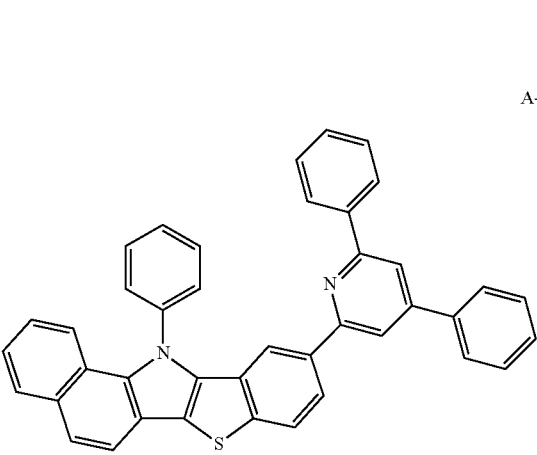
A-69
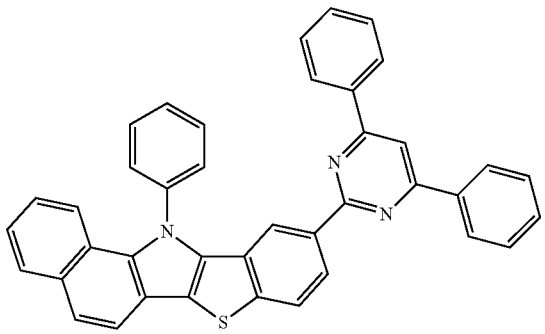
A-70
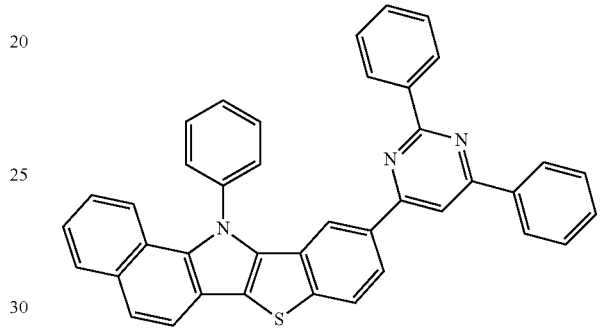
A-71
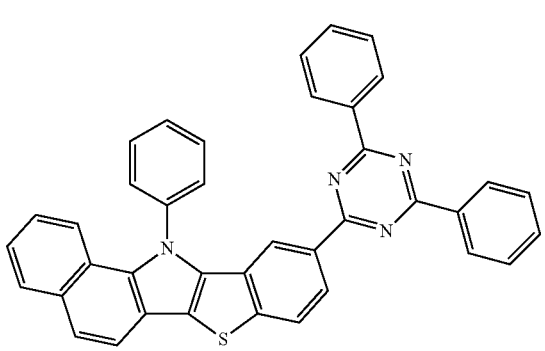
A-72
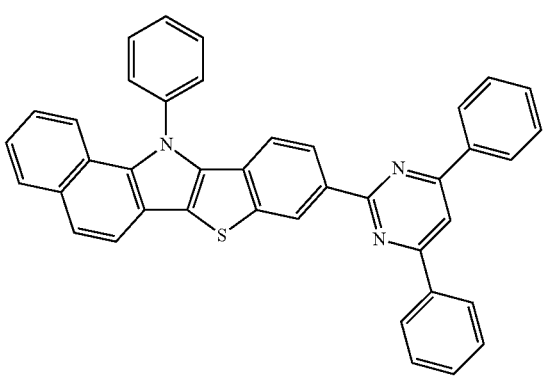

-continued
A-73
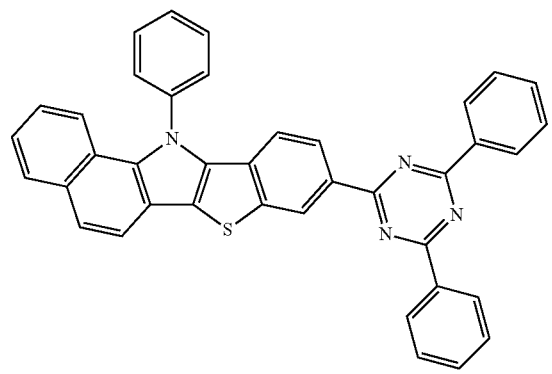
A-74
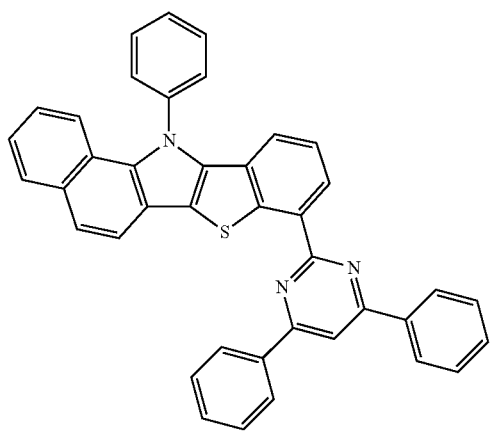
A-75
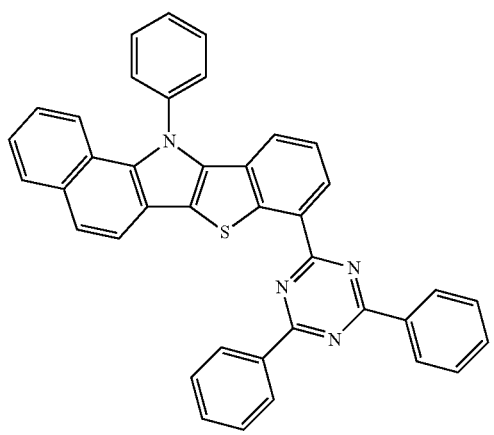
-continued
A-76
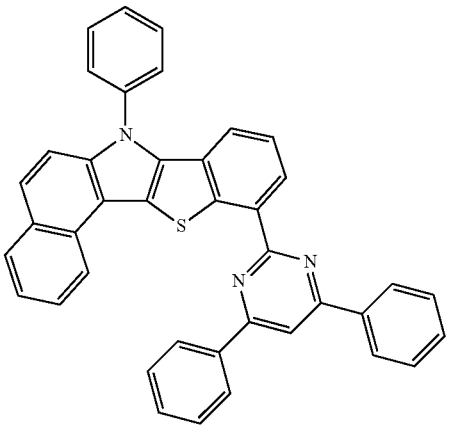
A-77
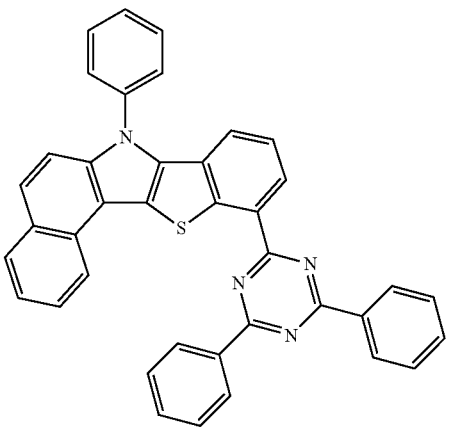
A-78
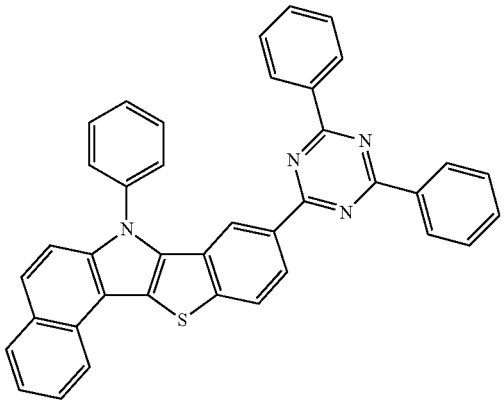
A-79
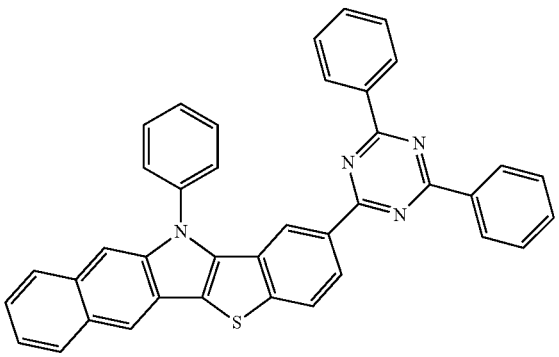

-continued
A-80
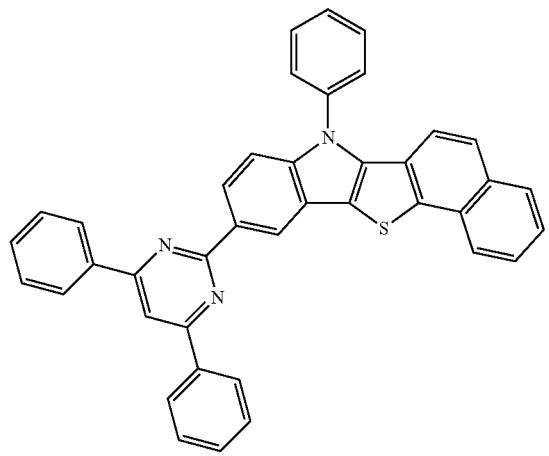
A-81
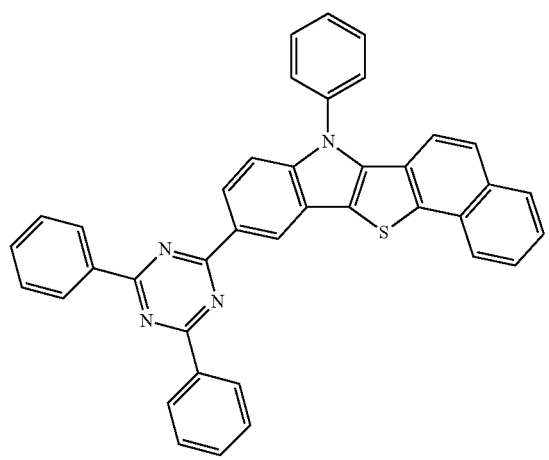
A-82
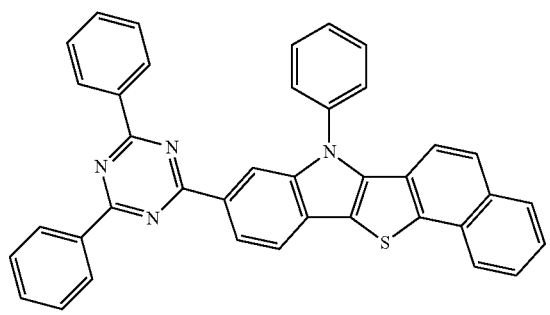
A-83
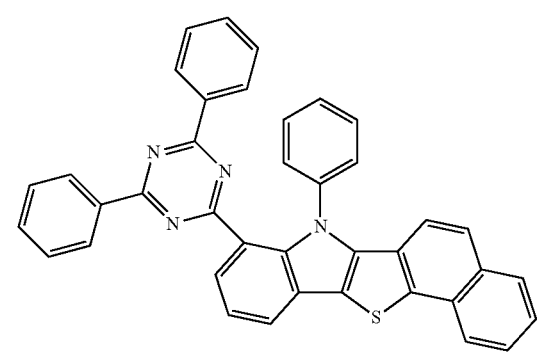
-continued
A-84
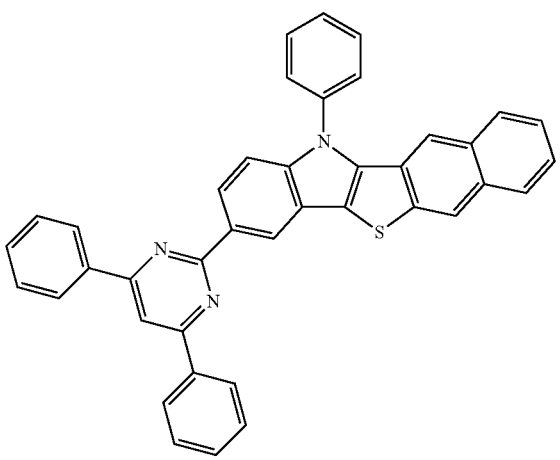
A-85
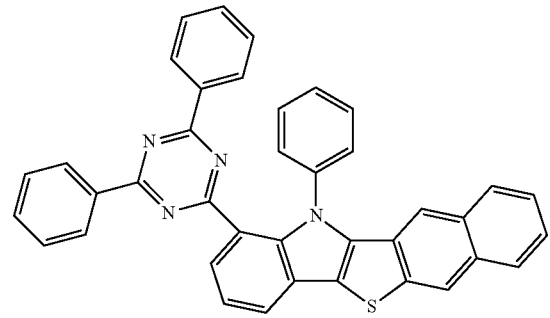
A-86
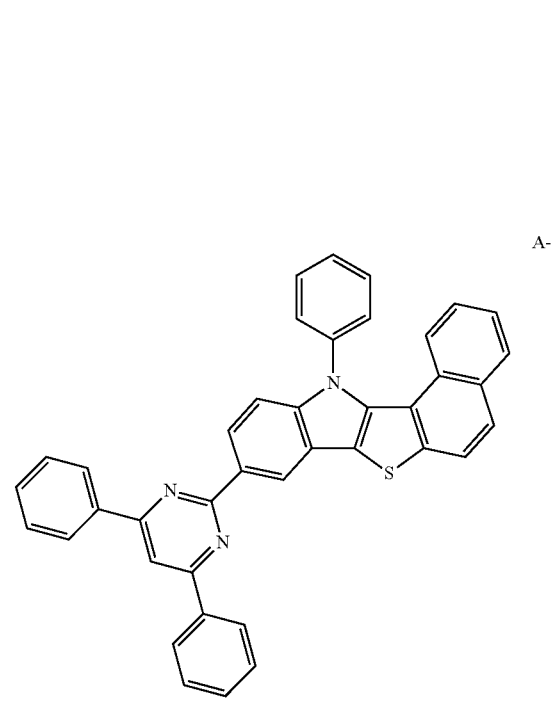

A-87
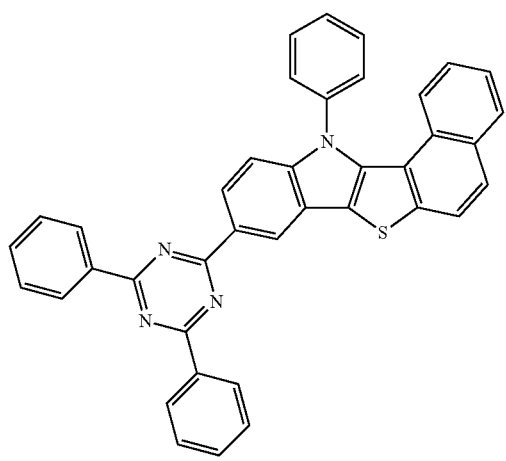
A-88
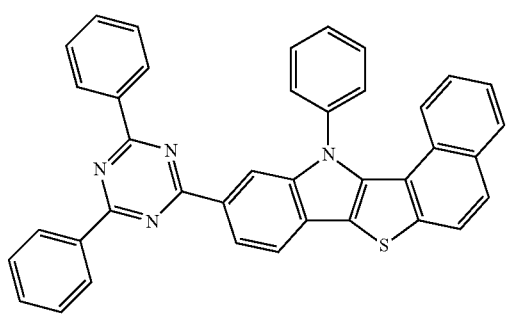
A-89
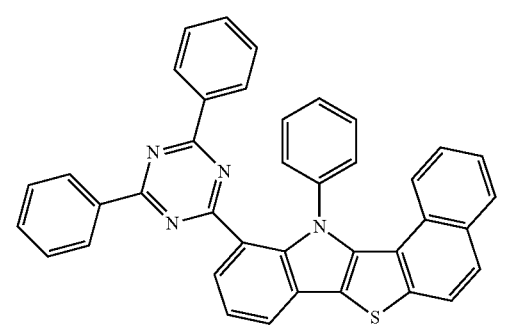
A-90
A-91
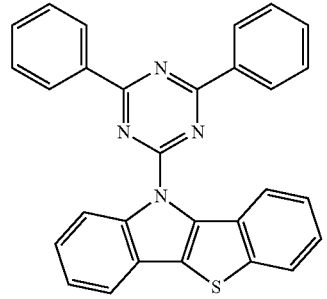
A-92
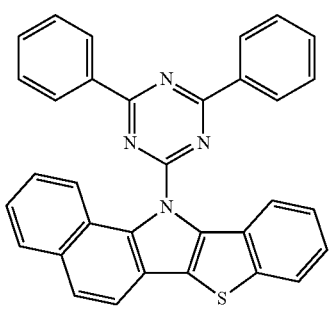
A-93
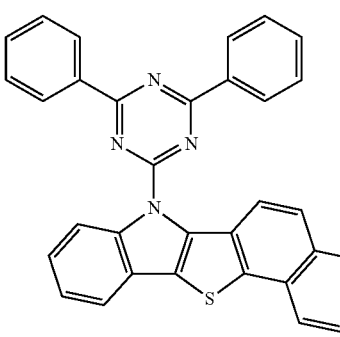
A-94
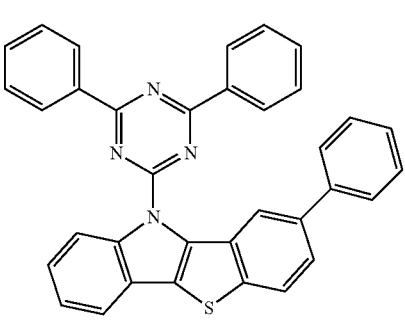
A-95
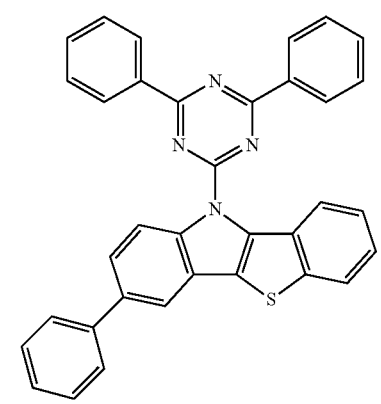

A-96
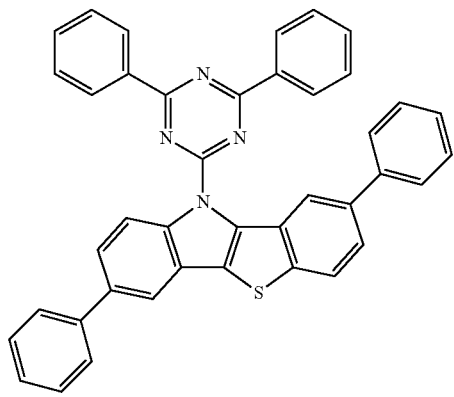
A-97
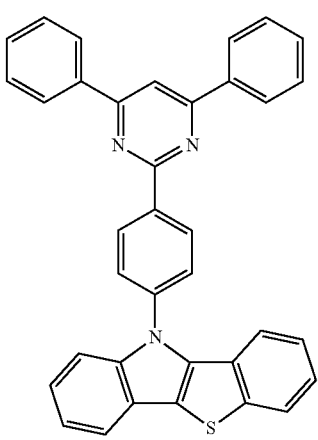
A-98
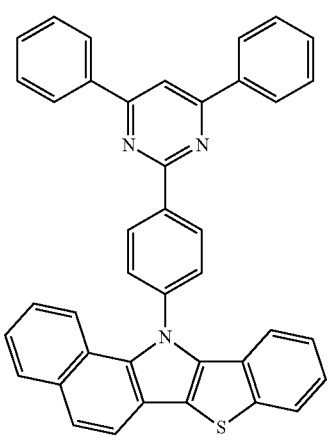
A-99
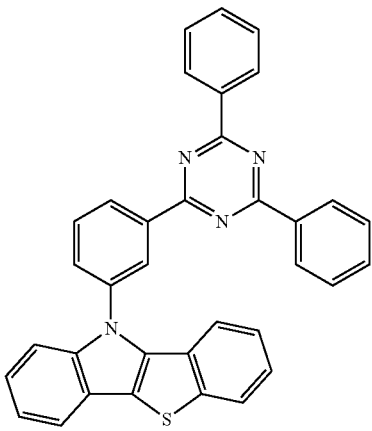
A-100
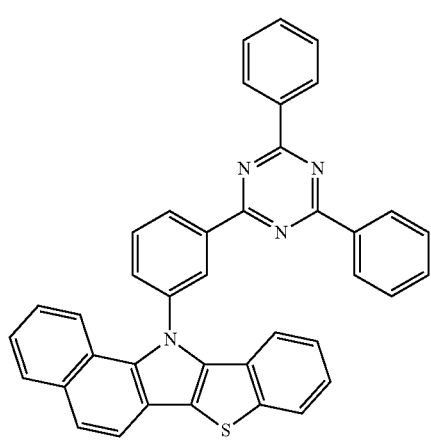
A-101
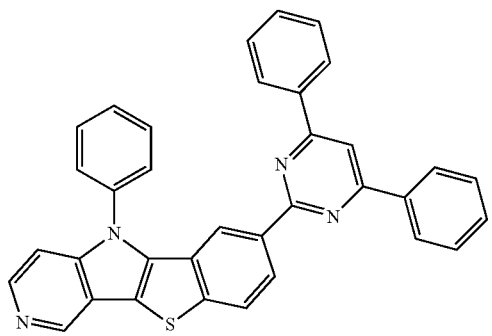
A-102
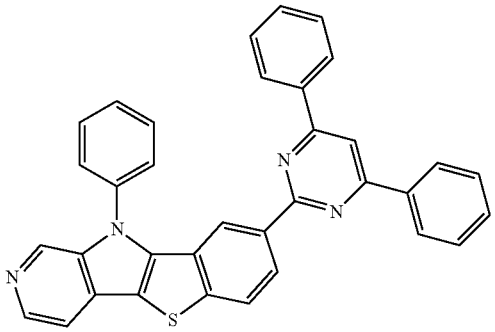

A-103
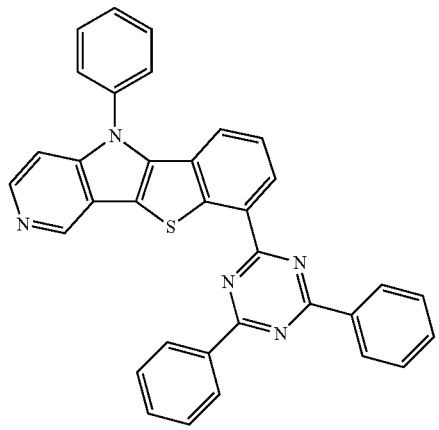
A-104
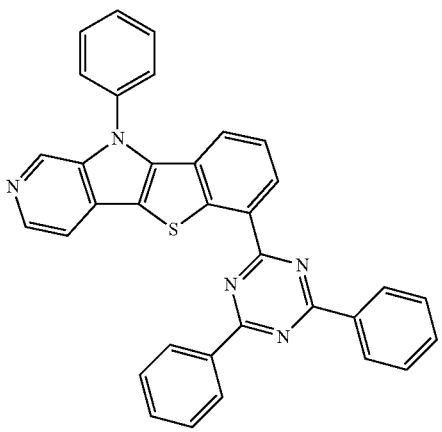
A-105
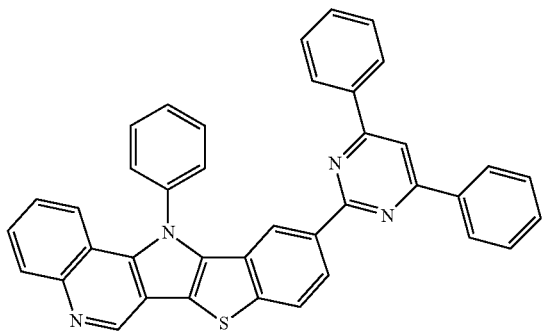
A-106
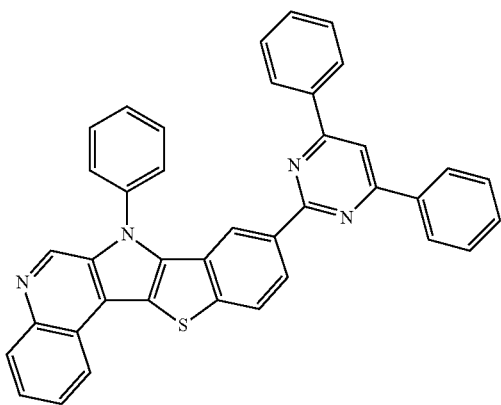
A-107
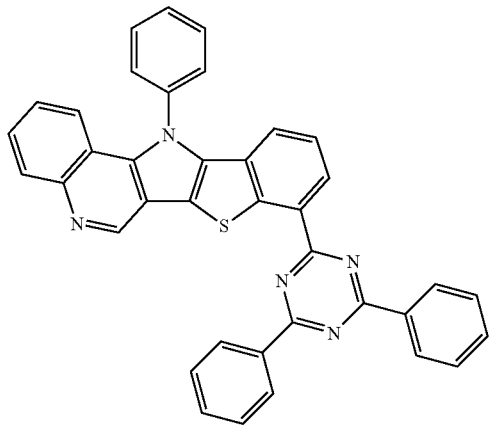
A-108
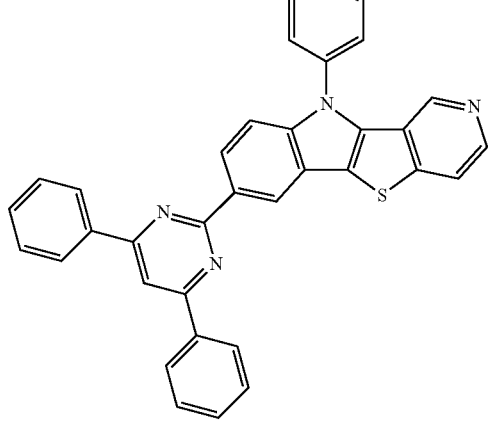
A-109
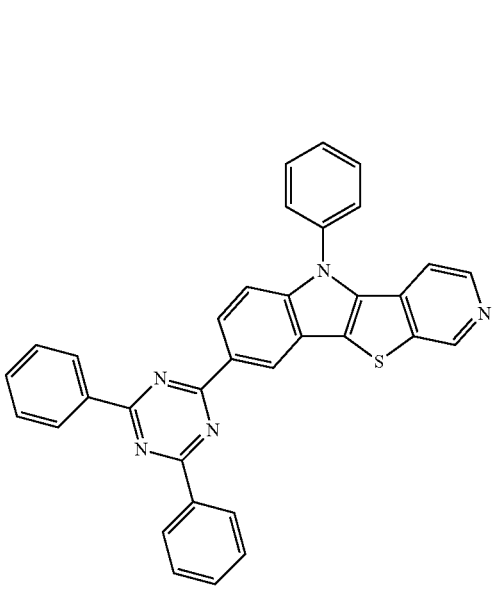

A-110
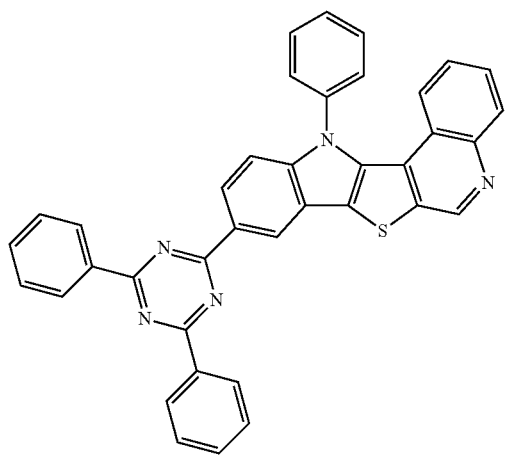
A-111
A-112
A-113
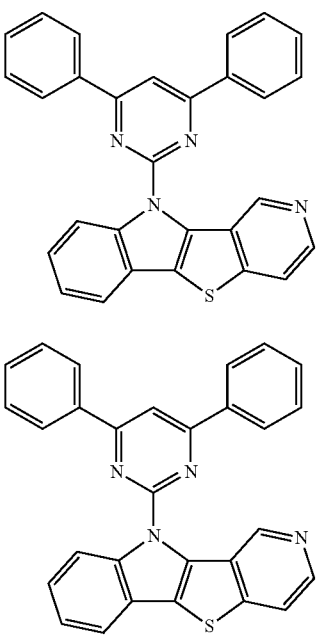
A-114
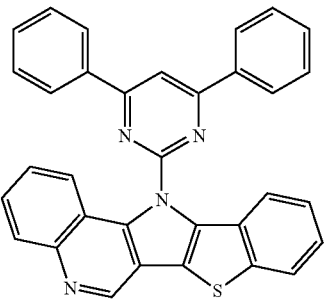
A-115
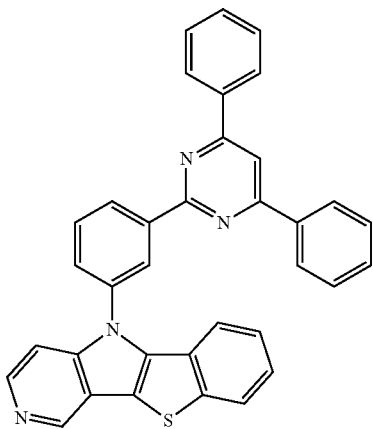
A-116
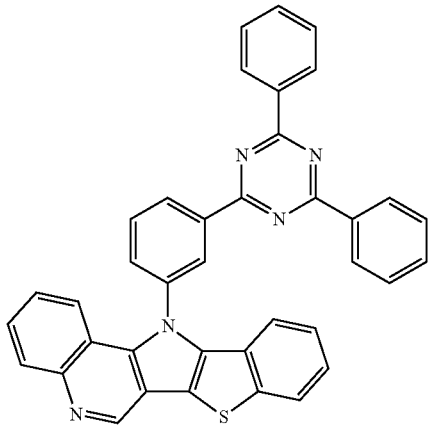
A-117
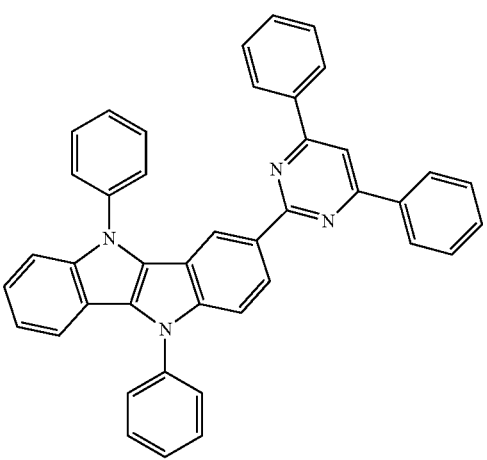

A-118
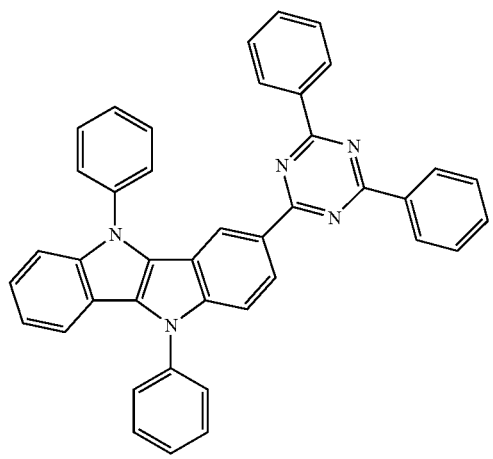
A-121
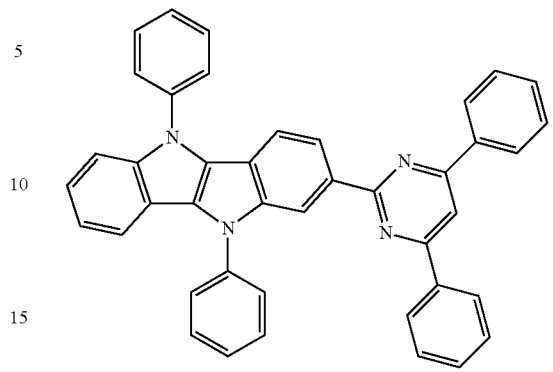
A-119
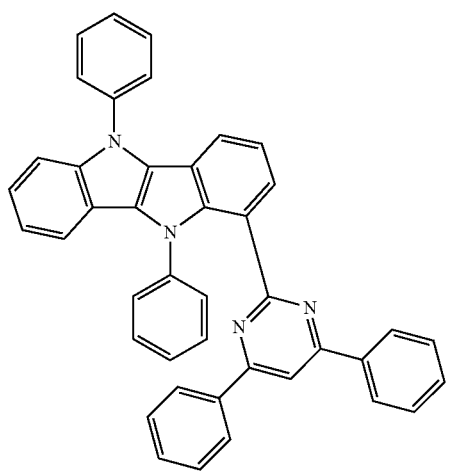
A-122
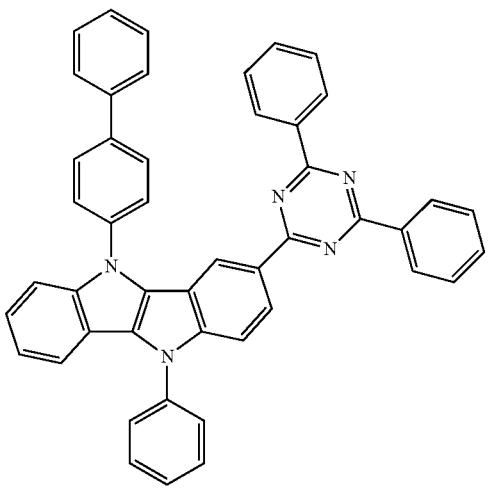
A-120
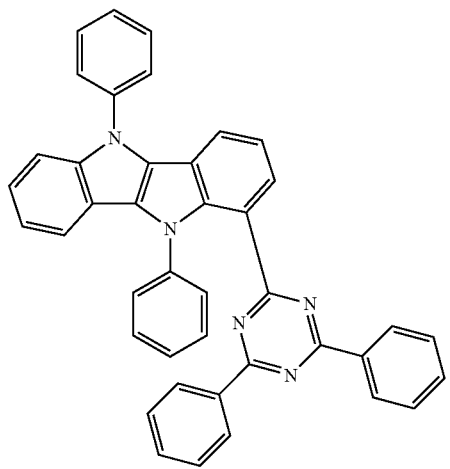
A-123
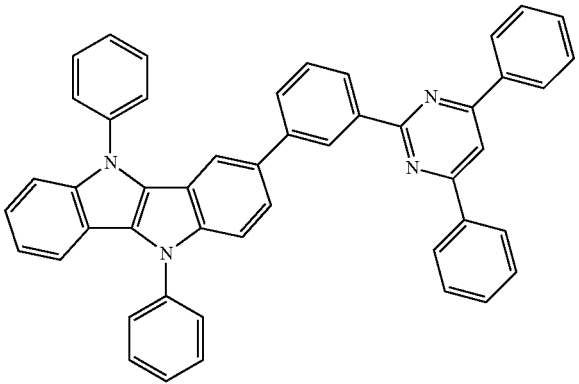

-continued
A-124
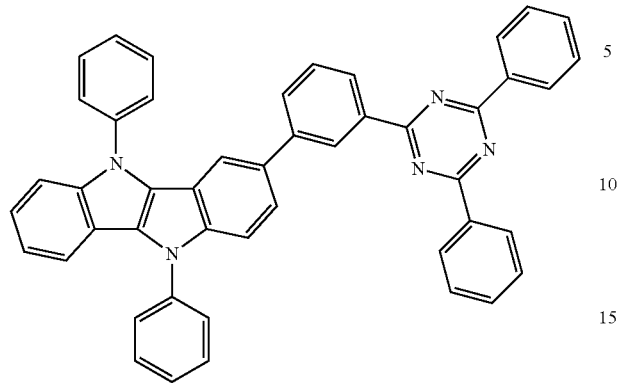
A-127
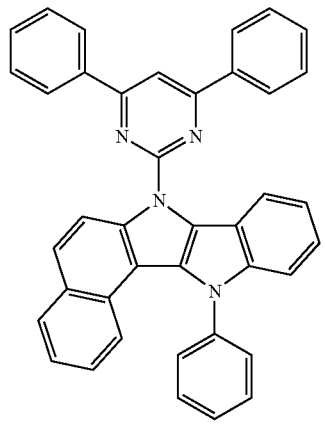
A-125
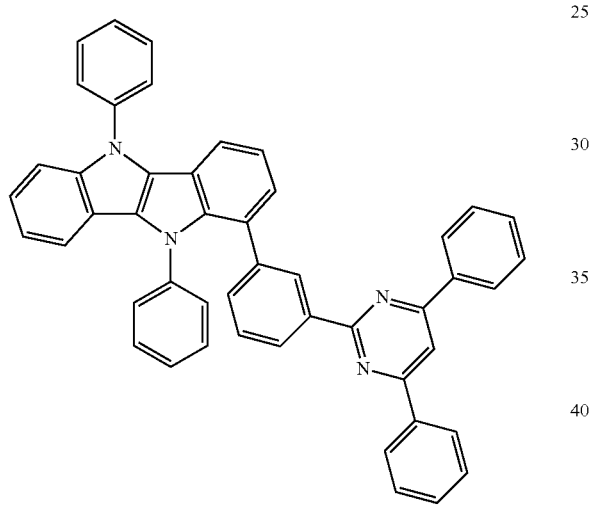
A-128
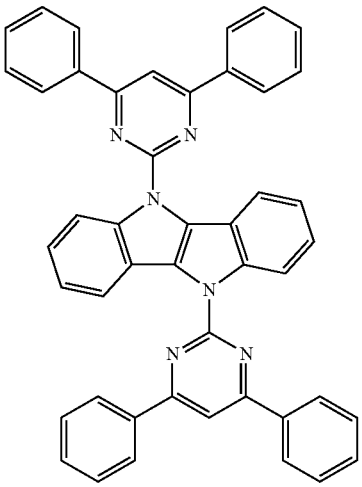
A-126
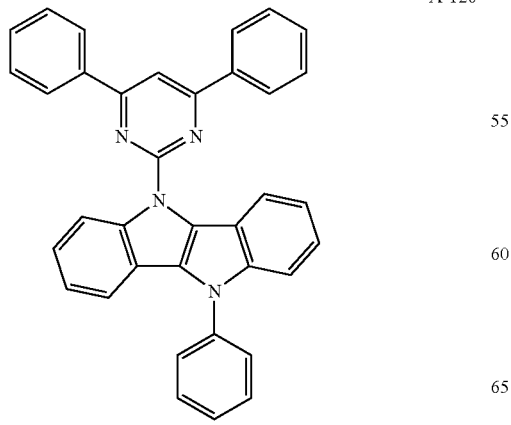
A-129
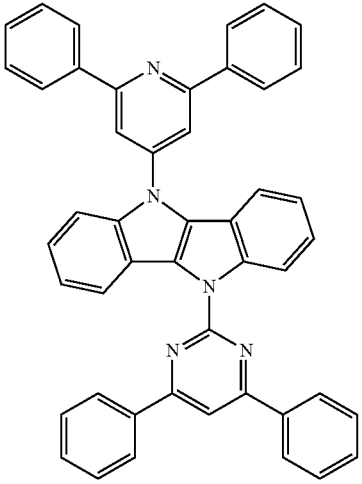

A-130
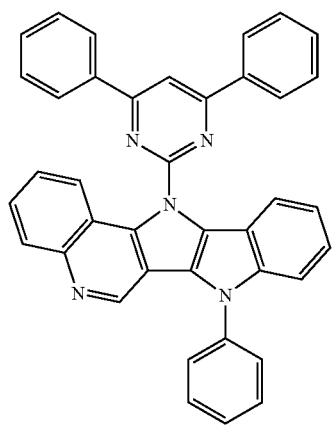
A-131
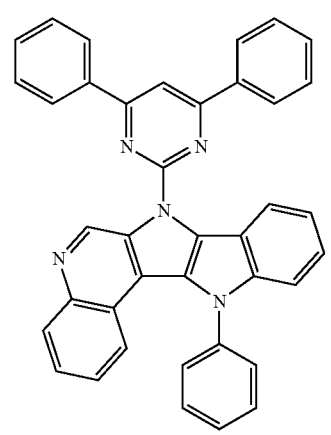
A-132
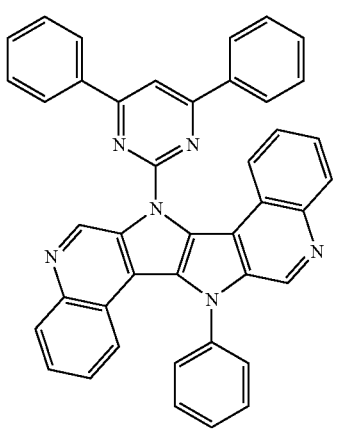
A-133
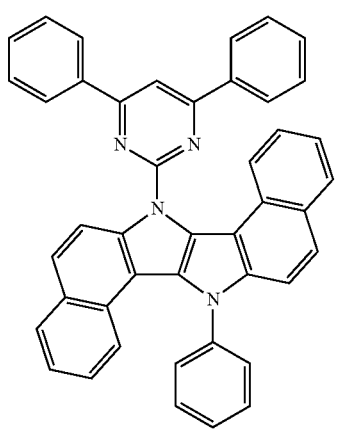
A-134
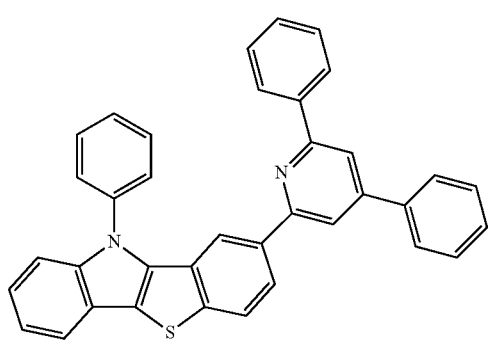
A-135
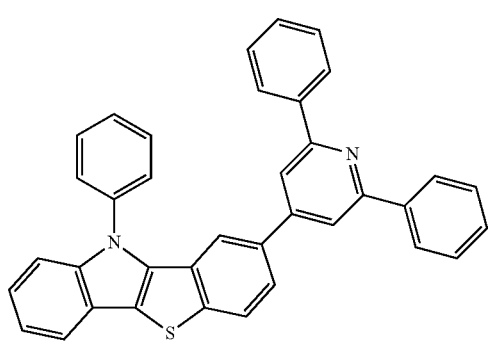
A-136
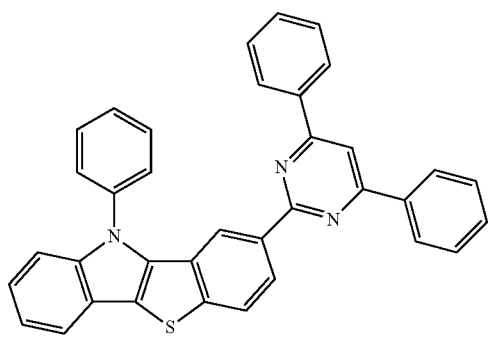

A-137
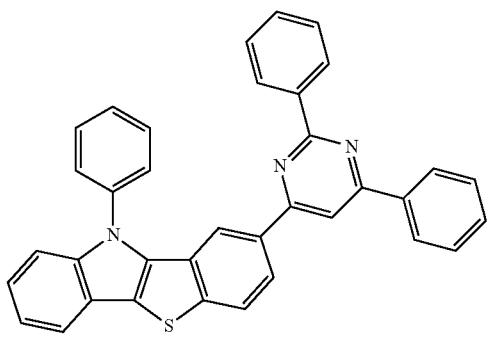
A-138
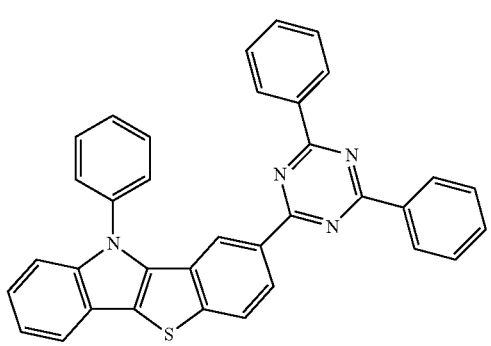
A-139
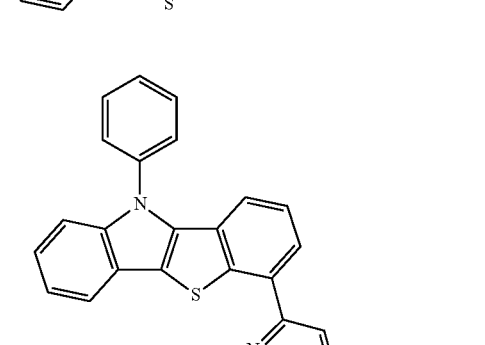
A-140
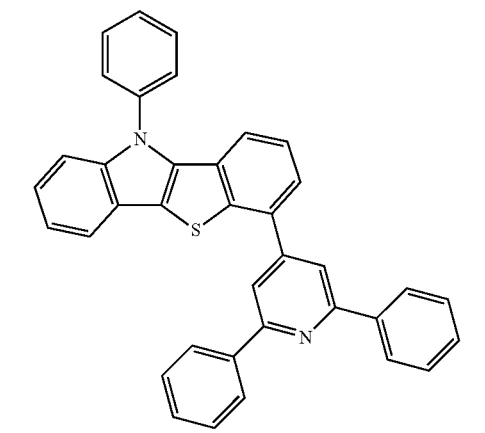
A-141
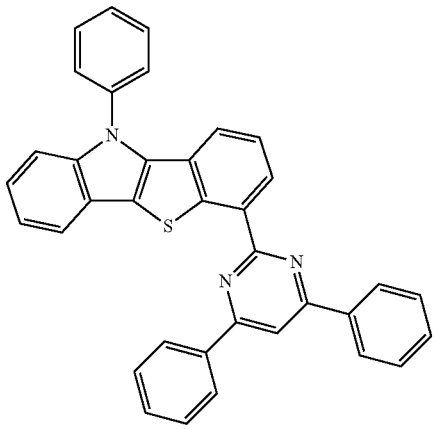
A-142
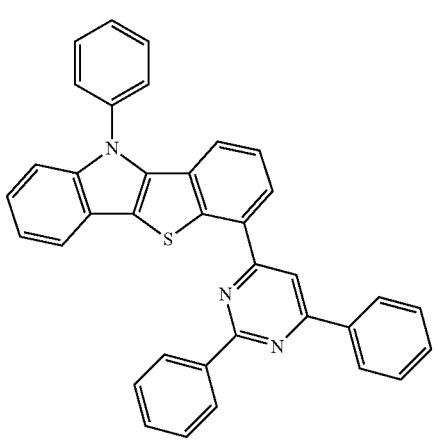
A-143
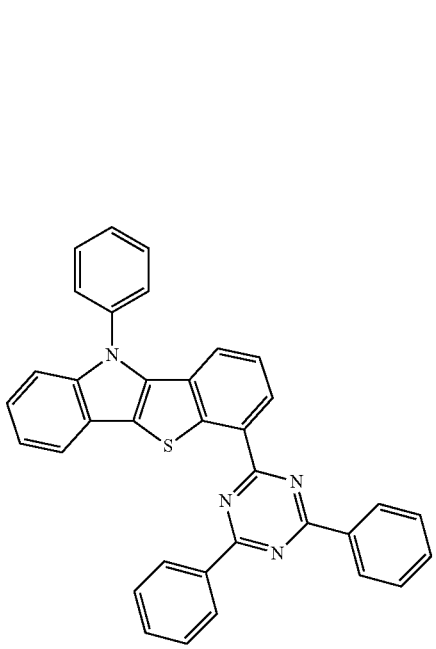

A-144
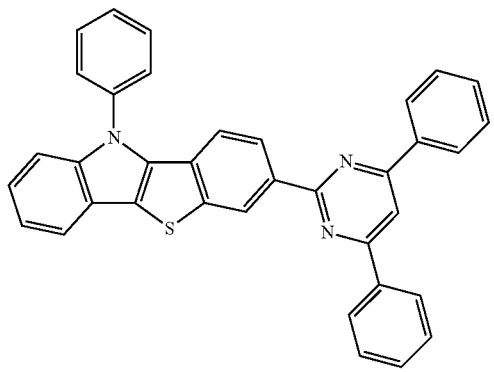
A-145
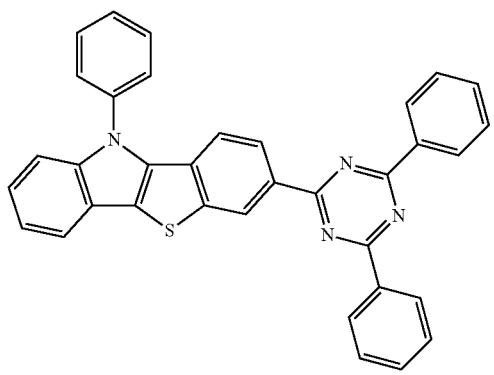
The compound for an organic optoelectronic device may be represented by one of Chemical Formulae B-1 to B-72.
B-1
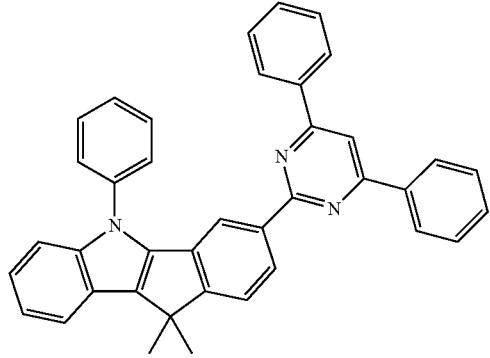
B-2
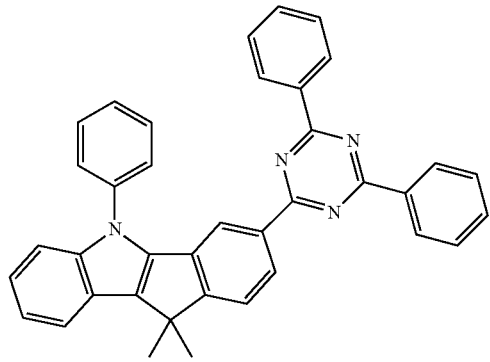
B-3
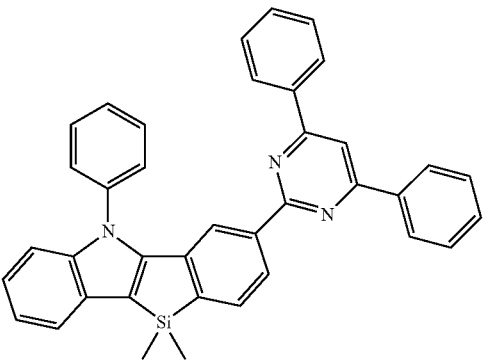
B-4
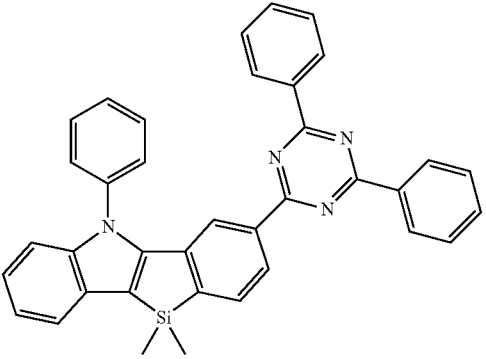
B-5
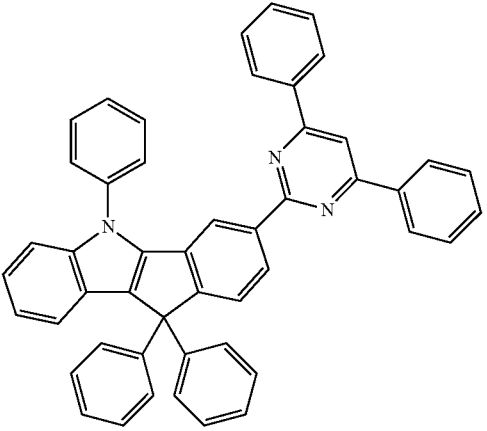
B-6
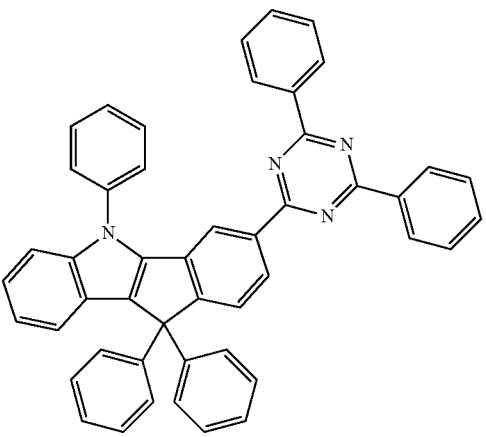

-continued
B-7
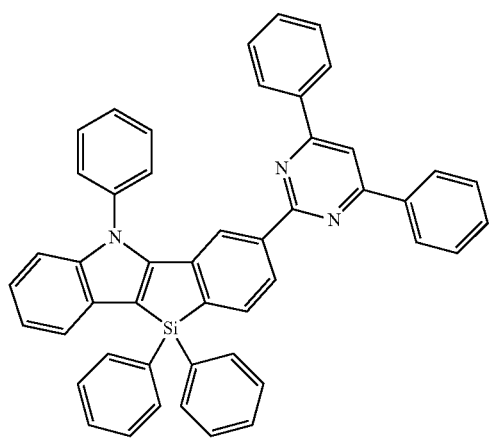
B-8
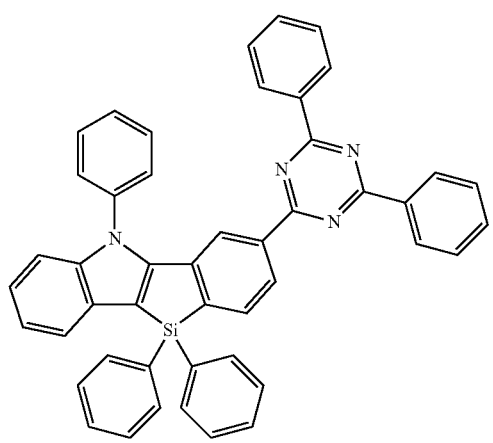
B-9
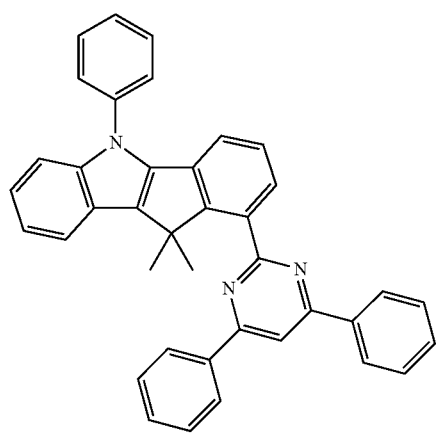
-continued
B-10
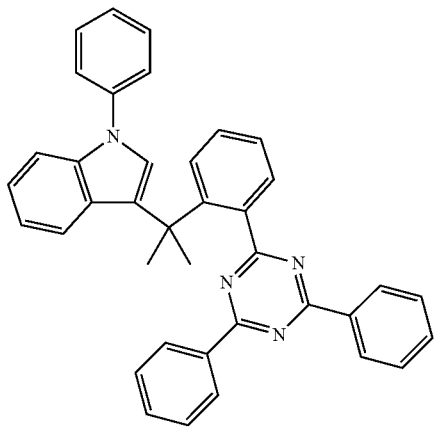
B-11
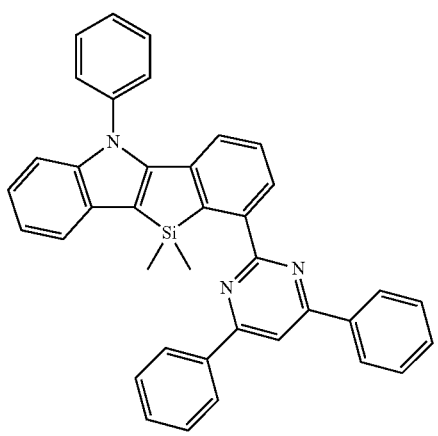
B-12
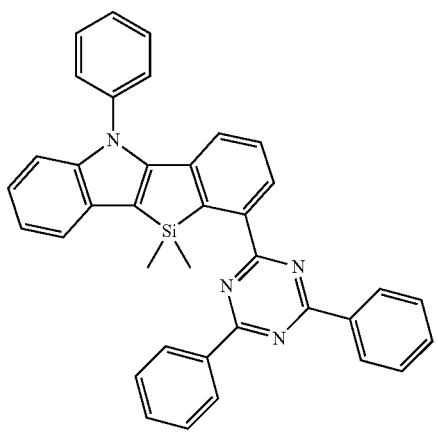

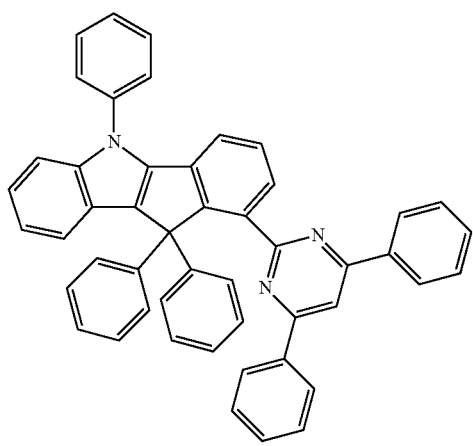
B-13
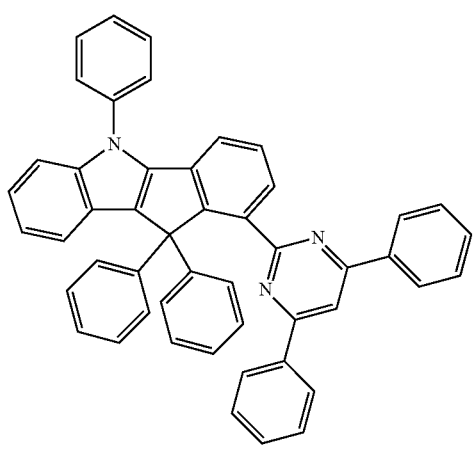
B-14
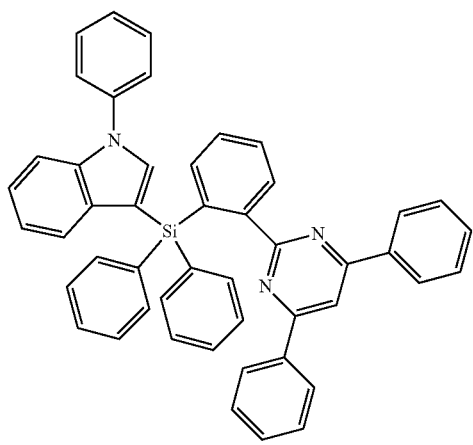
B-15
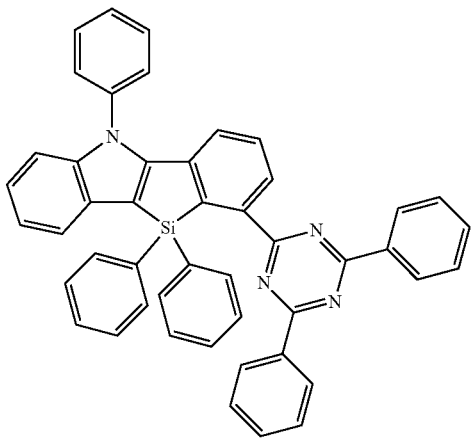
B-16
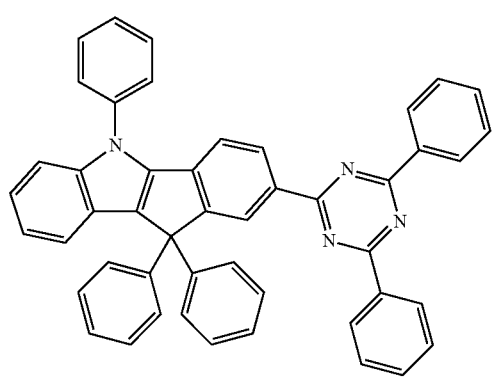
B-17
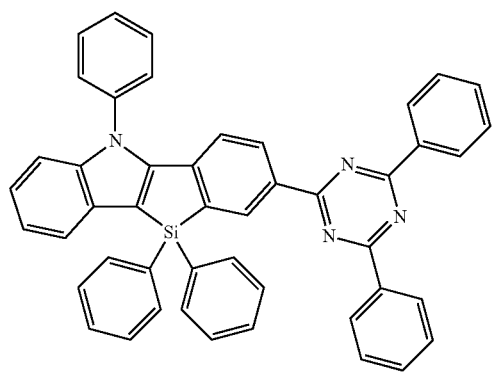
B-18
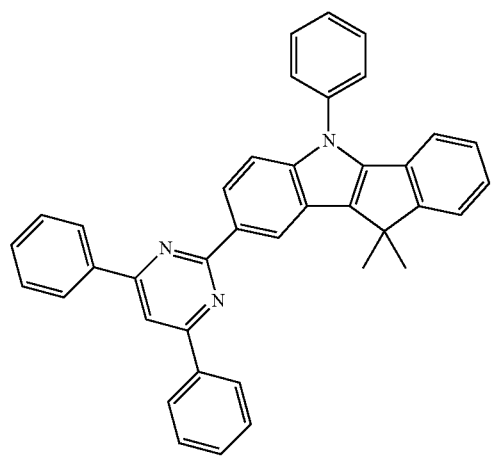
B-19

B-20
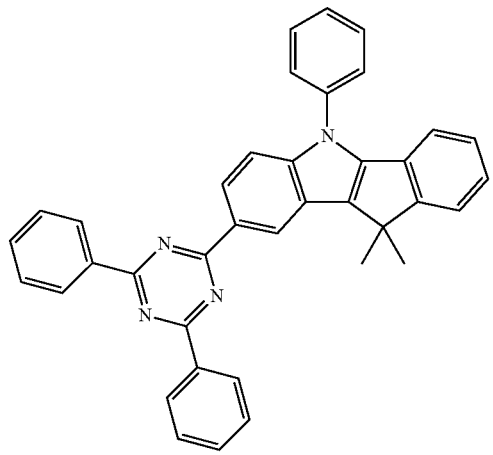
B-23
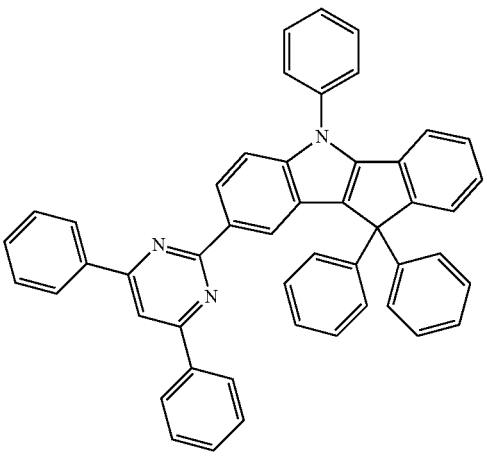
B-21
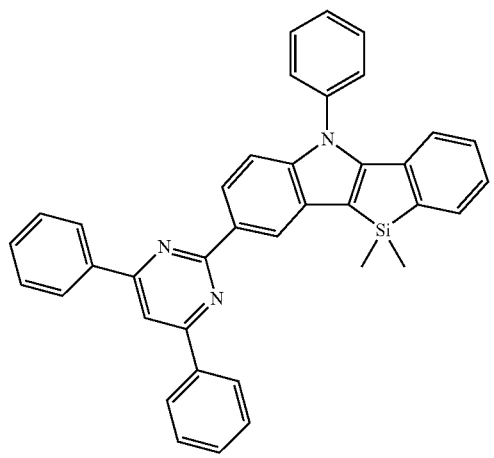
B-24
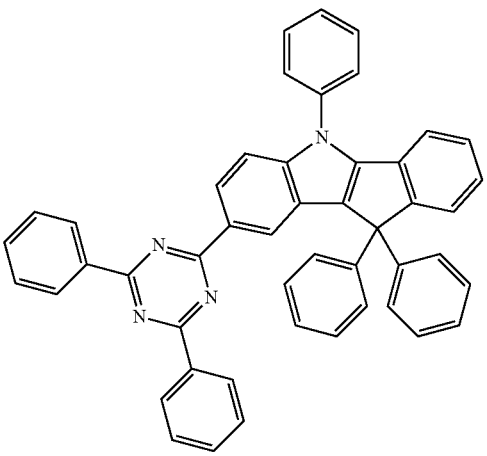
B-22
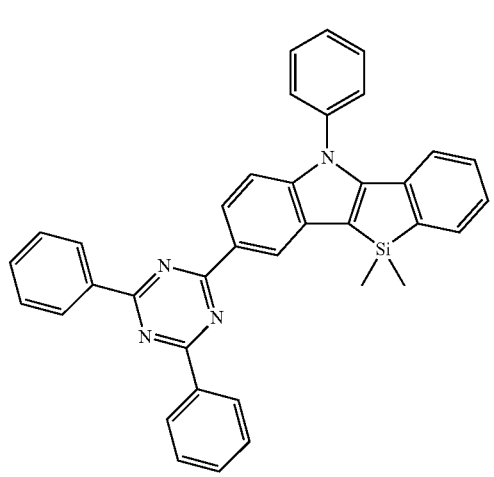
B-25
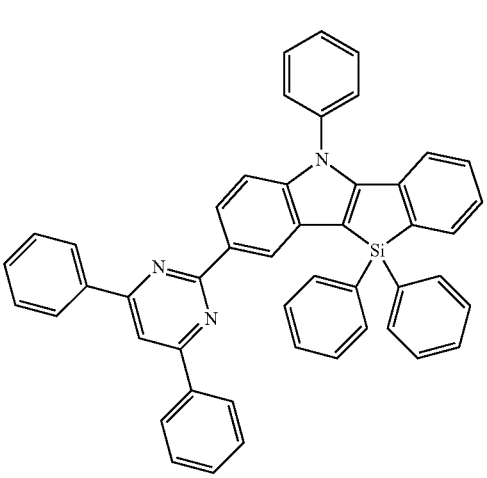

B-26
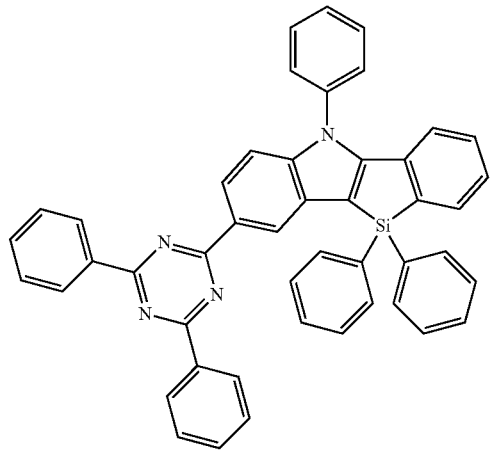
B-27
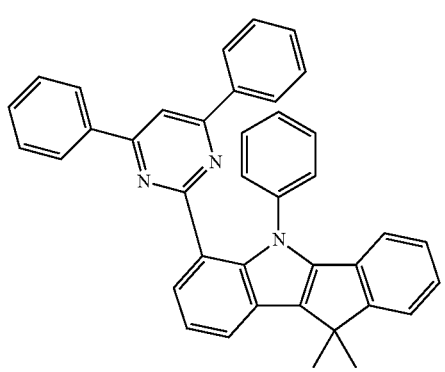
B-28
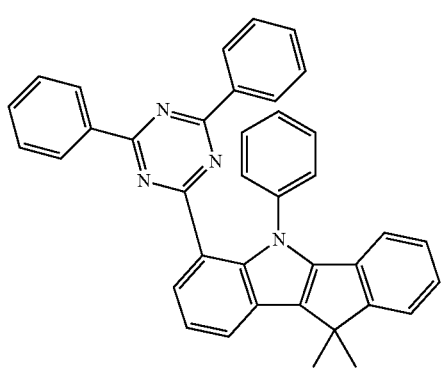
B-29
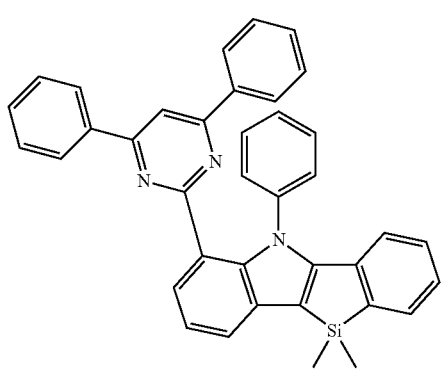
B-30
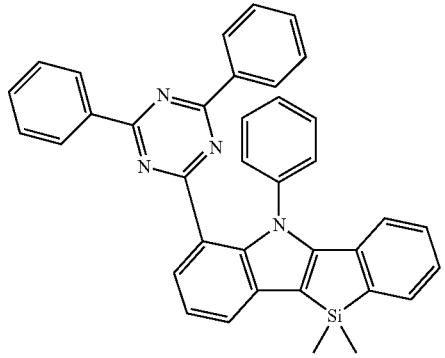
B-31
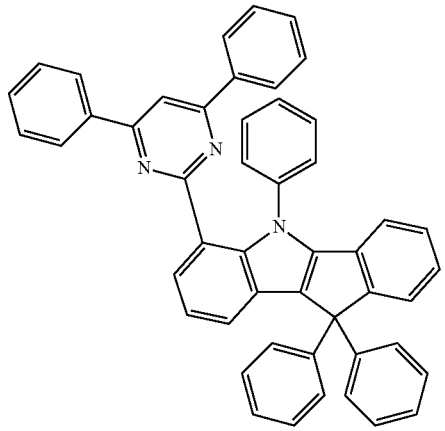
B-32
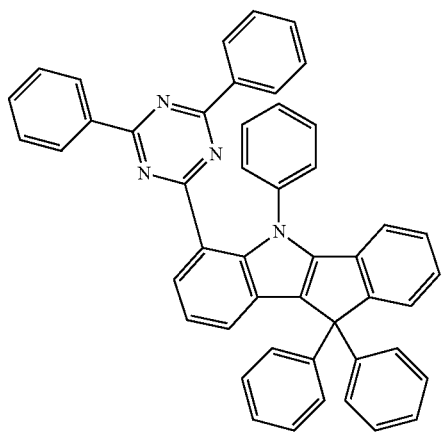
B-33
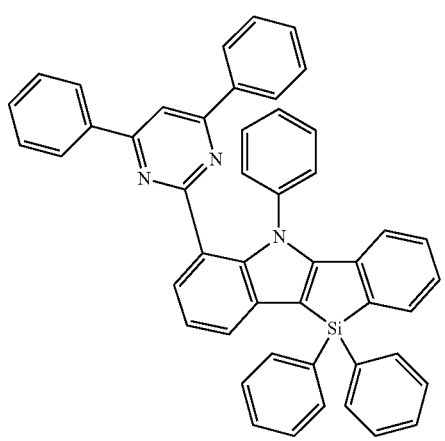

B-34
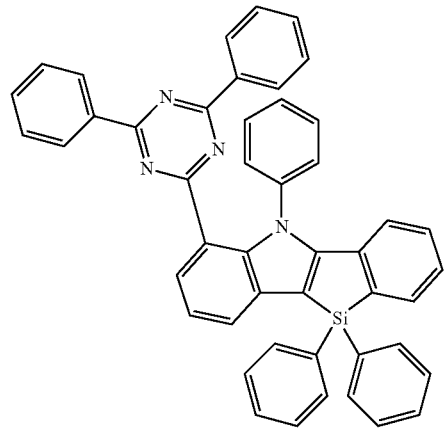
B-35
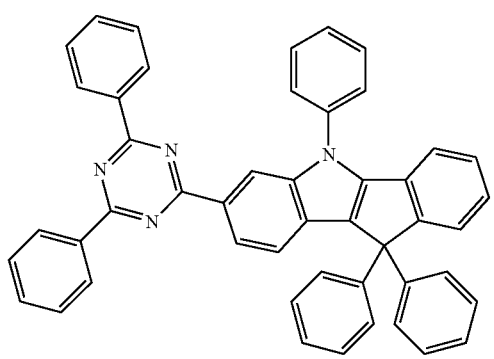
B-36
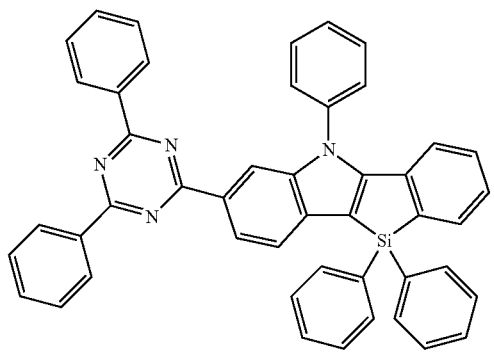
B-37
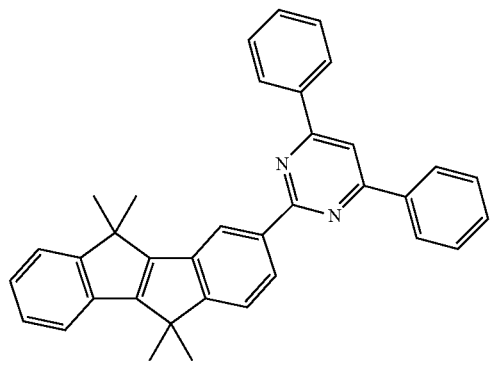
B-38
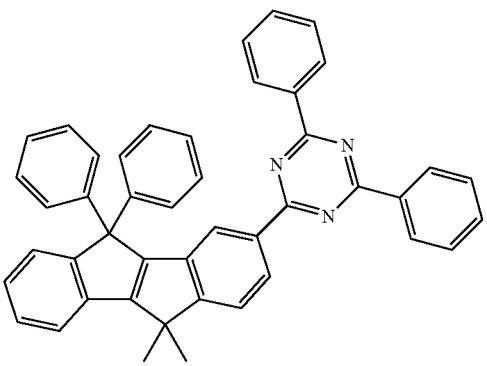
B-39
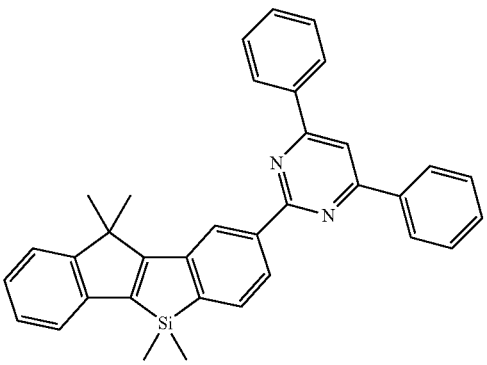
B-40
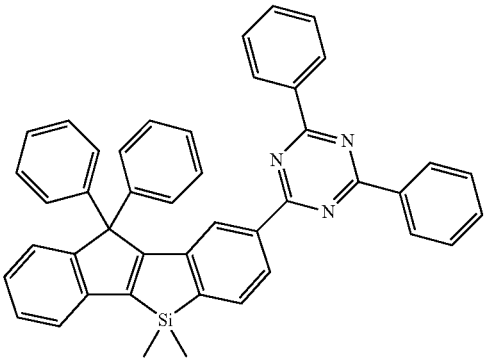
B-41
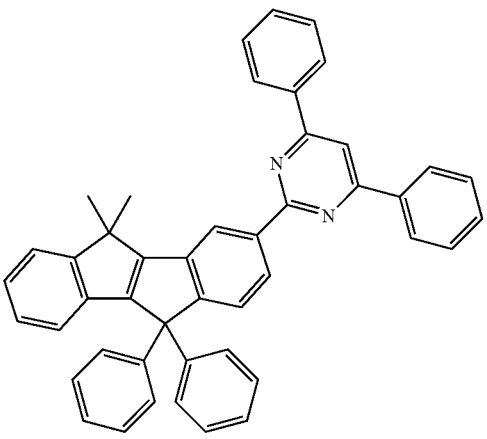

B-42
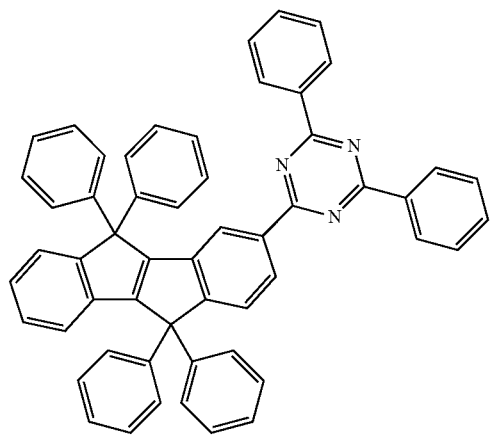
B-43
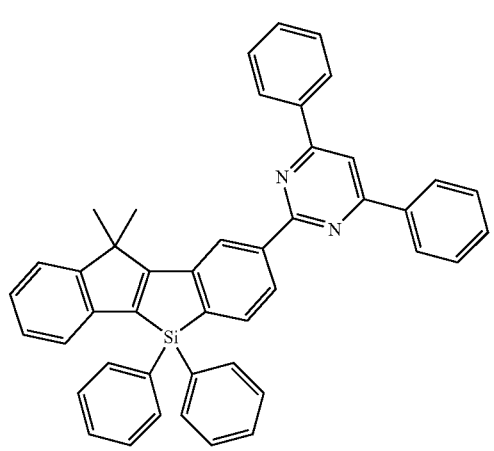
B-44
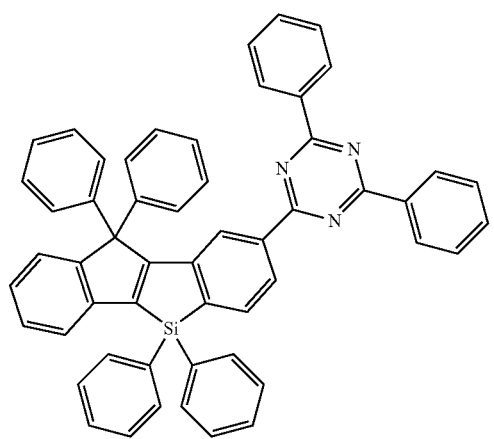
B-45
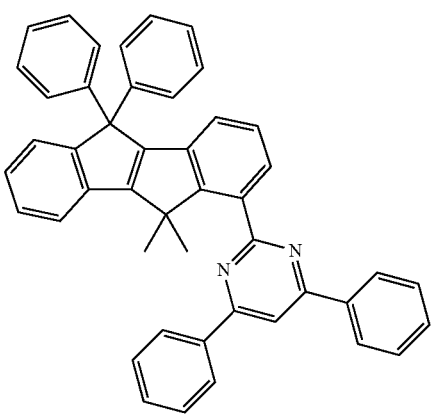
B-46
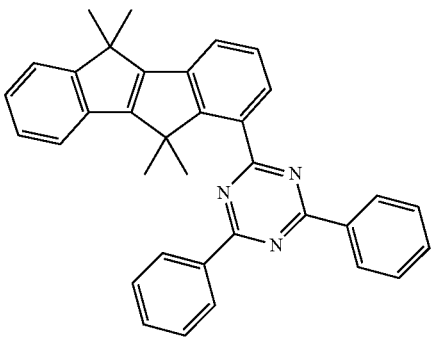
B-47
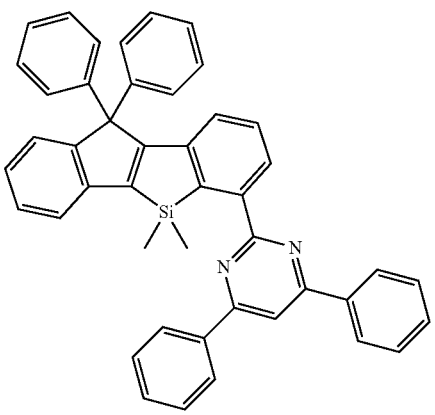
B-48
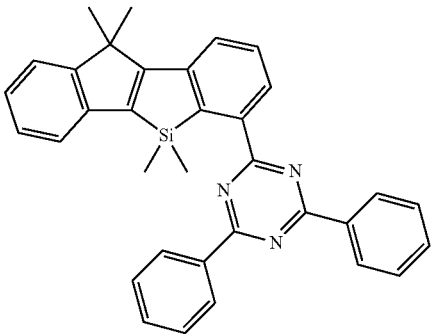

B-49
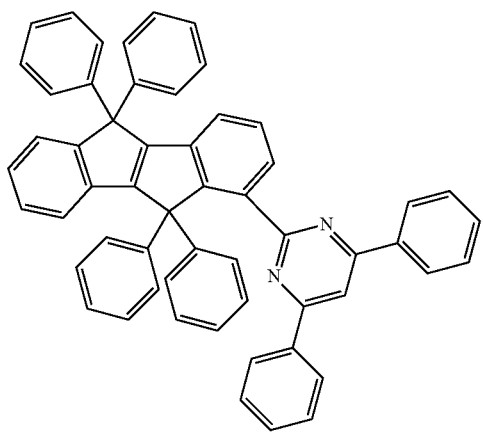
B-50
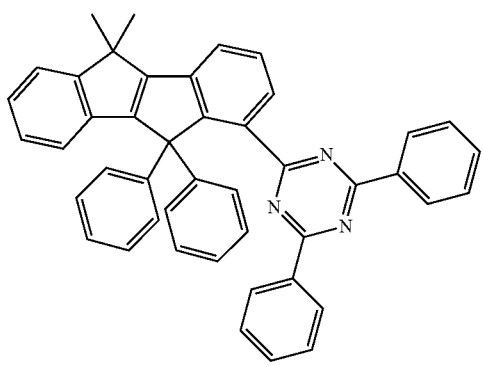
B-51
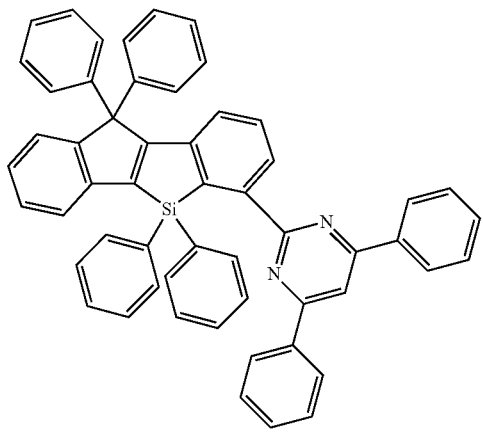
B-52
B-53
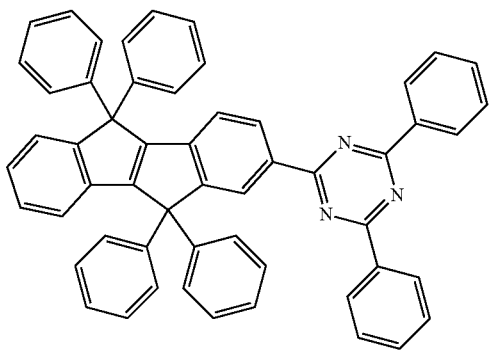
B-54
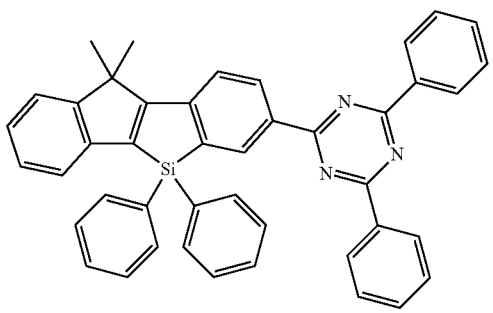
B-55
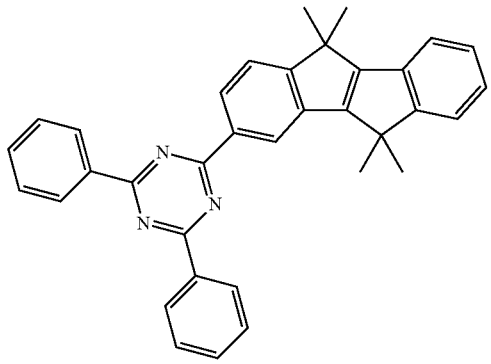
B-56
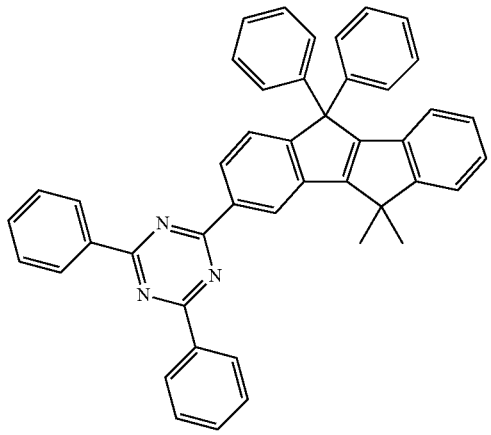

-continued
B-57
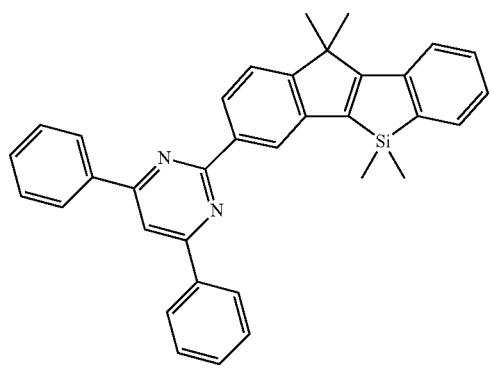
B-58
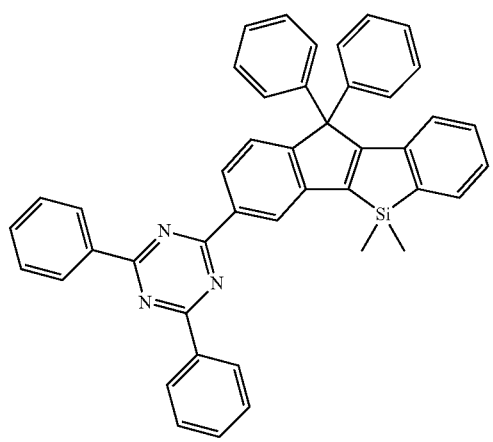
B-59
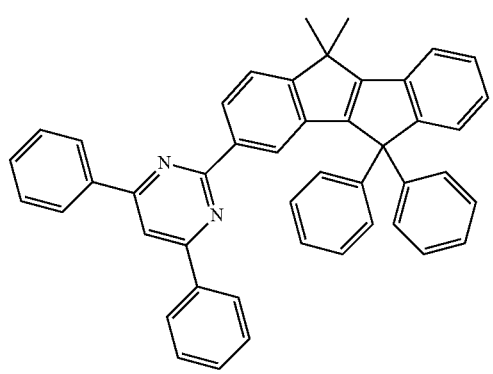
B-60
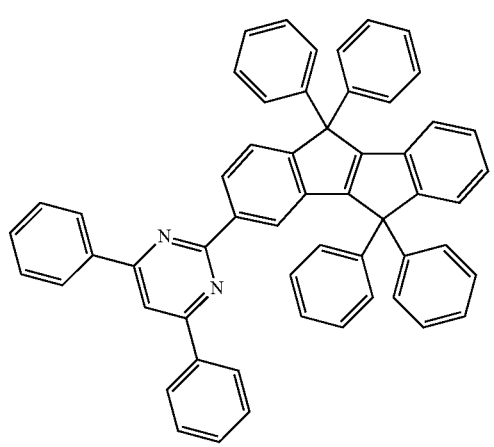
-continued
B-61
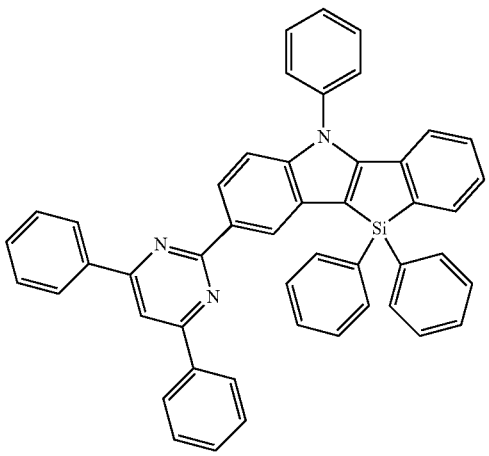
B-62
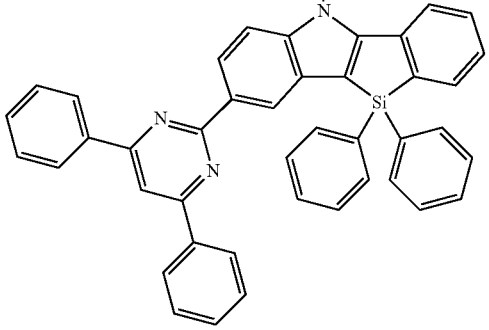
B-63
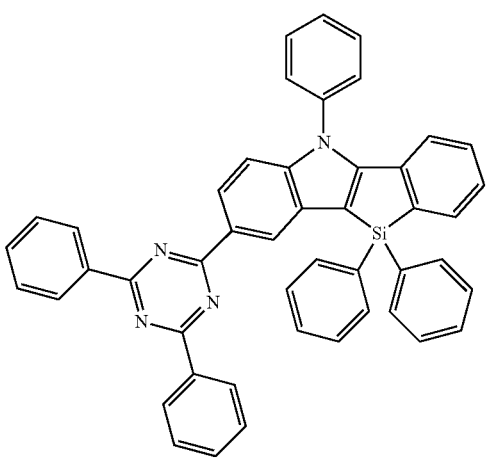
B-64
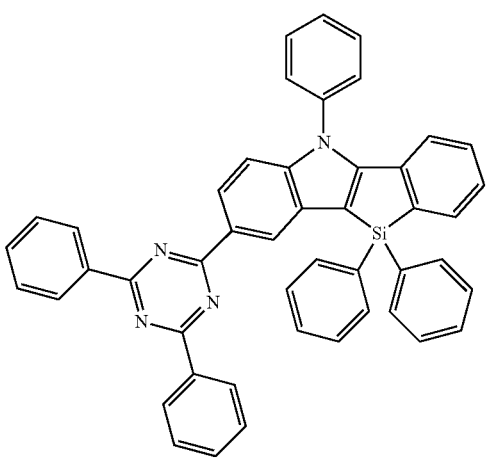

B-65
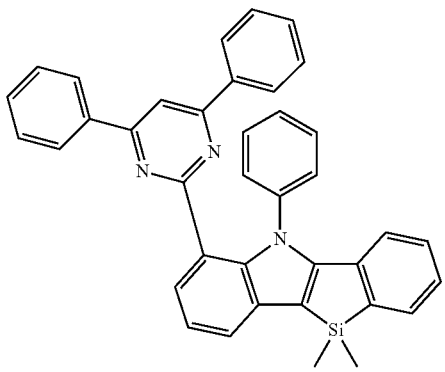
B-66
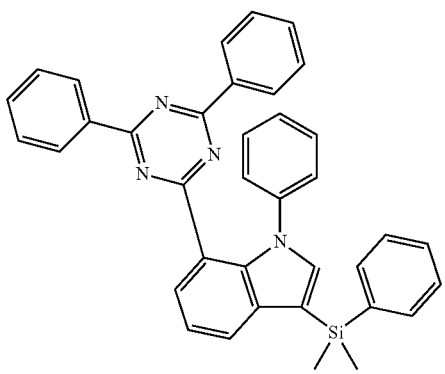
B-67
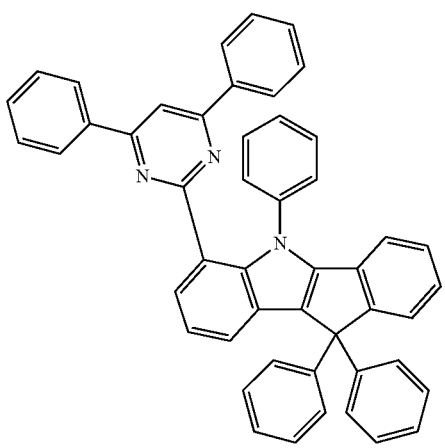
B-68
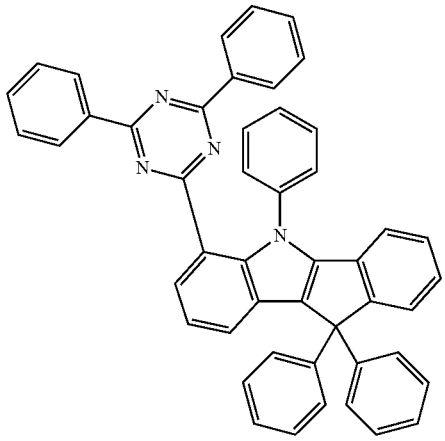
B-69
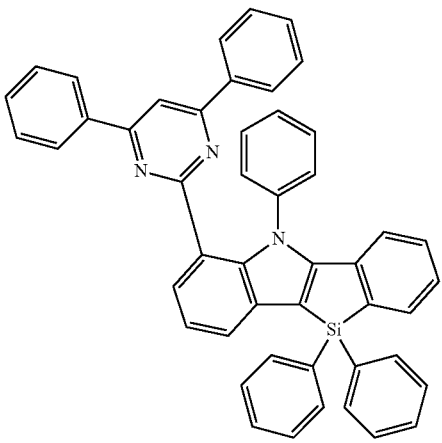
B-70
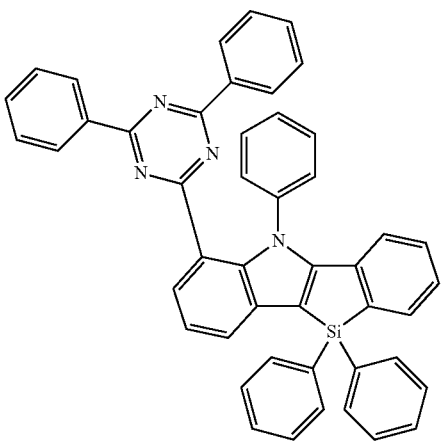
B-71
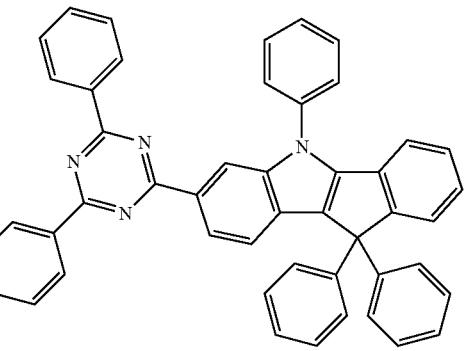
B-72
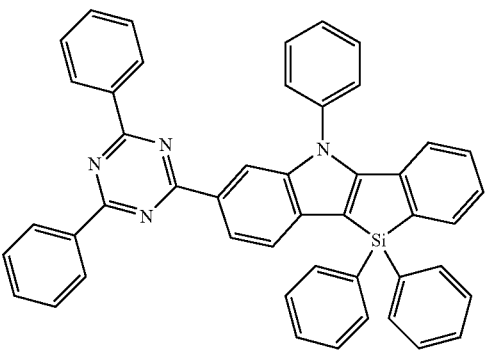

The compound for an organic optoelectronic device may have a molecular weight of less than or equal to about 900.

The compound for an organic optoelectronic device may have a molecular weight of less than or equal to about 600.

The organic optoelectronic device may be selected from an organic photoelectric device, an organic light emitting diode, an organic solar cell, an organic transistor, an organic photoconductor drum, and an organic memory device.

According to another embodiment, an organic light emitting diode including an anode, a cathode, and at least one organic thin layer between the anode and the cathode is provided. At least one organic thin layer includes the compound for an organic optoelectronic device according to the above embodiment.

The organic thin layer may be an emission layer, a hole transport layer ("HTL"), a hole injection layer ("HIL"), an electron transport layer ("ETC"), an electron injection layer ("EIL"), a hole blocking layer, and a combination thereof.

The compound for an organic optoelectronic device may be included in an emission layer.

The compound for an organic photoelectric device may be used as a phosphorescent or fluorescent host material in an emission layer.

According to yet another embodiment, a display device including the organic light emitting diode is provided.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Figure 1:
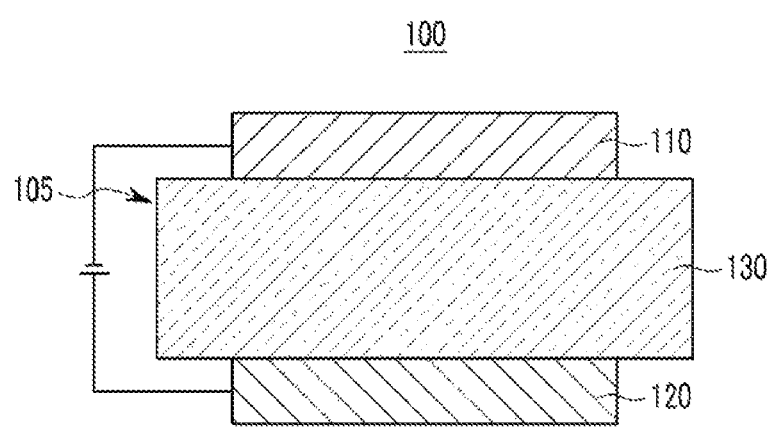
FIGS. 1 to 5 are cross-sectional views showing organic light emitting diodes according to various embodiments, including a compound for an organic optoelectronic device according to an embodiment.

Exemplary embodiments will hereinafter be described in detail. However, these embodiments are only exemplary, and the present disclosure is not limited thereto but rather is defined by the scope of the appended claims.

Accordingly, the embodiments are merely described below, by referring to the figures, to explain aspects of the present description. As used herein, the term "and/or" includes any and all combinations of one or more of the associated listed items. The term "or" means "and/or." Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Additional aspects will be set forth in part in the description which follows and, in part, will be apparent from the description.

As used herein, when specific definition is not otherwise provided, the term "substituted" refers to a group substituted with deuterium, a halogen, a hydroxy group (—OH), an amino group (—NH$_2$), a carboxyl group (—CO$_2$H), a substituted or unsubstituted C1 to C30 amine group, a nitro group (—NO$_2$), a substituted or unsubstituted C3 to C40 silyl group, a C1 to C30 alkyl group, a C1 to C10 alkylsilyl group, a C3 to C30 cycloalkyl group, a C6 to C30 aryl group, a C1 to C20 alkoxy group, a fluoro group (—F), a C1 to C10 trifluoroalkyl group such as a trifluoromethyl group (—CF$_3$) and the like, or a cyano group (—CN) instead of at least one hydrogen of a substituting group or compound.

Two adjacent substituents selected from a hydroxy group, an amino group, a substituted or unsubstituted C1 to C20 amine group, a nitro group (—NO$_2$), a substituted or unsubstituted C3 to C40 silyl group, a C1 to C30 alkyl group, a C1 to C10 alkylsilyl group, a C3 to C30 cycloalkyl group, a C6 to C30 aryl group, a C1 to C20 alkoxy group, a trifluoroalkyl group such as a trifluoromethyl group (—CF$_3$), or a cyano group (—CN) may be fused to each other to provide a ring.

As used herein, when specific definition is not otherwise provided, the term "hetero" refers to a group wherein one or more carbons are replaced with 1 to 3 hetero atoms selected from nitrogen (N), oxygen (O), sulfur (S), and phosphorus (P).

As used herein, when a definition is not otherwise provided, the term "combination thereof" refers to at least two substituents bound to each other by a linker, or at least two substituents fused to each other.

In the specification, when a definition is not otherwise provided, the term "alkyl group" may refer to an aliphatic hydrocarbon group. The alkyl group may be a saturated group without any double bond or triple bond.

The alkyl group may be branched, linear, or cyclic.

As used herein, when a definition is not otherwise provided, the term "alkenyl group" may refer to a substituent including at least one carbon-carbon double bond, and the "alkynyl group" may refer to a substituent including at least one carbon-carbon triple bond.

The alkyl group may be a C1 to C20 alkyl group. In one embodiment, the alkyl group may be a C1 to C10 alkyl group or a C1 to C6 alkyl group.

For example, the C1 to C4 alkyl group may have 1 to 4 carbon atoms, and may be selected from methyl, ethyl, propyl, iso-propyl, n-butyl, iso-butyl, sec-butyl, and t-butyl.

Examples of the alkyl group may include a methyl group, an ethyl group, a propyl group, an isopropyl group, a butyl group, an isobutyl group, a t-butyl group, a pentyl group, a hexyl group, a cyclopropyl group, a cyclobutyl group, a cyclopentyl group, a cyclohexyl group, and the like.

As used herein, when a definition is not otherwise provided, the term "alkoxy group" may refer to "alkyl-O—", wherein the alkyl is the same as described above and having the specified number of carbon atoms. Non-limiting examples of the alkoxy group include methoxy, ethoxy, propoxy, 2-propoxy, butoxy, t-butoxy, pentyloxy, hexyloxy, cyclopropoxy, and cyclohexyloxy.

As used herein, when a definition is not otherwise provided, the term "aromatic group" may refer to a substituent including all elements of the cycle having p-orbitals which form conjugation. Examples may include an aryl group and a heteroaryl group.

As used herein, when a definition is not otherwise provided, the term "aryl group" may refer to a monocyclic or fused ring polycyclic (i.e., wherein the rings share adjacent pairs of carbon atoms) group.

As used herein, when a definition is not otherwise provided, the term "aryloxy group" may refer to "—O-aryl" having the specified number of carbon atoms. A non-limiting example of the aryloxy group is phenoxy.

As used herein, when a definition is not otherwise provided, the term "silyl group" may refer to a monovalent or higher valency group derived from a completely saturated, branched or unbranched (or a straight or linear) silane, and having the specified number of carbon atoms. A non-limiting example of silyl group is trimethylsilyl ($(CH_3)_3Si—$).

As used herein, when a definition is not otherwise provided, the term "silyloxy group" may refer to "—O-silyl" having the specified number of carbon atoms. A non-limiting example of silyloxy group is trimethylsilyloxy ($(CH_3)_3SiO—$).

As used herein, when a definition is not otherwise provided, the term "acyl group" may refer to "—C(=O)-alkyl" wherein the alkyl is the same as described above and having the specified number of carbon atoms. A non-limiting example of the acyl group is acetyl ($CH_3C(=O)—$).

As used herein, when a definition is not otherwise provided, the term "alkoxycarbonyl group" may refer to "—C(=O)—O-alkyl" wherein the alkyl is the same as described above and having the specified number of carbon atoms. A non-limiting example of the alkoxycarbonyl group is methoxycarbonyl ($CH_3OC(=O)—$).

As used herein, when a definition is not otherwise provided, the term "acyloxy group" may refer to "—O-acyl" wherein the acyl is the same as described above and having the specified number of carbon atoms. A non-limiting example of the acyloxy group is acetyloxy ($CH_3C(=O)O—$).

As used herein, when a definition is not otherwise provided, the term "acylamino group" may refer to "—NH-acyl" wherein the acyl is the same as described above and having the specified number of carbon atoms. A non-limiting example of the acylamino group is acetylamino ($CH_3C(=O)NH—$).

As used herein, when a definition is not otherwise provided, the term "alkoxycarbonylamino group" may refer to "—NH—C(=O)—O-alkyl" wherein the alkyl is the same as described above and having the specified number of carbon atoms. A non-limiting example of the alkoxycarbonylamino group is methoxycarbonylamino ($CH_3OC(=O)NH—$).

As used herein, when a definition is not otherwise provided, the term "aryloxycarbonylamino group" may refer to "—NH—C(=O)—O-aryl" wherein the aryl is the same as described above and having the specified number of carbon atoms. A non-limiting example of the aryloxycarbonylamino group is phenoxycarbonylamino ($PhOC(=O)NH—$).

As used herein, when a definition is not otherwise provided, the term "sulfamoylamino group" may refer to $H_2NS(O_2)NH—$, alkyl-NHS($O_2$)NH—, (alkyl)$_2$NS($O_2$)NH—, aryl-NHS($O_2$)NH—, (aryl)$_2$NS(O)$_2$NH—, heteroaryl-NHS($O_2$)—NH—, or (heteroaryl)$_2$NHS($O_2$)—NH—, wherein alkyl, aryl, and heteroaryl are the same as described above and having the specified number of carbon atoms.

As used herein, when a definition is not otherwise provided, the term "sulfonyl group" may refer to alkyl-S($O_2$)—, aryl-S($O_2$)—, or heteroaryl-S($O_2$)—, wherein alkyl, aryl, and heteroaryl are the same as described above and having the specified number of carbon atoms.

As used herein, when a definition is not otherwise provided, the term "alkylthio group" may refer to "alkyl-S—", wherein the alkyl is the same as described above and having the specified number of carbon atoms. Non-limiting example of the alkylthio group include methylthio.

As used herein, when a definition is not otherwise provided, the term "arylthio group" may refer to "aryl-S—", wherein the aryl is the same as described above and having the specified number of carbon atoms. Non-limiting example of the arylthio group include phenylthio.

As used herein, when a definition is not otherwise provided, the term "heterocyclothio group" may refer to "heterocyclo-S—", wherein the heterocyclo is a saturated hydrocarbon ring group, including at least one heteroatom selected from nitrogen (N), oxygen (O), phosphorous (P), and sulfur (S), wherein the rest of the cyclic atoms are carbon, and having the specified number of carbon atoms. A non-limiting example of a heterocycloalkyl group includes tetrahydro-2H-pyran-2-yl-thio-($OC_5H_9—S—$).

As used herein, when a definition is not otherwise provided, the term "ureide group" may refer to $H_2NC(O)NH—$, alkyl-NHC(O)NH—, (alkyl)$_2$NC(O)NH—, aryl-NHC(O)NH—, (aryl)$_2$NC(O)NH—, heteroaryl-NHC(O)—NH—, or (heteroaryl)$_2$NHC(O)NH—, wherein alkyl, aryl, and heteroaryl are the same as described above and having the specified number of carbon atoms.

As used herein, when a definition is not otherwise provided, the term "halogen" may refer to —F, —Cl, —Br, or —I.

As used herein, when a definition is not otherwise provided, the term "ferrocenyl group" may refer to a monovalent or higher valency group derived from ferrocene (bis (η5-cyclopentadienyl)iron) by a removal of one or more hydrogen atoms.

As used herein, when a definition is not otherwise provided, the term "heteroaryl group" may refer to an aryl group including 1 to 3 hetero atoms selected from nitrogen (N), oxygen (O), sulfur (S), and phosphorus (P), and remaining carbons in one functional group. The heteroaryl group may be a fused ring cyclic group where each cycle may include the 1 to 3 heteroatoms.

Non-limiting examples of a monocyclic heteroaryl group include thienyl, furyl, pyrrolyl, imidazolyl, pyrazolyl, thiazolyl, isothiazolyl, 1,2,3-oxadiazolyl, 1,2,4-oxadiazolyl, 1,2,5-oxadiazolyl, 1,3,4-oxadiaxolyl, 1,2,3-thiadiazolyl, 1,2,4-thiadiazolyl, 1,2,5-thiadiazolyl, 1,3,4-thiazolyl, isothiazol-3-yl, isothiazol-4-yl, isothiazol-5-yl, oxazol-2-yl, oxazol-4-yl, oxazol-5-yl, isoxazol-3-yl, isoxazol-4-yl, isoxazol-5-yl, 1,2,4-triazol-3-yl, 1,2,4-triazol-5-yl, 1,2,3-triazol-4-yl, 1,2,3-triazol-5-yl, tetrazolyl, pyrid-2-yl, pyrid-3-yl, 2-pyrazin-2-yl, pyrazin-4-yl, pyrazin-5-yl, 2-pyrimidin-2-yl, 4-pyrimidin-2-yl, and 5-pyrimidin-2-yl.

Non-limiting examples of a bicyclic heteroaryl group include indolyl, isoindolyl, indazolyl, indolizinyl, purinyl, quinolizinyl, quinolinyl, isoquinolinyl, cinnolinyl, phthalazinyl, naphthyridinyl, quinazolinyl, quinaxalinyl, phenanthridinyl, phenathrolinyl, phenazinyl, phenothiazinyl, phenoxazinyl, benzisoqinolinyl, thieno[2,3-b]furanyl, furo[3,2-b]pyranyl, 5H-pyrido[2,3-d]-o-oxazinyl, 1H-pyrazolo[4,3-d]oxazolyl, 4H-imidazo[4,5-d]thiazolyl, pyrazino[2,3-d]pyridazinyl, imidazo[2,1-b]thiazolyl, imidazo[1,2-b][1,2,4]triazinyl, 7-benzo[b]thienyl, benzoxazolyl, benzimidazolyl, benzothiazolyl, benzoxapinyl, benzoxazinyl, 1H-pyrrolo[1,2-b][2]benzazapinyl, benzofuryl, benzothiophenyl, benzotriazolyl, pyrrolo[2,3-b]pyridyl, pyrrolo[3,2-c]pyridyl, pyrrolo[3,2-b]pyridyl, imidazo[4,5-b]pyridyl, imidazo[4,5-c]pyridyl, pyrazolo[4,3-d]pyridyl, pyrazolo[4,3-c]pyridyl, pyrazolo[3,4-c]pyridyl, pyrazolo[3,4-d]pyridyl, pyrazolo[3,4-b]pyridyl, imidazo[1,2-a]pyridyl, pyrazolo[1,5-a]pyridyl, pyrrolo[1,2-b]pyridazinyl, imidazo[1,2-c]pyrimidinyl, pyrido[3,2-d]pyrimidinyl, pyrido[4,3-d]pyrimidinyl, pyrido[3,4-d]pyrimidinyl, pyrido[2,3-d]pyrimidinyl, pyrido[2,3-b]pyrazinyl, pyrido[3,4-b]pyrazinyl, pyrimido[5,4-d]pyrimidinyl, pyrazino[2,3-b]pyrazinyl, and pyrimido[4,5-d]pyrimidinyl.

In this specification, when a definition is not otherwise provided, the term "hole properties" may refer to a characteristic that a hole formed in the positive electrode is readily injected into the emission layer and transported in the emission layer due to a conductive characteristic according to HOMO level. For example, the hole properties are similar to electron-repelling properties.

In this specification, when a definition is not otherwise provided, the term "electron properties" may refer to a characteristic that an electron formed in the negative electrode is readily injected into the emission layer and transported in the emission layer due to a conductive characteristic according to LUMO level. For example, the hole properties are similar to electron-withdrawing properties.

A compound for an organic optoelectronic device according to an embodiment may have a core structure including, for example, a fused bis-indole structure. Carbon atoms of the core structure may be substituted with nitrogen.

An embodiment may include the core structure substituted with a substituent having electron properties and/or a substituent having hole properties.

The core structure may be used as a light emitting material, a hole injection material, or a hole transport material of an organic optoelectronic device.

Particularly, it may be adapted for an electron injection material or an electron transporting material.

The compound for an organic optoelectronic device includes a core part and various substituents for substituting the core part, and thus may have various energy bandgaps.

The compound may have an appropriate energy level depending on the substituents, and thus may fortify electron transporting capability and hole transport capability of an organic optoelectronic device and bring about excellent effects in terms of efficiency and driving voltage, and may also have excellent electrochemical and thermal stability and thus improve life-span characteristics during the operation of the organic optoelectronic device.

According to an embodiment, a compound for an organic optoelectronic device represented by the following Chemical Formula 1 is provided.

Chemical Formula 1

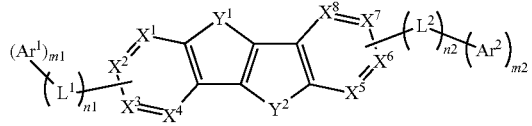

In Chemical Formula 1, $Y^1$ and $Y^2$ are independently —O—, —S—, —S(O$_2$)—, —CR'R"—, —SiR'R"—, or —NR'—, $X^1$ to $X^8$ are independently —CR'— or —N—, any two adjacent $X^1$ to $X^8$ optionally form a fused ring, $Ar^1$, $Ar^2$, R', and R" are independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthio group, a substituted or unsubstituted C6 to C20 arylthio group, a substituted or unsubstituted C1 to C20 heterocyclothio group, a substituted or unsubstituted C1 to C20 ureide group, a substituted or unsubstituted C3 to C40 silyl group, or a combination thereof, one of $X^1$ to $X^4$ is —CR'—, wherein R' forms a bond with an adjacent substituent, one of $X^5$ to $X^8$ is —CR'—, wherein the R' forms a bond with an adjacent substituent, at least one of $Ar^1$ and $Ar^2$ is a substituted or unsubstituted C2 to C30 heteroaryl group having electron properties, $L^1$ and $L^2$ are independently a substituted or unsubstituted C2 to C20 alkenylene group, a substituted or unsubstituted C2 to C20 alkynylene group, a substituted or unsubstituted C6 to C30 arylene group, a substituted or unsubstituted C2 to C30 heteroarylene group, or a combination thereof, n1 and n2 are independently integers ranging from 0 to 3, m1 and m2 are independently integers ranging from 0 to 3, and m1 and m2 are not simultaneously 0.

The structure such as the above Chemical Formula 1 may improve processability and efficiency of a device.

The compound for an organic optoelectronic device represented by Chemical Formula 1 may have a molecular weight of less than or equal to about 900. When a compound generally has a small molecular weight, stability of materials may be ensured due to a low deposition temperature during a deposition process.

For example, the molecular weight may range from about 450 to about 810, for example, about 530 to about 682, and for example less than or equal to about 600.

In order to enhance electron properties of the compound, at least one of $Ar^1$ and $Ar^2$ may be a substituted or unsubstituted C2 to C30 heteroaryl group having electron properties.

For example, the $Y^1$ and $Y^2$ may be independently —O—, —S—, —S(O$_2$)—, or —NR'—. In addition, the $Y^1$ and $Y^2$ may be the same or different. However, they are not limited thereto.

In an embodiment, the $Ar^1$, $Ar^2$, R', and R" are independently a substituted or unsubstituted phenyl group, a substituted or unsubstituted naphthyl group, a substituted or unsubstituted anthracenyl group, a substituted or unsubstituted phenanthryl group, a substituted or unsubstituted naphthacenyl group, a substituted or unsubstituted pyrenyl group, a substituted or unsubstituted biphenylyl group, a substituted or unsubstituted p-terphenyl group, a substituted or unsubstituted m-terphenyl group, a substituted or unsubstituted chrysenyl group, a substituted or unsubstituted triperylenyl group, a substituted or unsubstituted perylenyl group, a substituted or unsubstituted indenyl group, a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, or a combination thereof, but are not limited thereto.

In an embodiment, the R', and R" may be one of the following substituents.

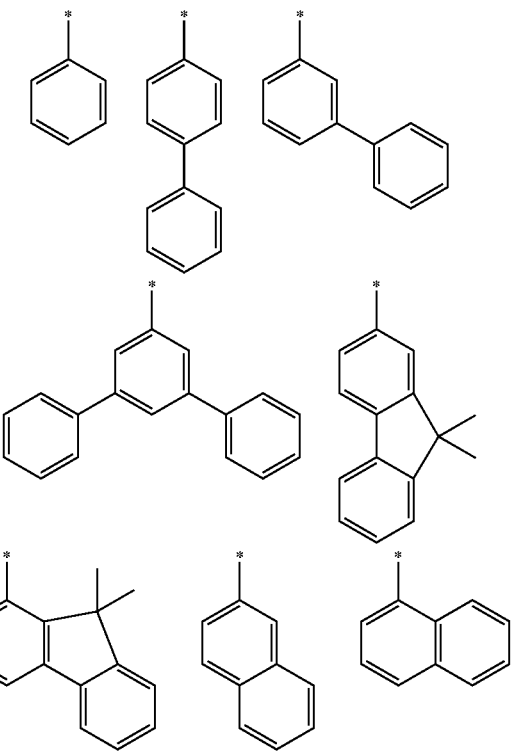

A total conjugation length of the compound may be controlled by selecting $L^1$ and $L^2$ appropriately, and thereby bandgap of triplet energy may be adjusted. Thereby, a material needed for an organic optoelectronic device may be realized. In addition, ortho-, para-, or meta-binding positions may adjust the triplet energy bandgap.

Examples of the $L^1$ and $L^2$ may include a substituted or unsubstituted phenylene group, a substituted or unsubstituted biphenylene group, a substituted or unsubstituted terphenylene group, a substituted or unsubstituted naphthylene group, a substituted or unsubstituted anthracenylene group, a substituted or unsubstituted phenanthrylene group, a substituted or unsubstituted pyrenylene group, a substituted or unsubstituted fluorenylene group, a substituted or unsubstituted p-terphenyl group, a substituted or unsubstituted m-terphenyl group, a substituted or unsubstituted pyrenylene group, and the like.

For example, the $L^1$ and/or $L^2$ may be a phenylene group. When the $L^1$ and/or $L^2$ are a phenylene group, both cores may be linked at an ortho-, meta-, or para-position relative to the phenylene group.

The $X^1$ to $X^8$ may be —CR'—. In this case, thermal stability of the compound may be improved.

At least one of the $X^1$ to $X^8$ may be N. In this case, electron properties of the compound may be adjusted finely, and efficiency of a device may be improved.

The $Y^2$ may be —NR'—, and the $Y^1$ may be —NR'— or —S—. In this case, an appropriate energy level of the compound may be provided and thus efficiency of a device may be improved.

The $Y^1$ and $Y^2$ may be —NR'—. In this case, sublimation properties of the compound may be provided and processability may be improved.

In an embodiment, the $Y^2$ may be —NR'—, and the $Y^1$ may be —CR'R"— or —SiR'R"—. However, they are not limited thereto.

In another embodiment, the $Y^2$ may be —CR'R"—, and the $Y^1$ may be —SiR'R"—. However, they are not limited thereto.

The substituted or unsubstituted C2 to C30 heteroaryl group having electron properties may be a substituted or unsubstituted quinolinyl group, a substituted or unsubstituted isoquinolinyl group, a substituted or unsubstituted pyridyl group, a substituted or unsubstituted pyrimidinyl group, a substituted or unsubstituted triazinyl group, or a combination thereof, but is not limited thereto.

For example, the substituted or unsubstituted C2 to C30 heteroaryl group having electron properties may be represented by the following Chemical Formulae X-1 to X-15, but is not limited thereto.

Chemical Formula X-1

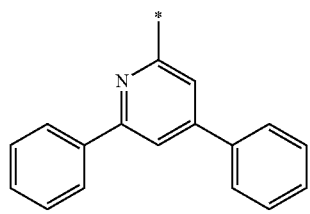

Chemical Formula X-2

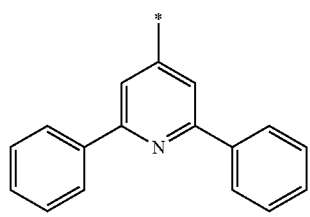

Chemical Formula X-3

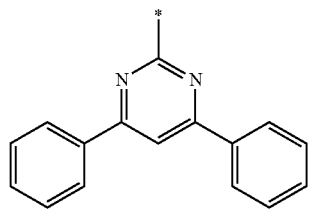

Chemical Formula X-4

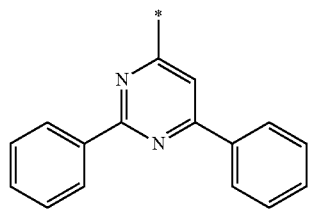

Chemical Formula X-5

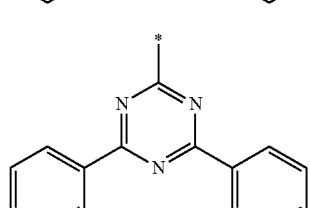

Chemical Formula X-6

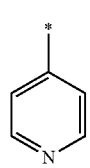

Chemical Formula X-7

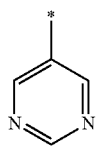

Chemical Formula X-8

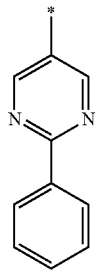

Chemical Formula X-9]

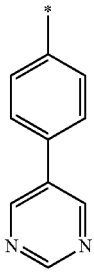

[Chemical Formula X-10]

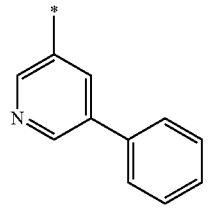

Chemical Formula X-11

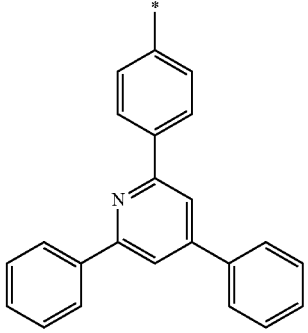

Chemical Formula X-12

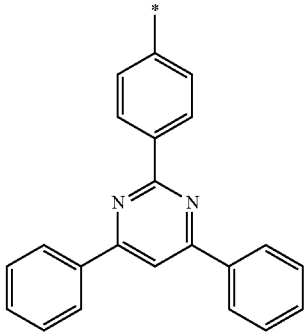

-continued

Chemical Formula X-13

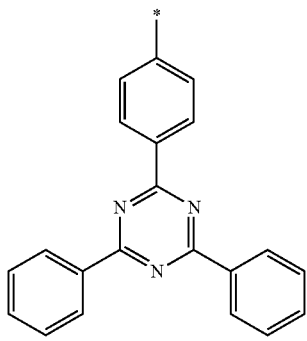

Chemical Formula X-14

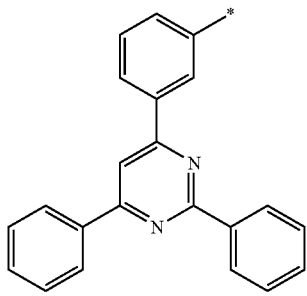

Chemical Formula X-15

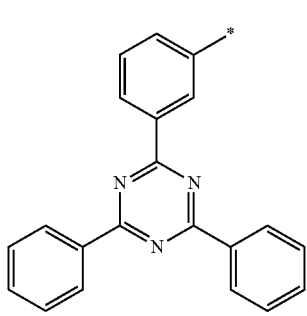

In an embodiment, the compound for an organic optoelectronic device may be represented by the following Chemical Formula 2.

Chemical Formula 2

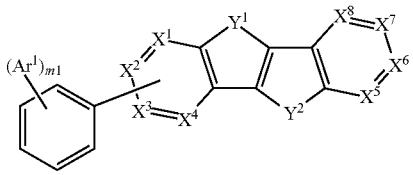

In Chemical Formula 2,
$Y^1$ and $Y^2$ are independently —O—, —S—, —S(O$_2$)—, —CR'R"—, —SiR'R"—, or —NR'—,
$X^1$ to $X^8$ are independently —CR'— or —N—,
any two adjacent $X^1$ to $X^8$ optionally form a fused ring,
$Ar^1$, R', and R" are independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthio group, a substituted or unsubstituted C6 to C20 arylthio group, a substituted or unsubstituted C1 to C20 heterocyclothio group, a substituted or unsubstituted C1 to C20 ureide group, a substituted or unsubstituted C3 to C40 silyl group, or a combination thereof,
one of $X^1$ to $X^4$ is —CR'—, wherein R' forms a bond with an adjacent substituent, at least one $Ar^1$ is a substituted or unsubstituted C2 to C30 heteroaryl group having electron properties, and
m1 is 1 or 2.

An embodiment is not limited to the above Chemical Formula 2.

In another embodiment, the compound for an organic optoelectronic device may be represented by the following Chemical Formula 3.

Chemical Formula 3

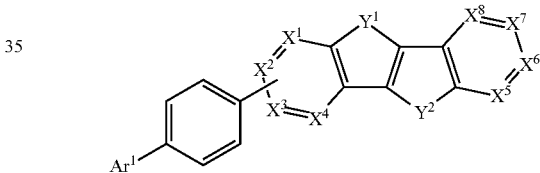

In Chemical Formula 3,
$Y^1$ and $Y^2$ are independently —O—, —S—, —S(O$_2$)—, —CR'R"—, —SiR'R"—, or —NR'—,
$X^1$ to $X^8$ are independently —CR'— or —N—,
any two adjacent $X^1$ to $X^8$ optionally form a fused ring,
R', and R" are independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthio group, a substituted or unsubstituted C6 to C20 arylthio group, a substituted or unsubstituted C1 to C20 heterocyclothio group, a substituted or unsubstituted C1 to C20 ureide group, a substituted or unsubstituted C3 to C40 silyl group, or a combination thereof, one of $X^1$ to $X^4$ is —CR'—, wherein the R' forms a bond with an adjacent substituent, and $Ar^1$ is a substituted or unsubstituted C2 to C30 heteroaryl group having electron properties.

As in the above Chemical Formula 3, when $Ar^1$ is linked at a para position relative to phenylene as a linking group, efficiency of a device may be improved. However, the present disclosure is not limited thereto.

In another embodiment, the compound for an organic optoelectronic device may be represented by the following Chemical Formula 4.

Chemical Formula 4

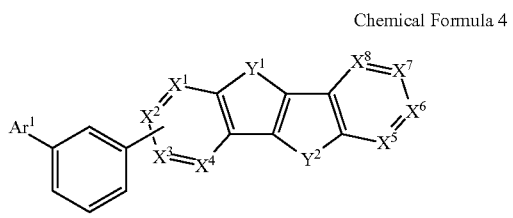

In Chemical Formula 4, $Y^1$ and $Y^2$ are independently —O—, —S—, —S(O$_2$)—, —CR'R"—, —SiR'R"—, or —NR'—, $X^1$ to $X^8$ are independently —CR'— or —N—, any two adjacent $X^1$ to $X^8$ optionally form a fused ring, R', and R" are independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthio group, a substituted or unsubstituted C6 to C20 arylthio group, a substituted or unsubstituted C1 to C20 heterocyclothio group, a substituted or unsubstituted C1 to C20 ureide group, a substituted or unsubstituted C3 to C40 silyl group, or a combination thereof, one of $X^1$ to $X^4$ is —CR'—, wherein R' forms a bond with an adjacent substituent, and $Ar^1$ is a substituted or unsubstituted C2 to C30 heteroaryl group having electron properties, and $Ar^1$ is a substituted or unsubstituted C2 to C30 heteroaryl group having electron properties.

As in the above Chemical Formula 4, when $Ar^1$ is linked at a meta position relative to phenylene as a linking group, a sublimation temperature of the compound relatively decreases, and processability of a device may be improved. However, the present disclosure is not limited thereto.

The compound for an organic optoelectronic device may be represented by one of the following Chemical Formulae A-1 to A-145. However, the present disclosure is not limited thereto.

A-1

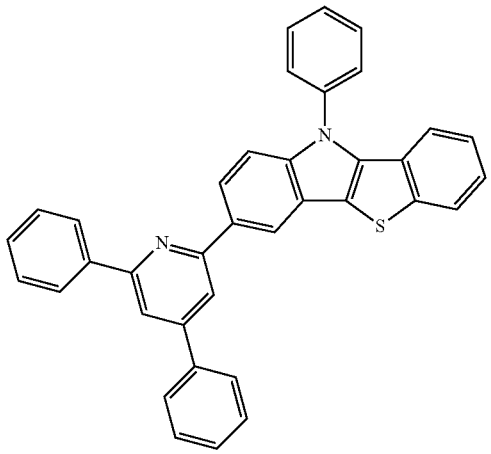

A-2

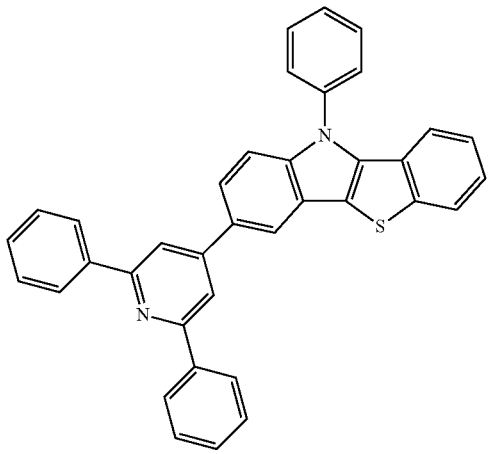

A-3

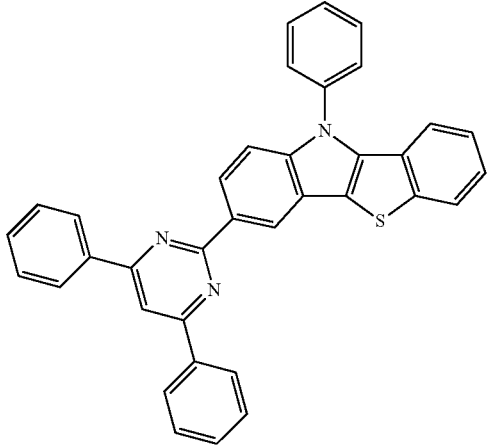

A-4
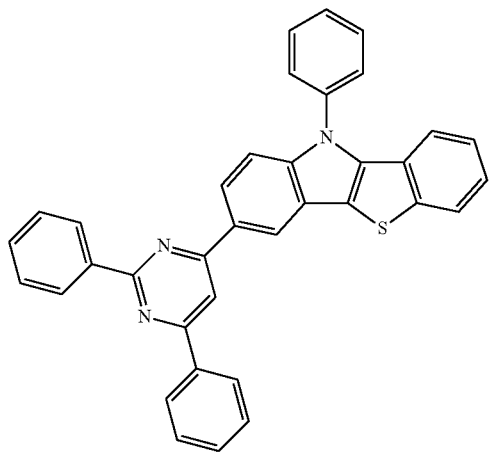
A-5
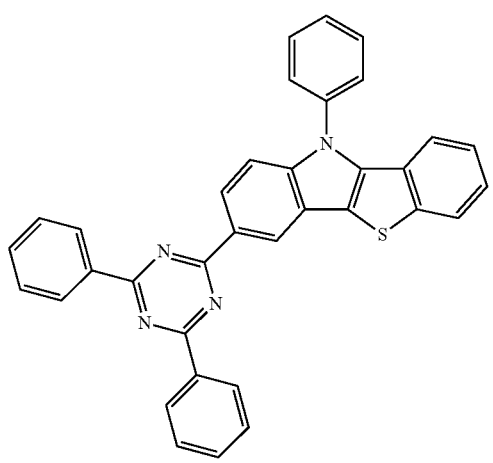
A-6
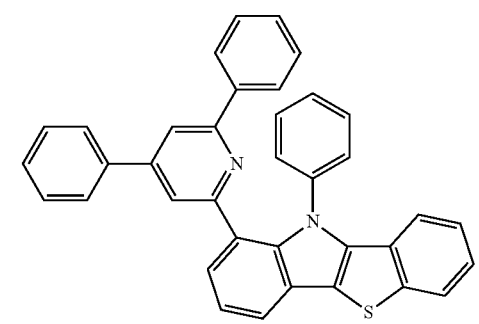
A-7
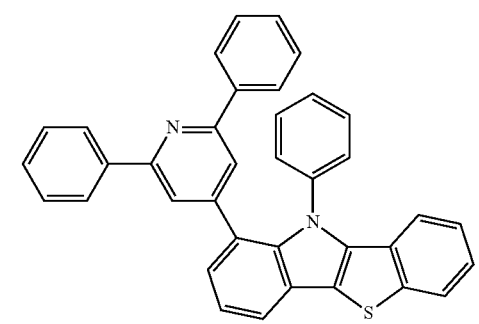
A-8
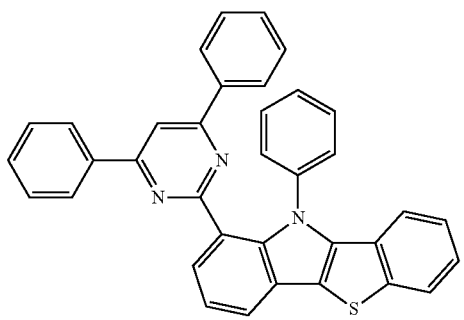
A-9
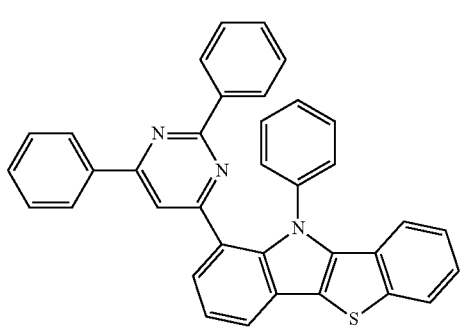
A-10
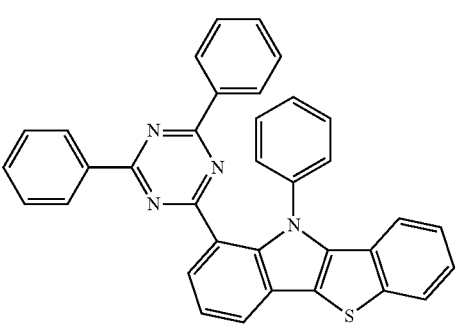
A-11
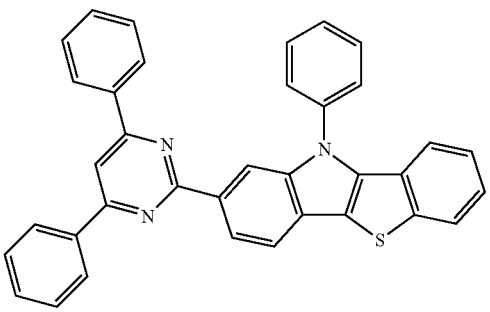
A-12
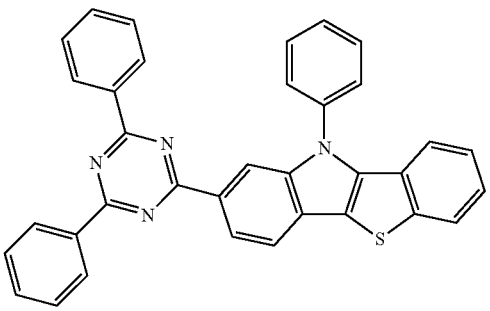

A-13
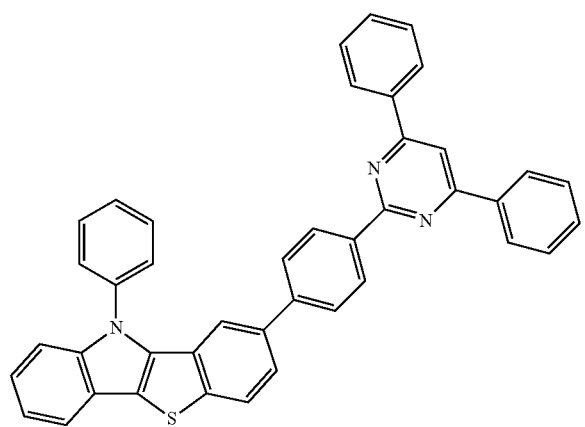
A-17
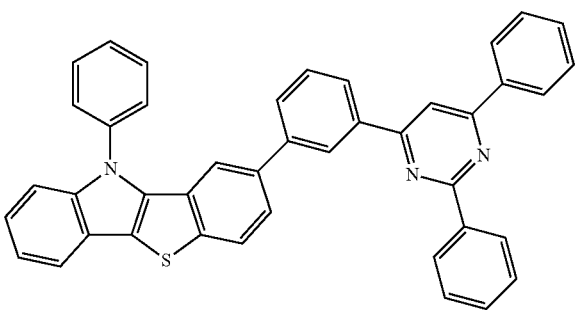
A-14
A-18
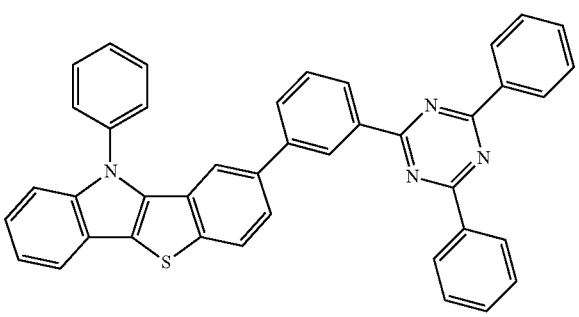
A-15
A-19
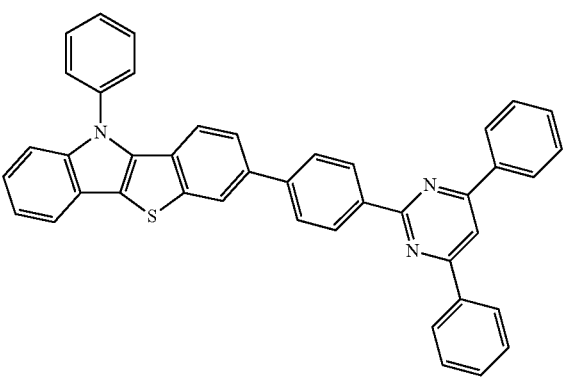
A-16
A-20
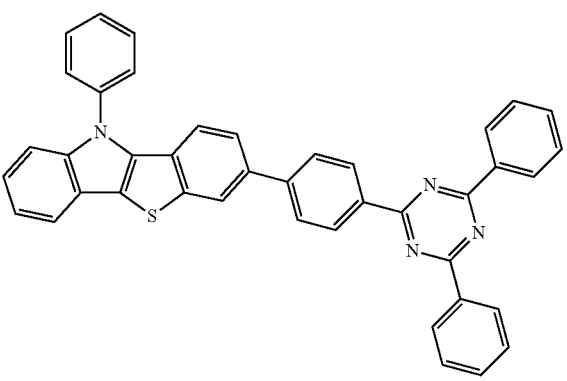

-continued
A-21
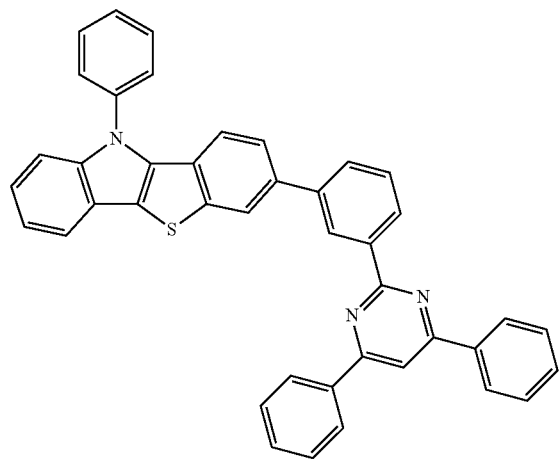
A-22
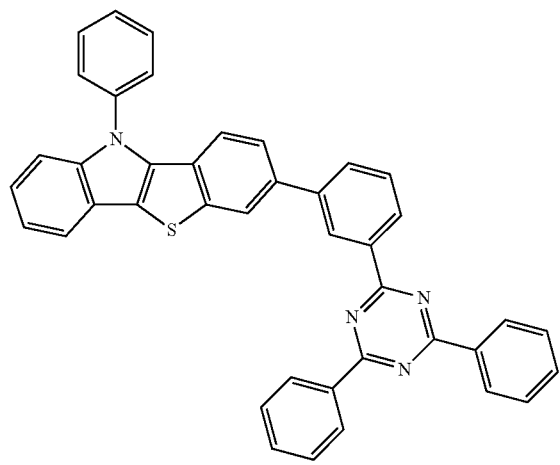
A-23
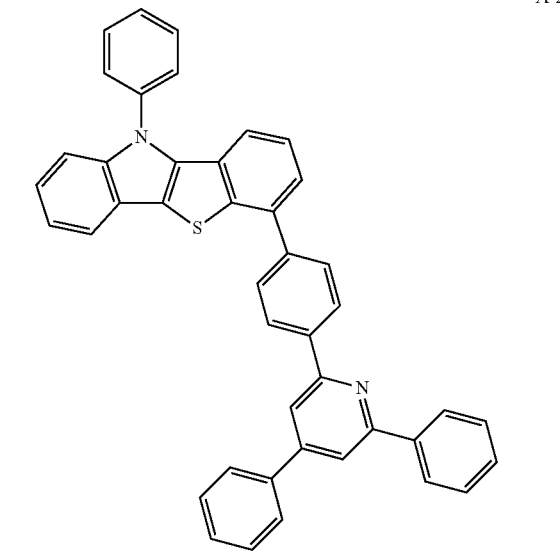
-continued
A-24
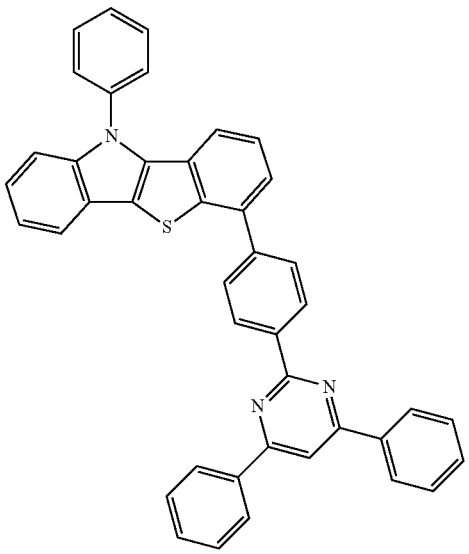
A-25
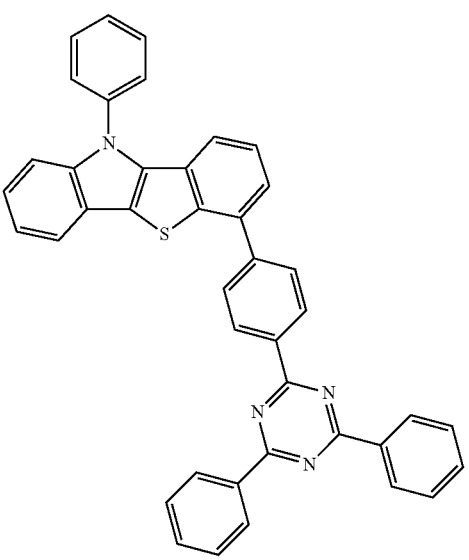
A-26
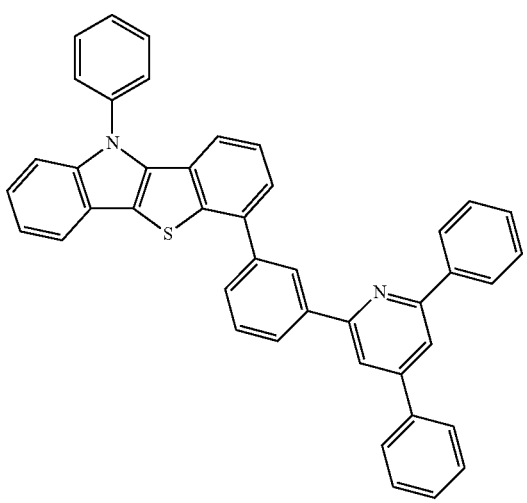

A-27
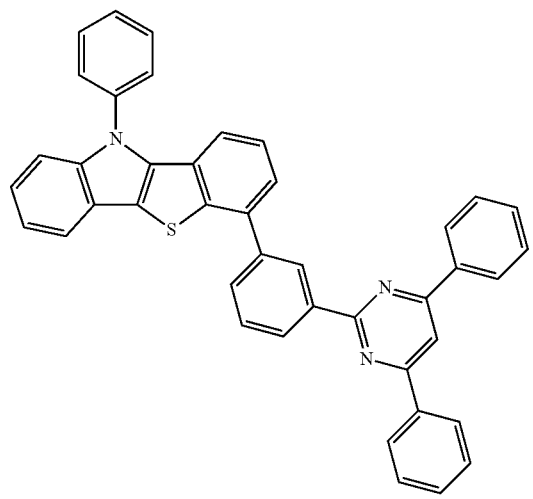
A-28
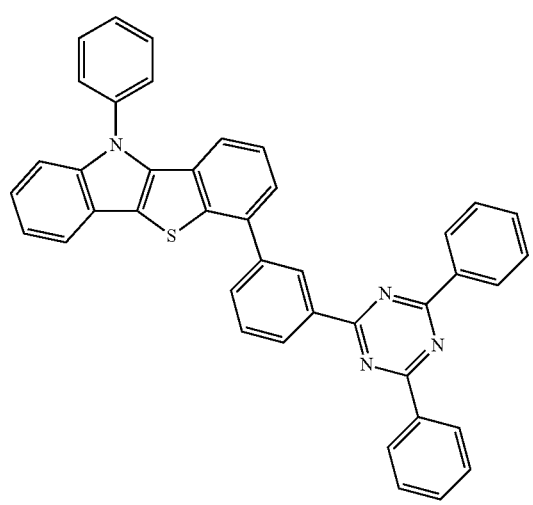
A-29
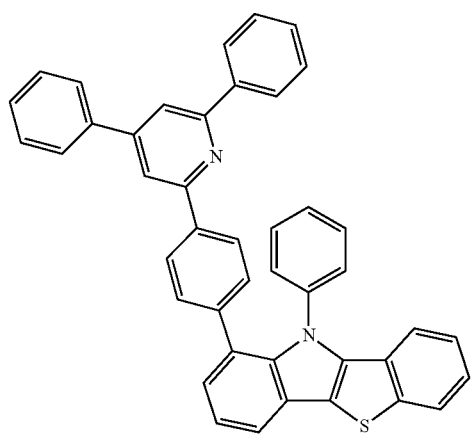
A-30
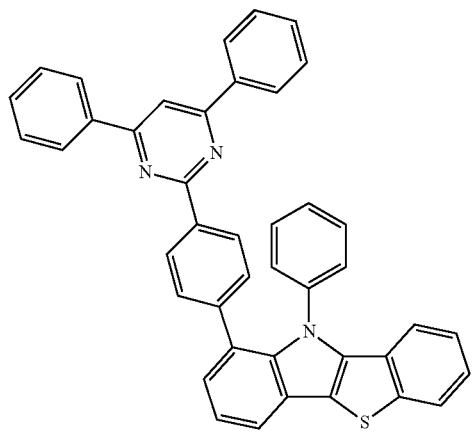
A-31
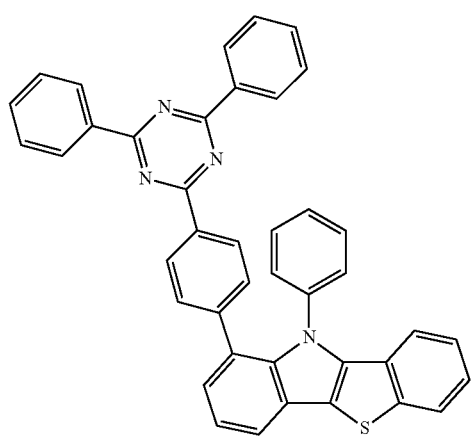
A-32
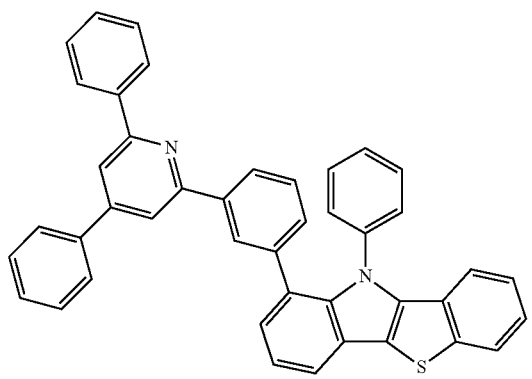
A-33
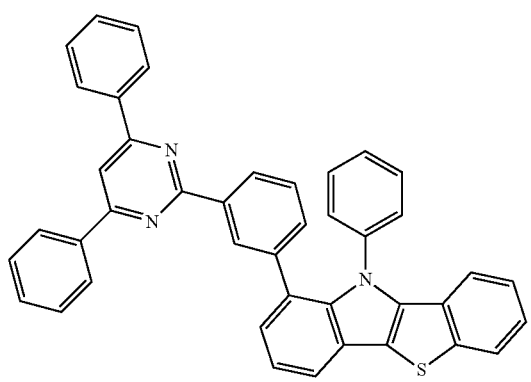

A-34
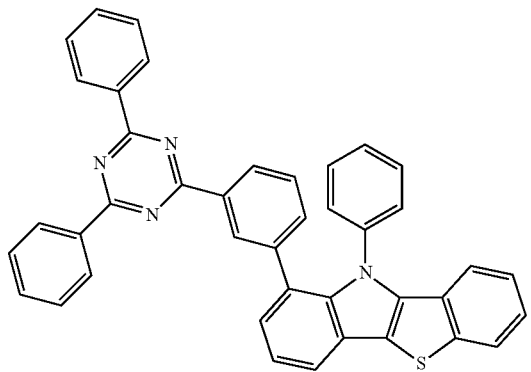
A-35
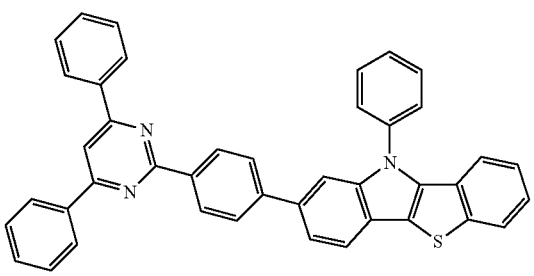
A-36
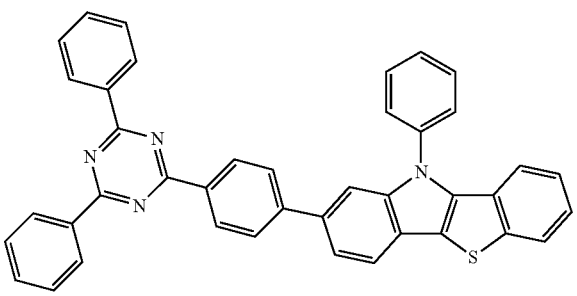
A-37
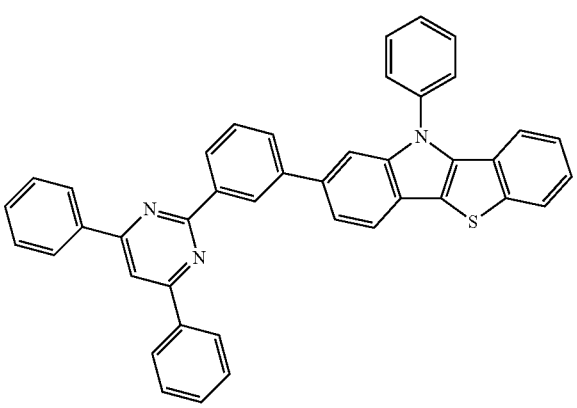
A-38
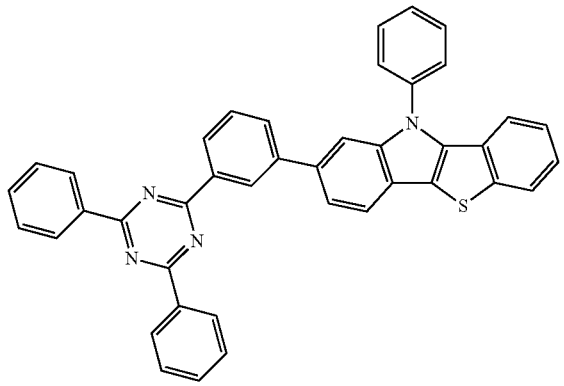
A-39
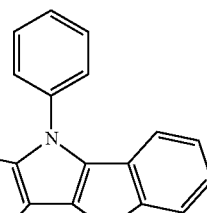
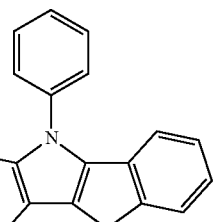
A-40

-continued
A-41
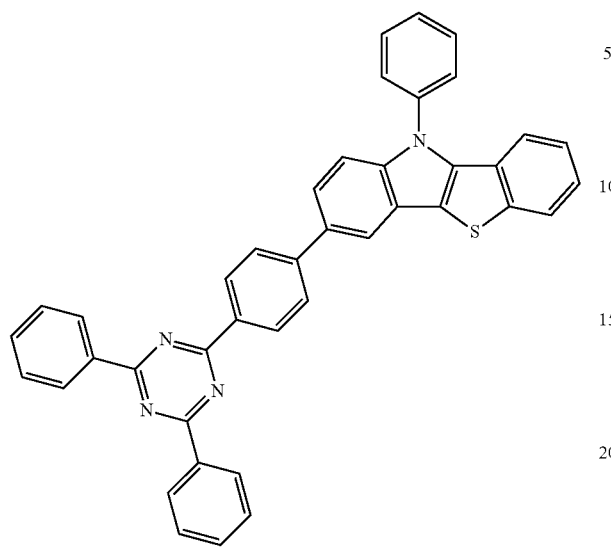
A-41
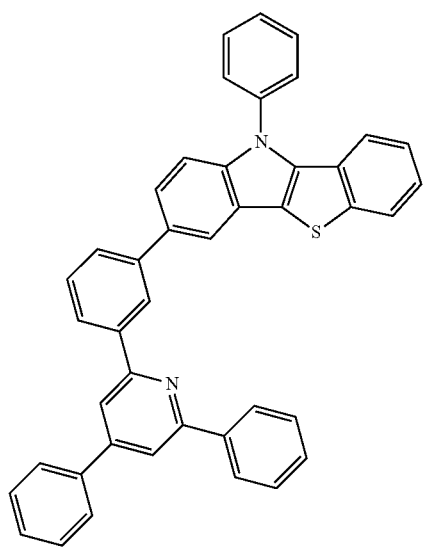
A-42
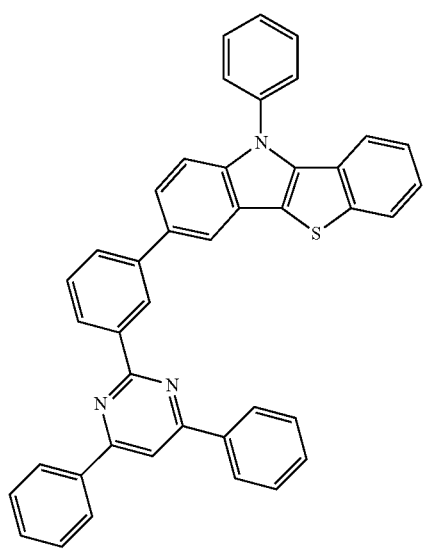
-continued
A-43
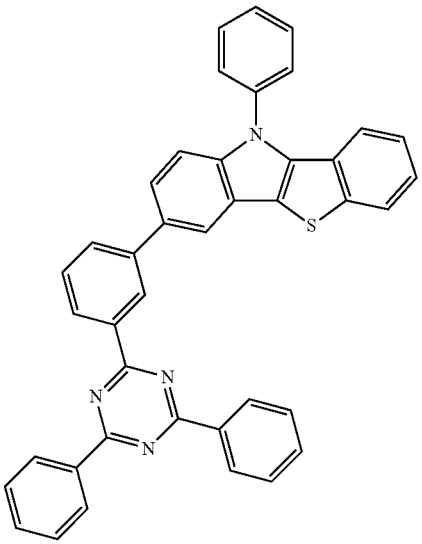
A-44
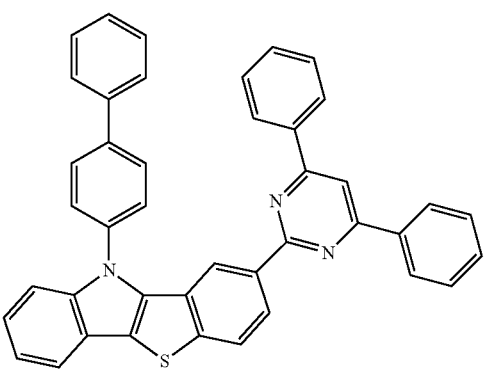
A-45
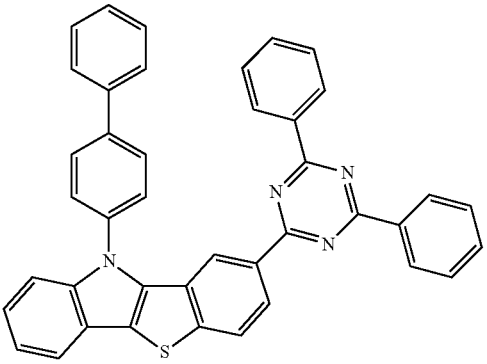
A-46
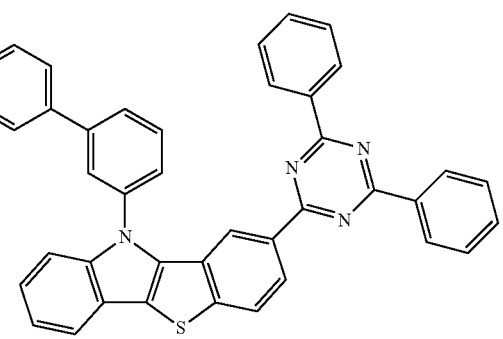

A-47
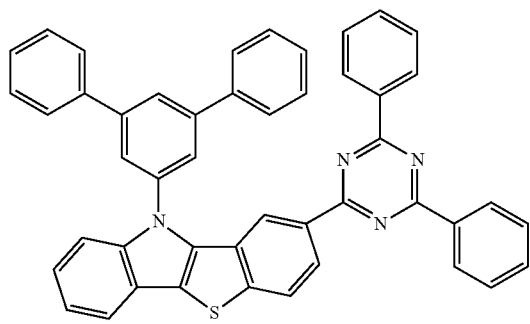
A-48
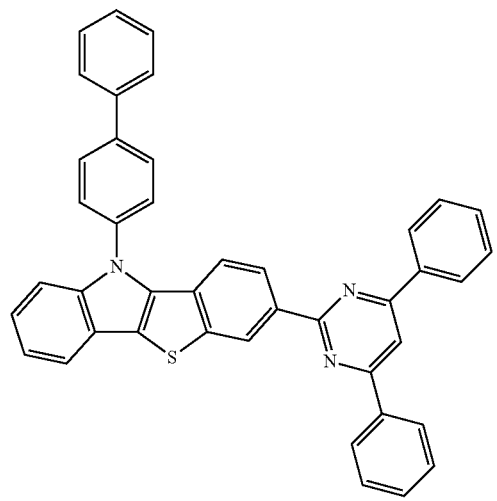
A-49
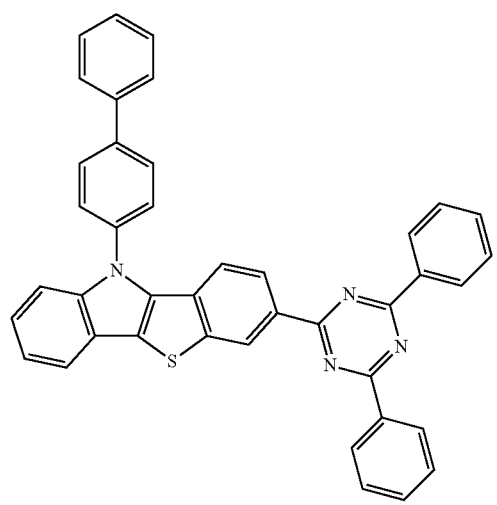
A-50
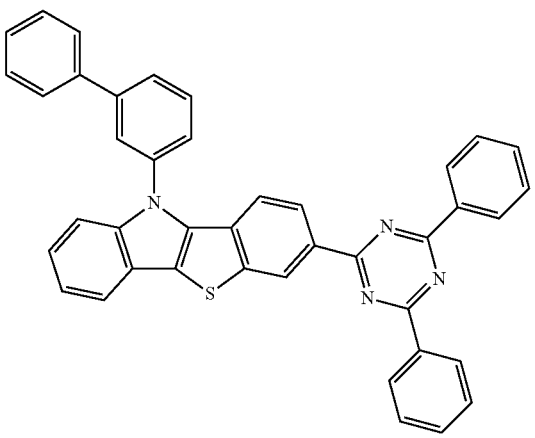
A-51
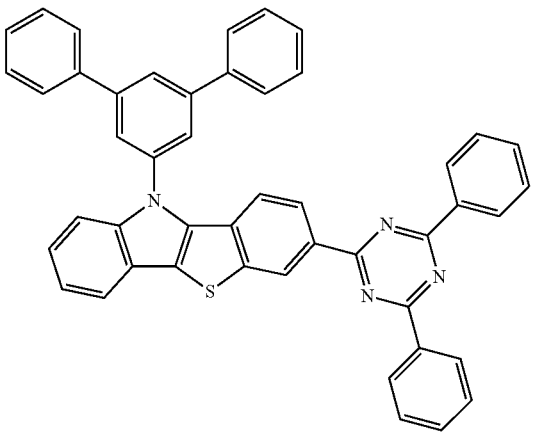
A-52
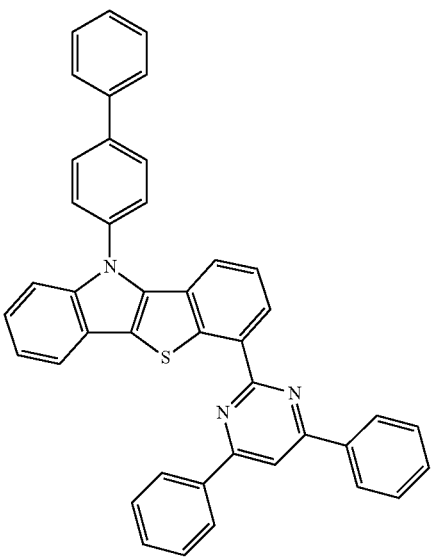

A-53
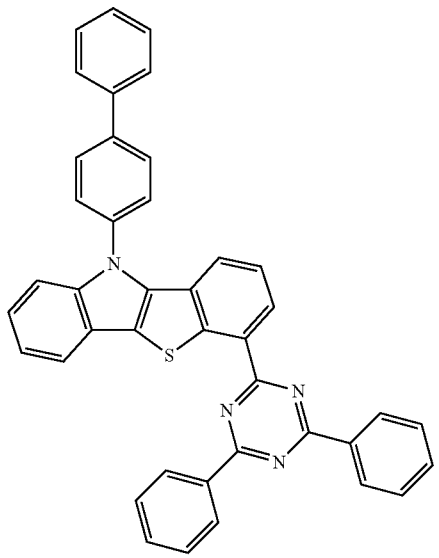
A-54
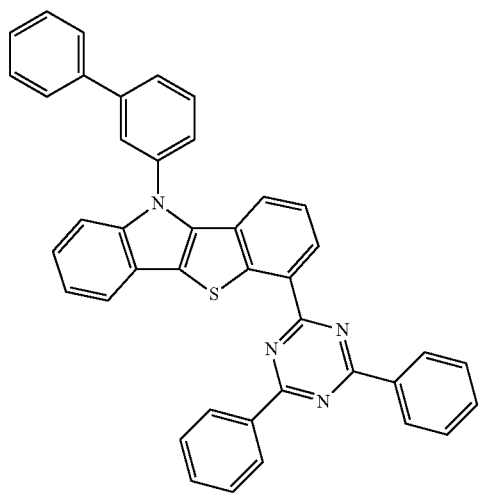
A-55
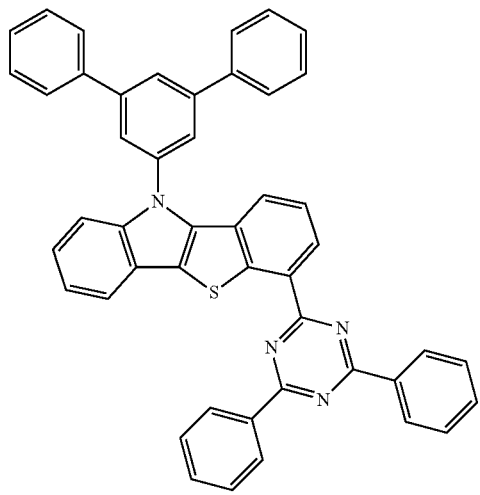
A-56
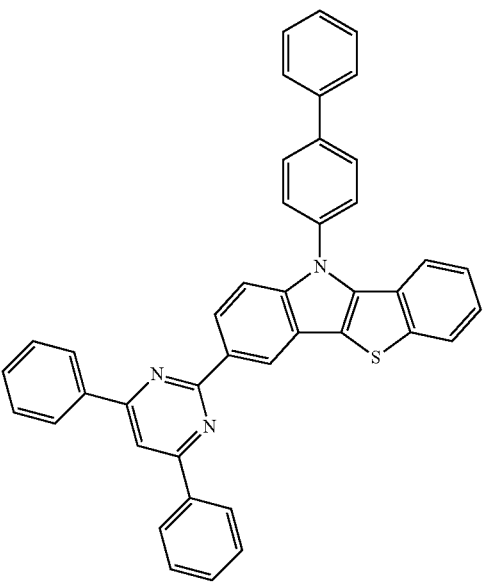
A-57
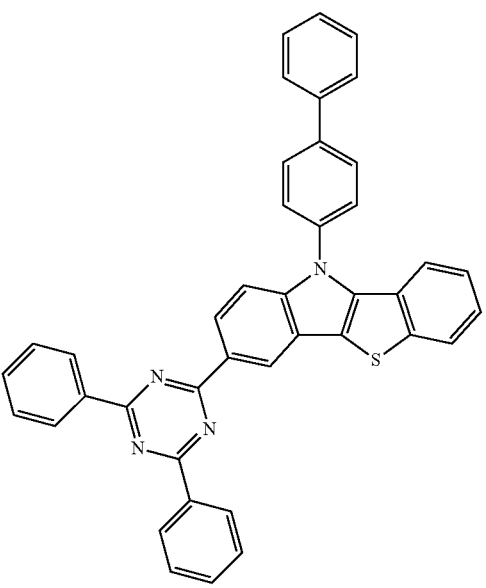

A-58
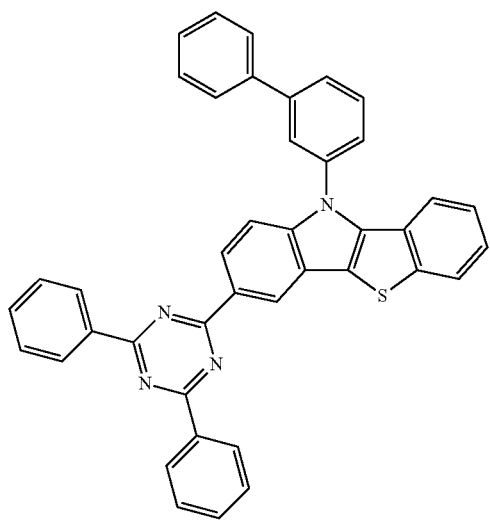
A-59
A-60
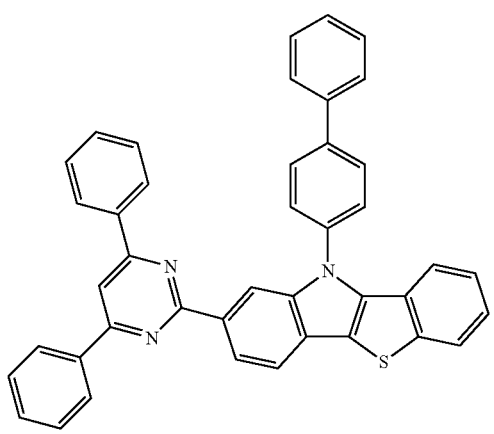
A-61
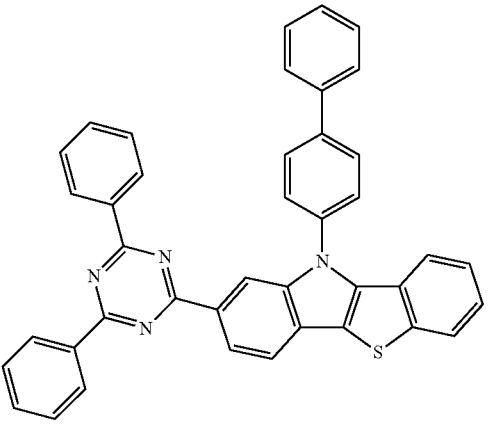
A-62
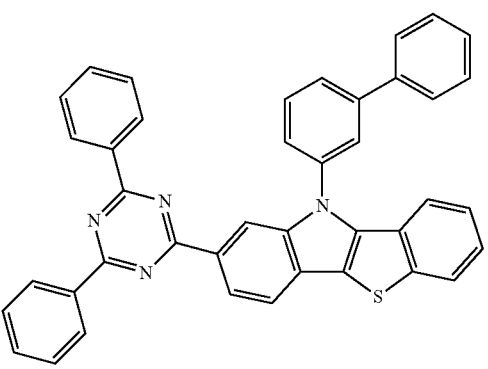
A-63
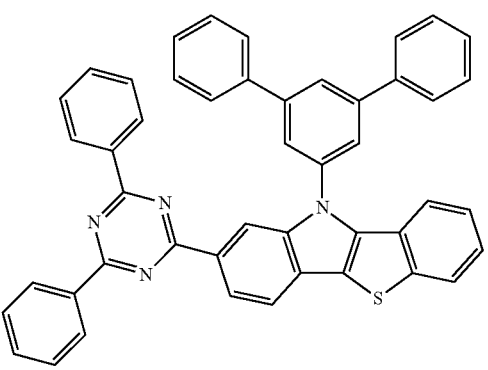
A-64
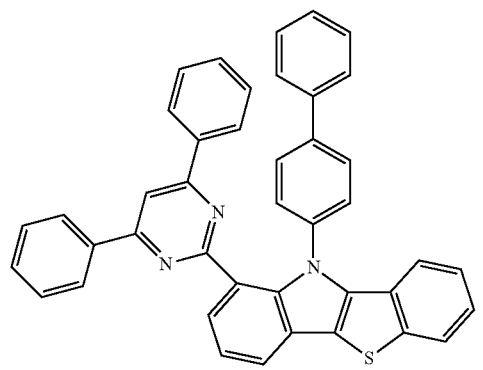

A-65
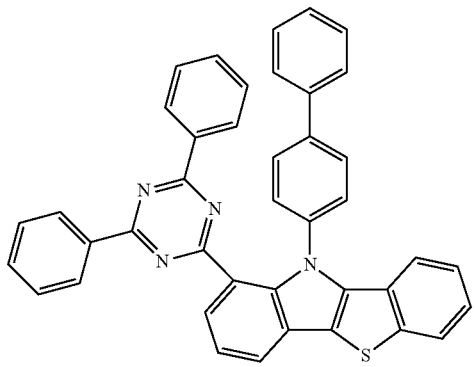
A-66
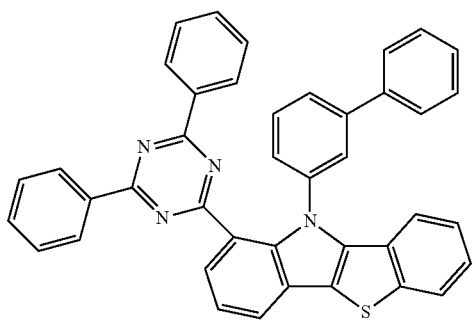
A-67
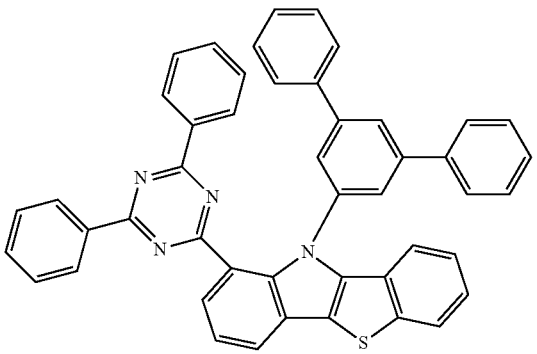
A-68
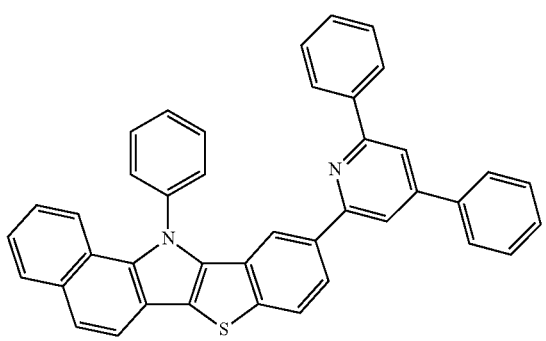
A-69
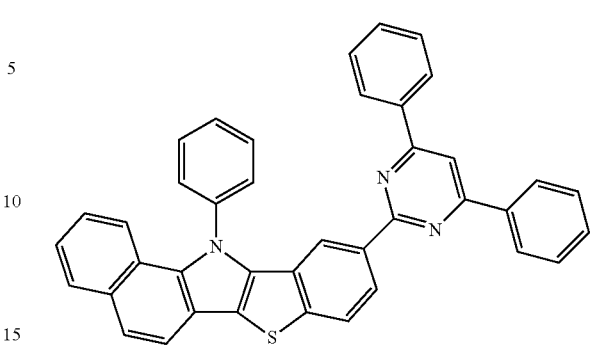
A-70
A-71
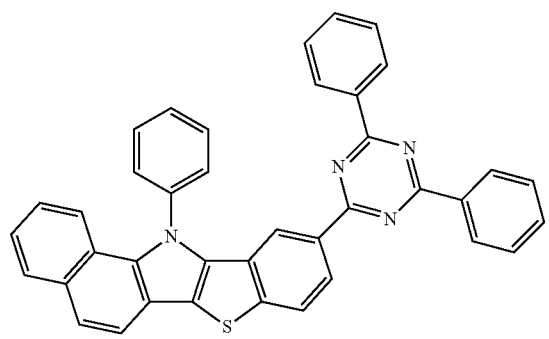
A-72
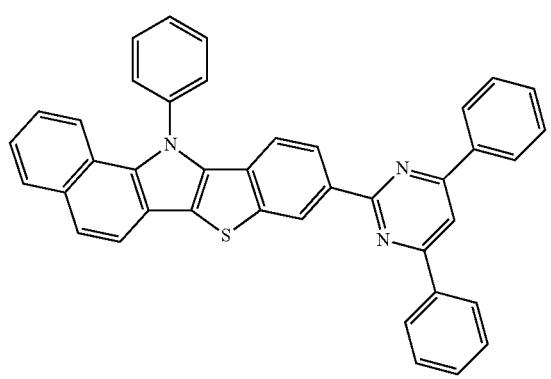

-continued
A-73
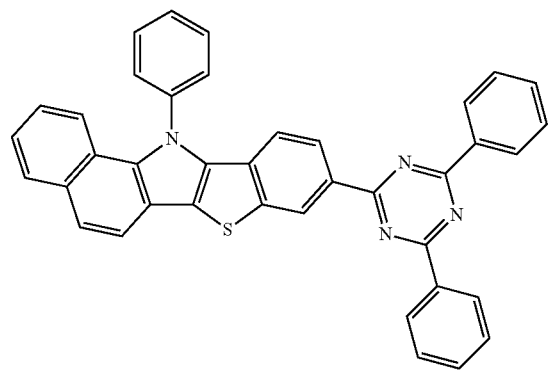
A-74
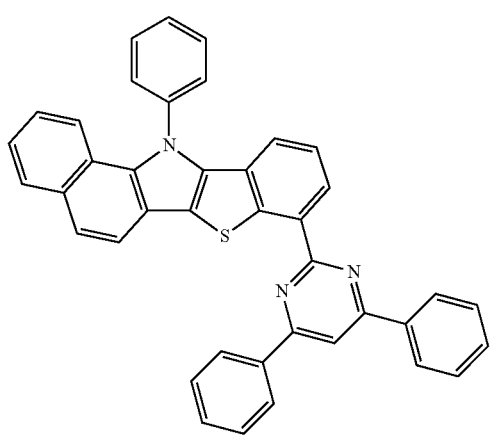
A-75
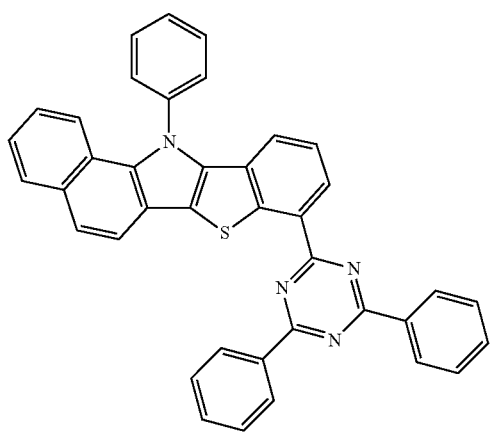
-continued
A-76
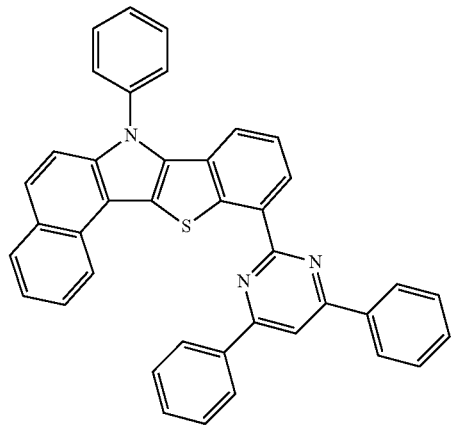
A-77
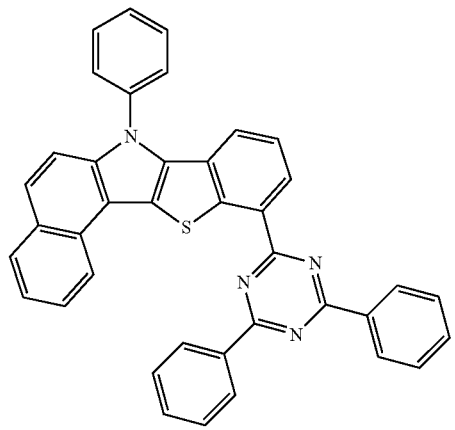
A-78
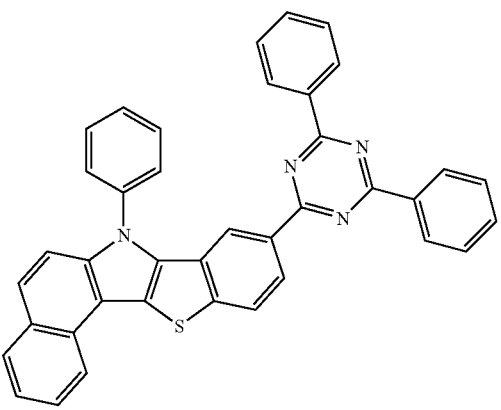

A-79
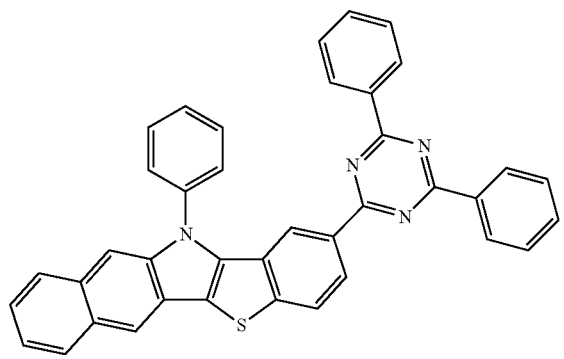
A-80
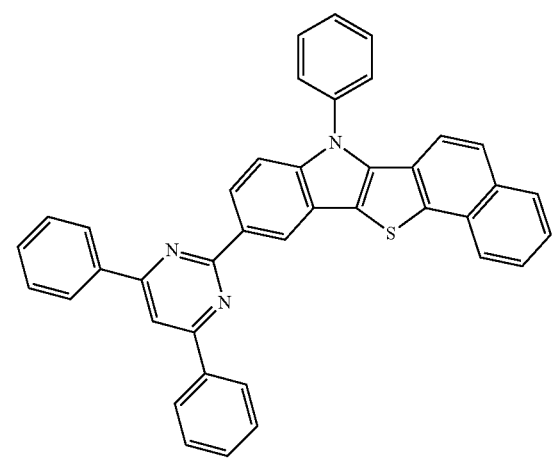
A-81
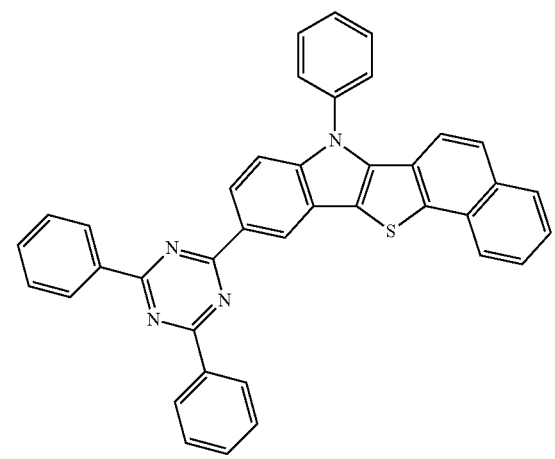
A-82
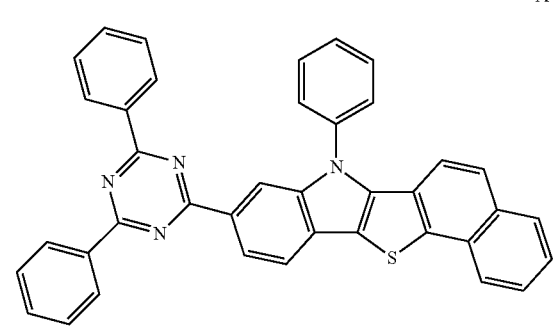
A-83
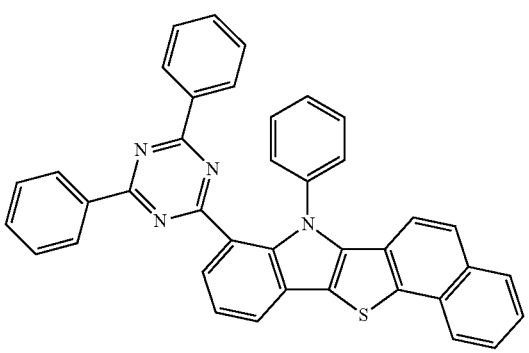
A-84
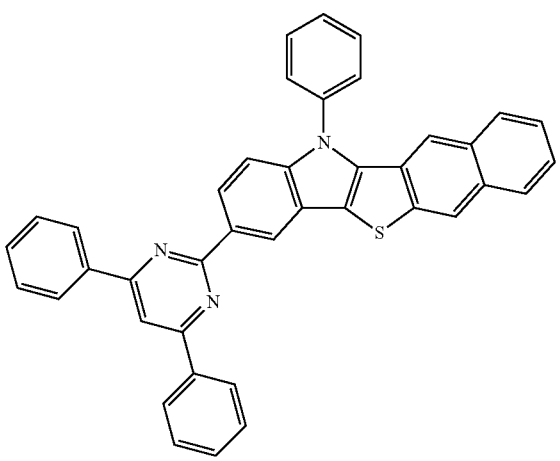
A-85
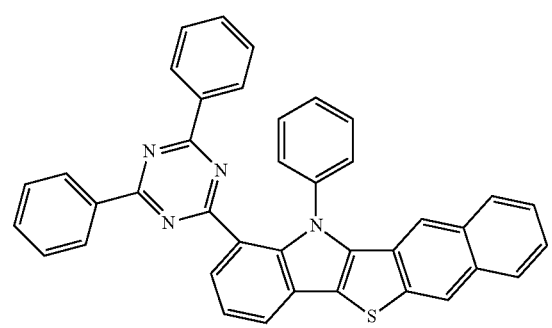
A-86
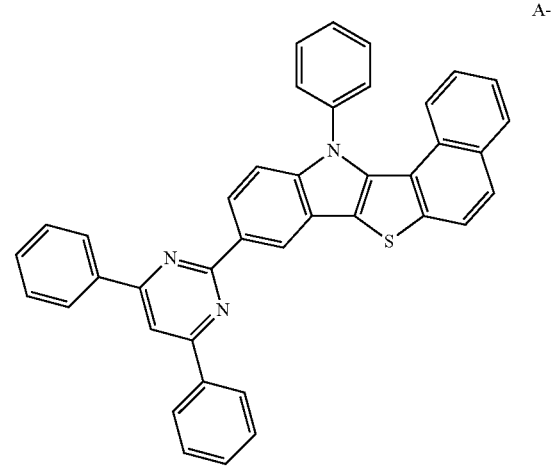

A-87
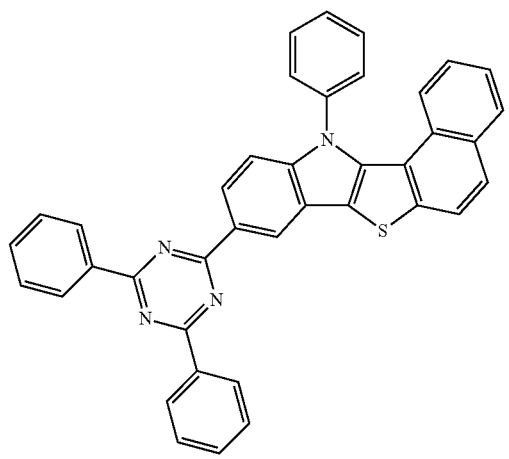
A-88
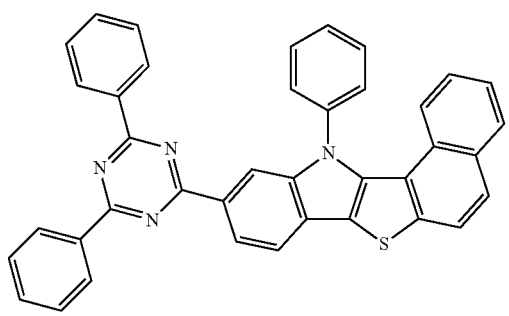
A-89
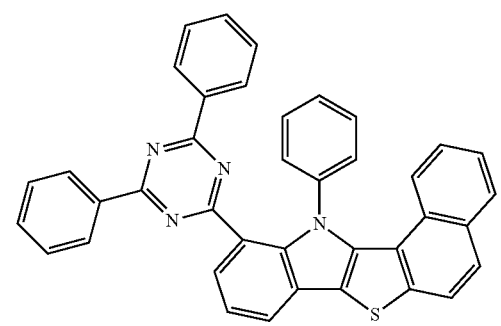
A-90
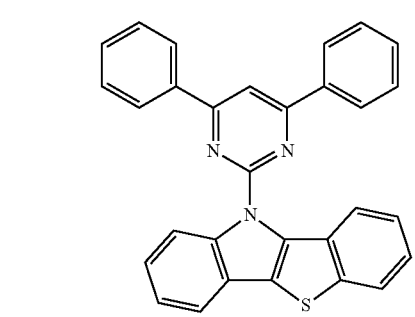
A-91
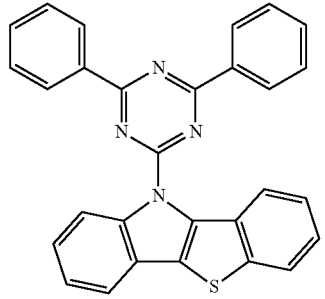
A-92
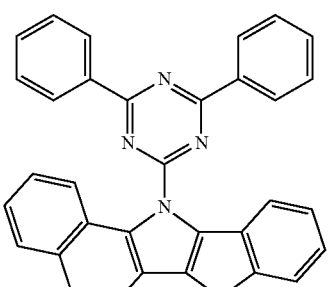
A-93
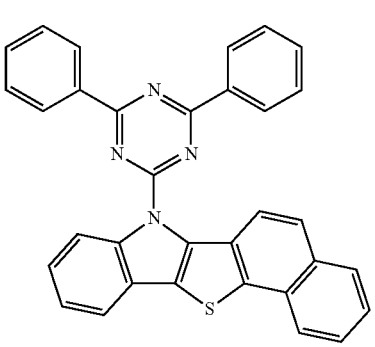
A-94
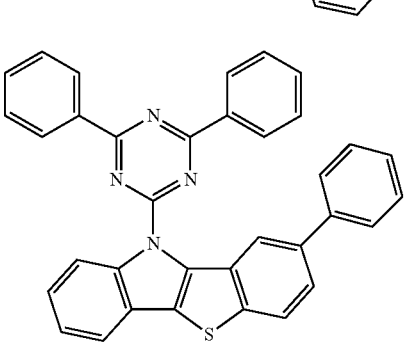
A-95
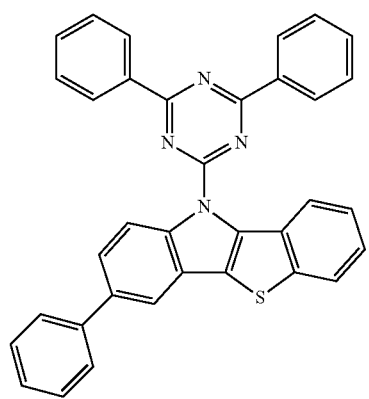

A-96
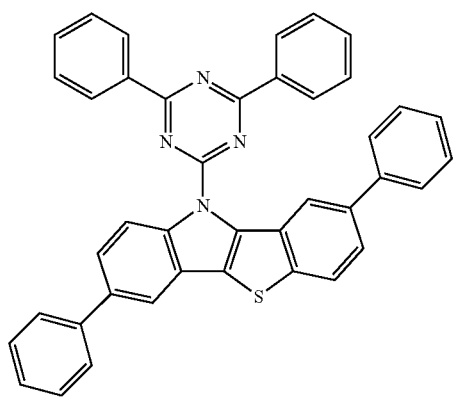
A-97
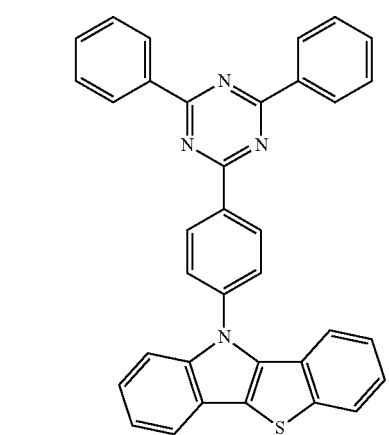
A-98
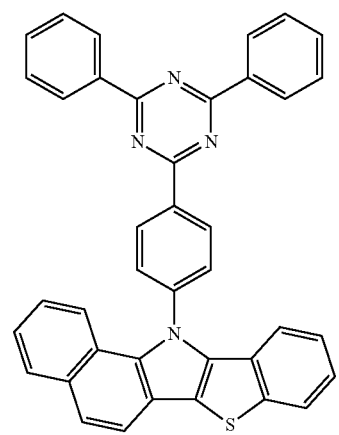
A-99
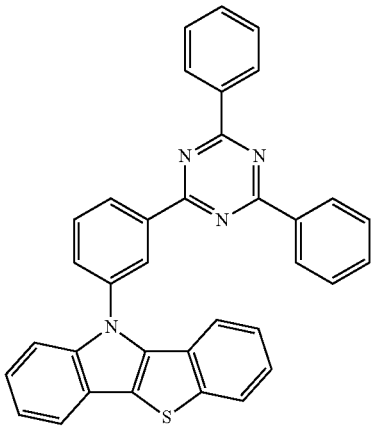
A-100
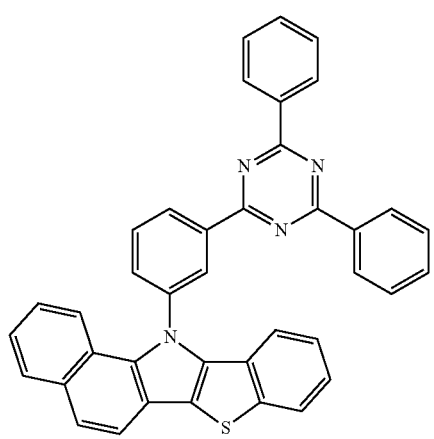
A-101
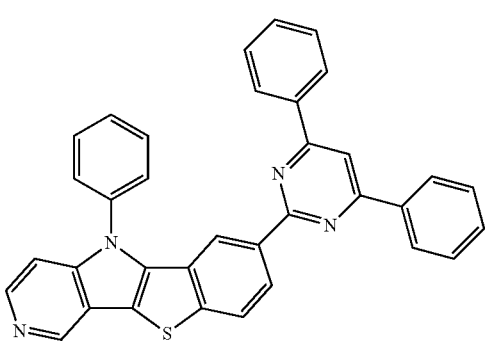
A-102
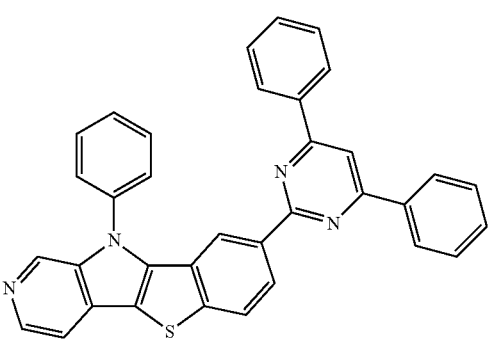

A-103
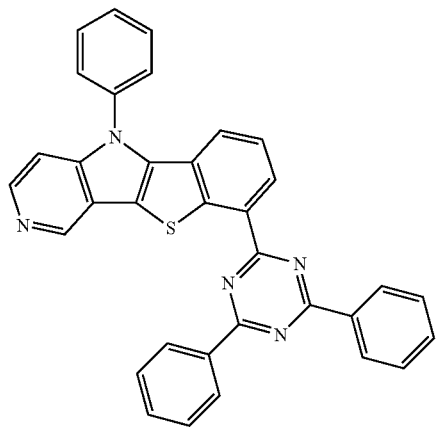
A-104
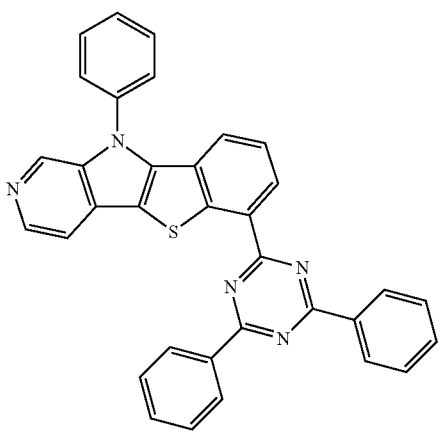
A-105
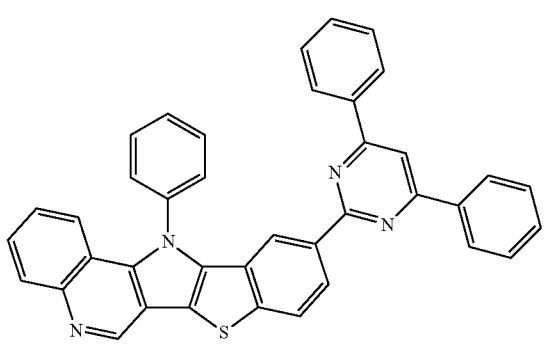
A-106
A-107
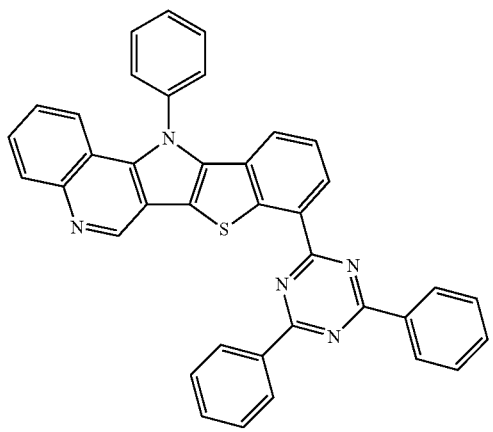
A-108
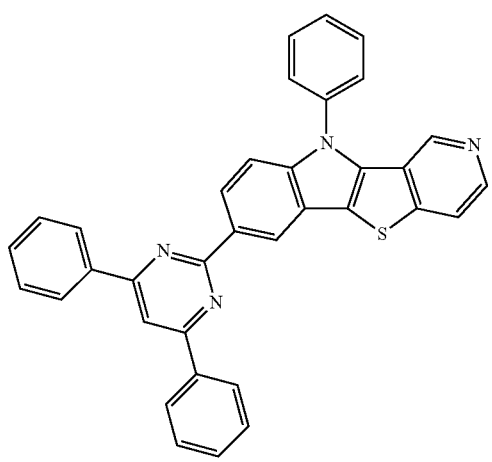
A-109
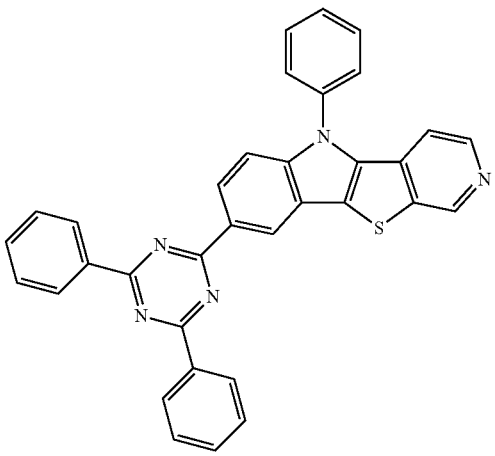

-continued
A-110
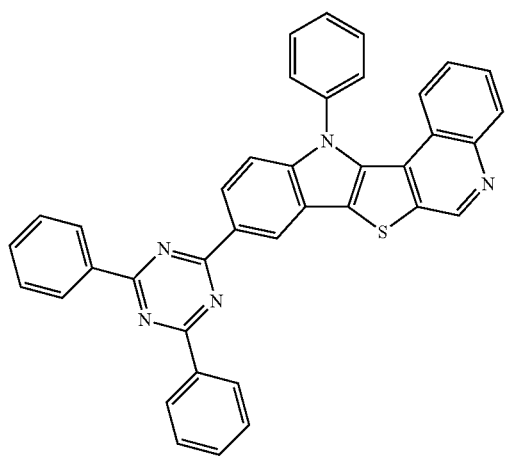
A-111
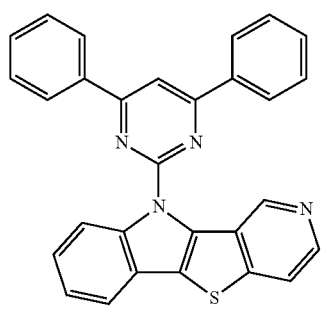
A-112
A-113
-continued
A-114
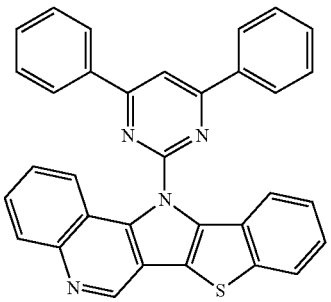
A-115
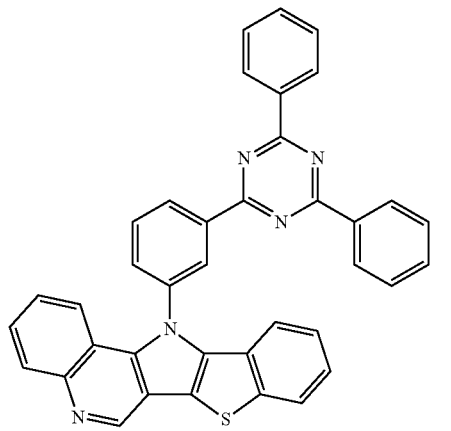
A-116
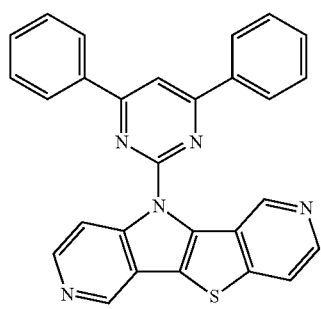
A-117
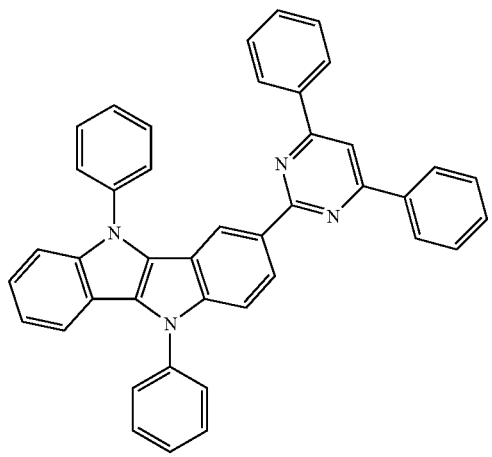

A-118
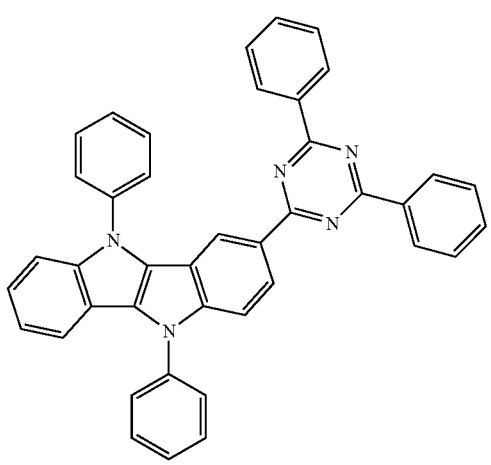
A-121
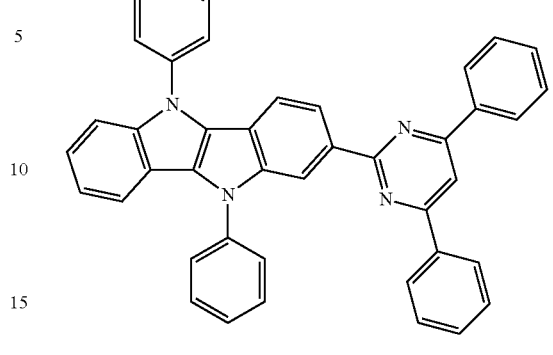
A-119
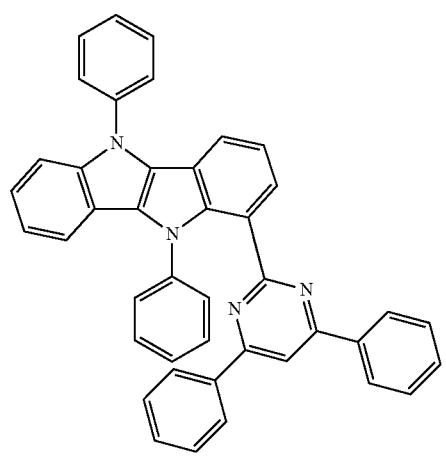
A-122
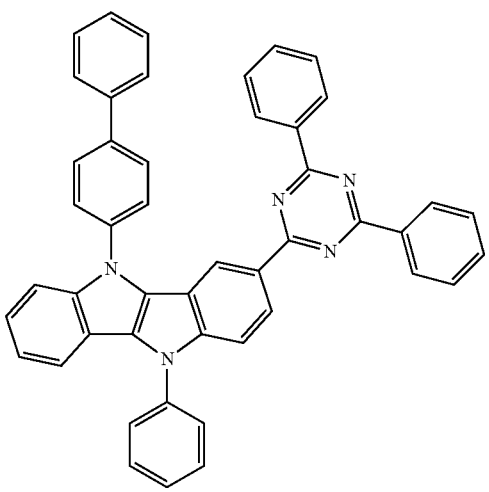
A-120
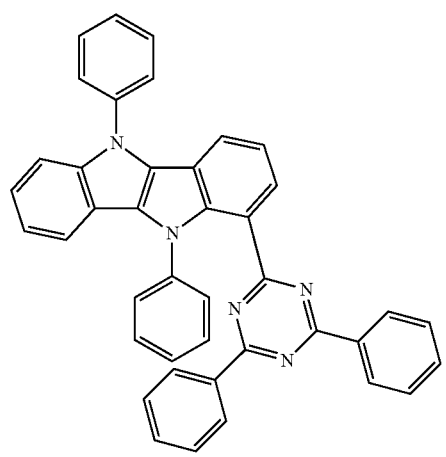
A-123
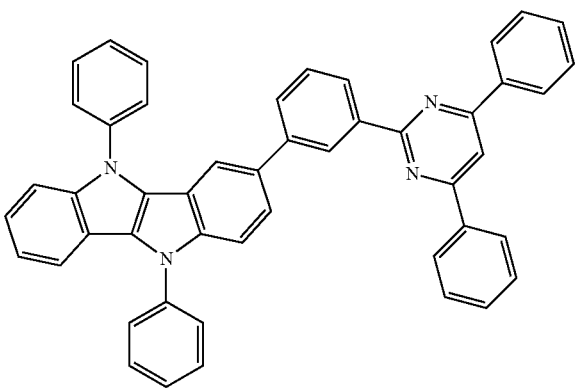

A-124
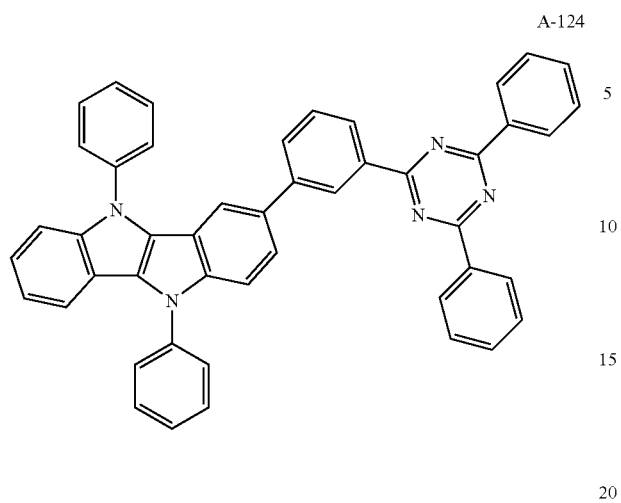
A-125
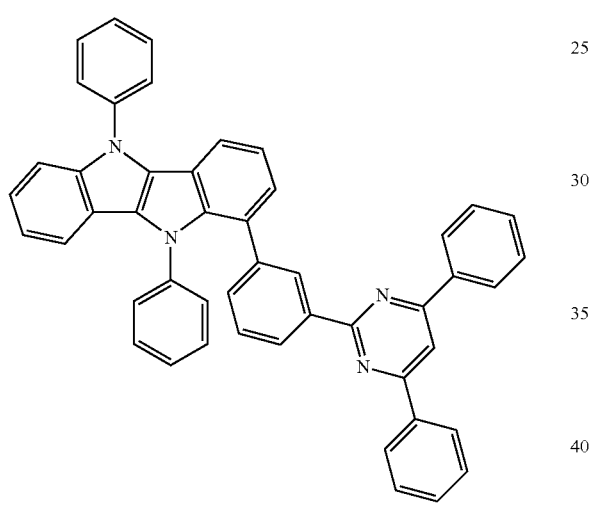
A-126
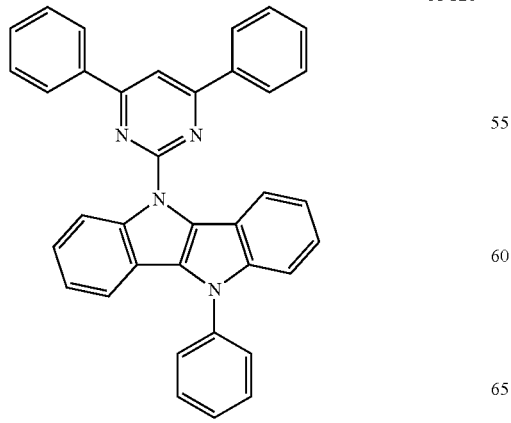
A-127
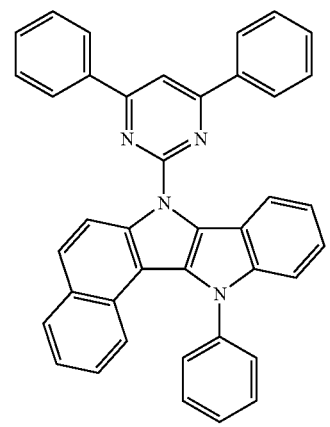
A-128
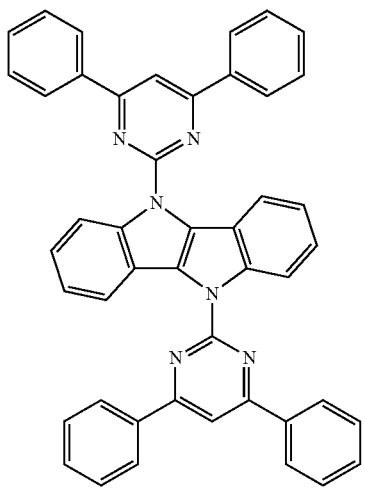
A-129
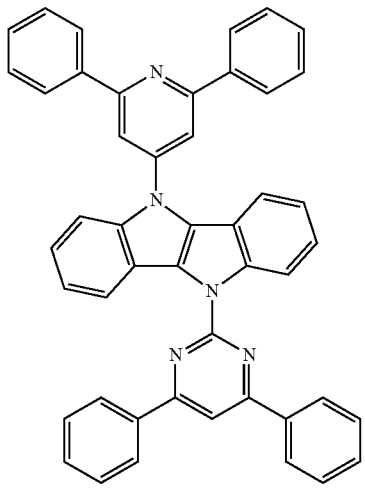

A-130 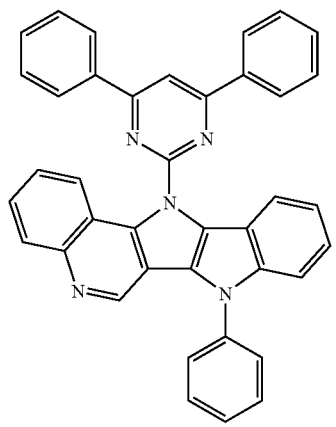
A-131 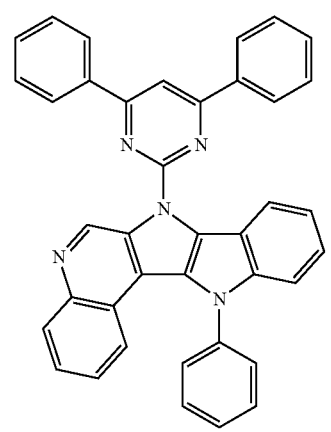
A-132 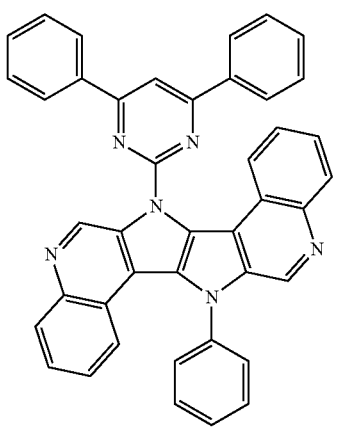
A-133 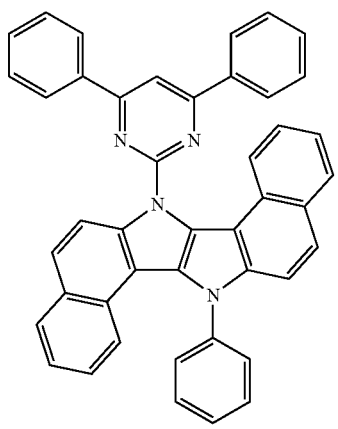
A-134 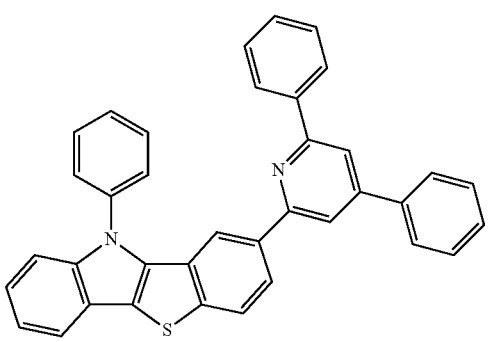
A-135 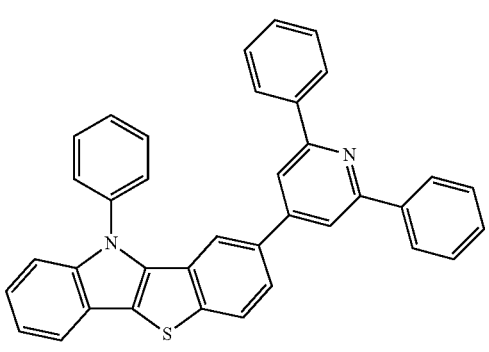
A-136 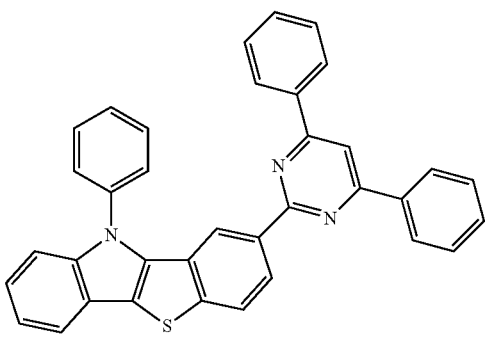

-continued
A-137
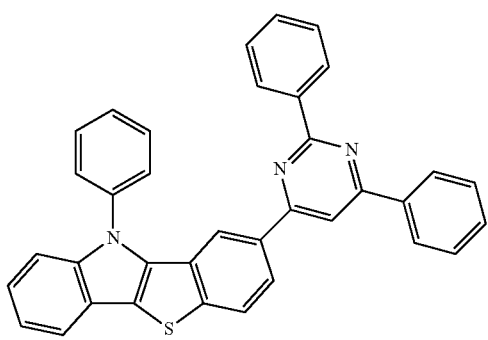
A-138
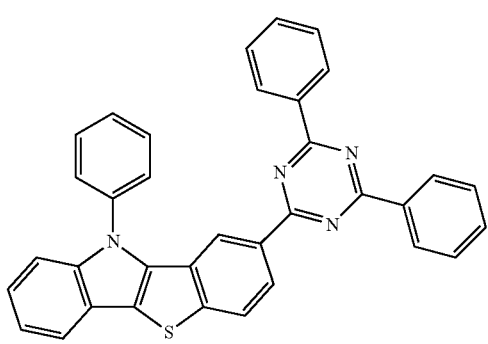
A-139
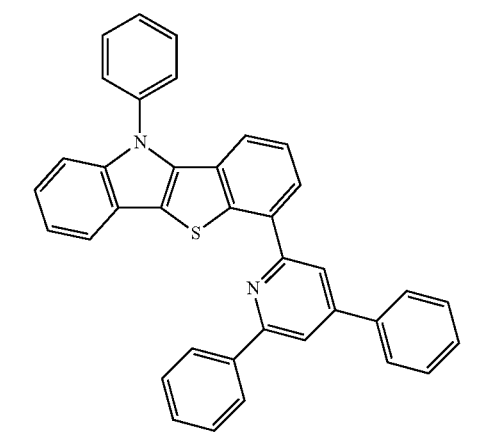
A-140
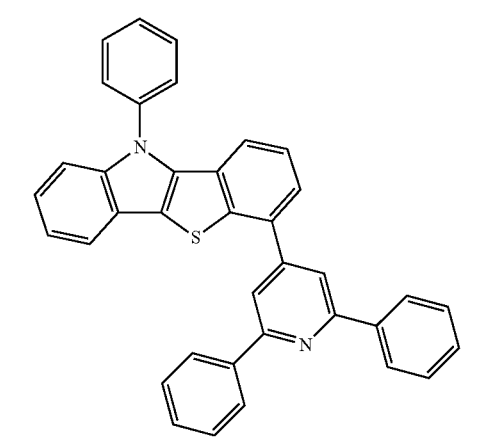
-continued
A-141
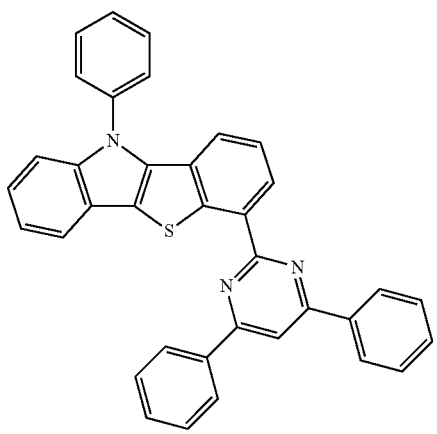
A-142
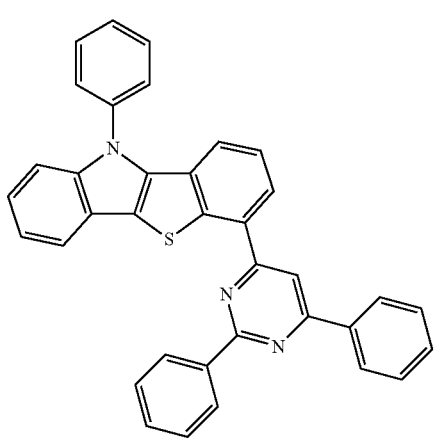
A-143
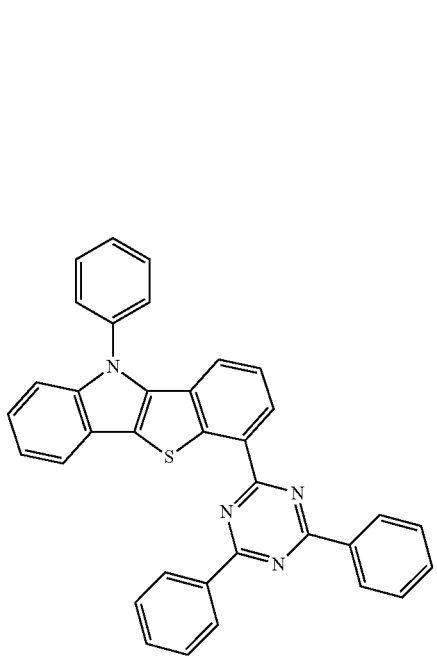

A-144
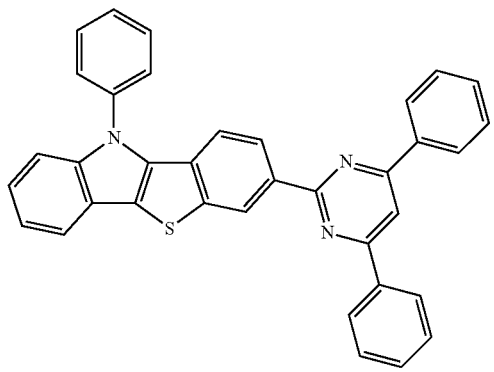
B-2
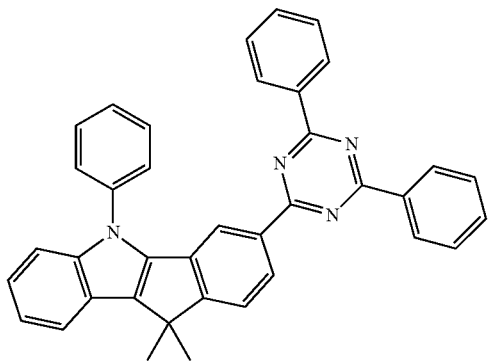
B-3
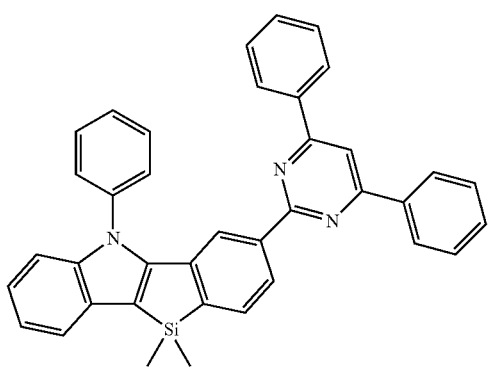
A-145
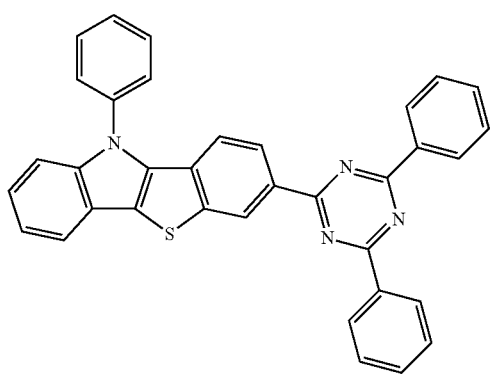
B-4
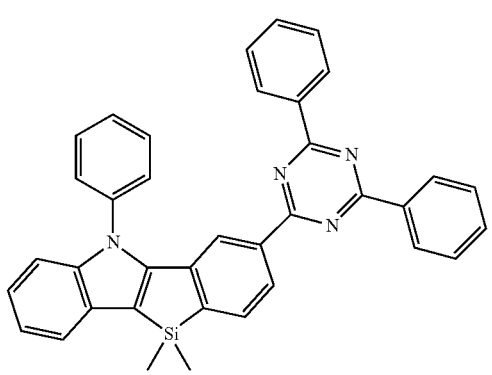
Other embodiments of the compound for an organic optoelectronic device may be represented by one of the following Chemical Formulae B-1 to B-72, but are not limited thereto.
B-1
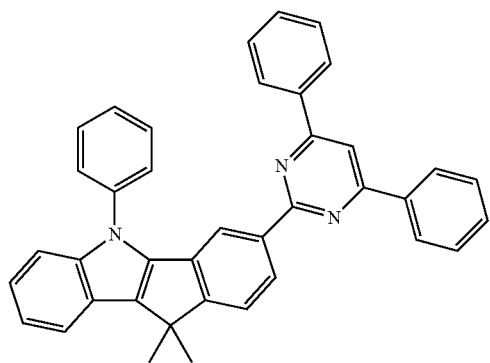
B-5
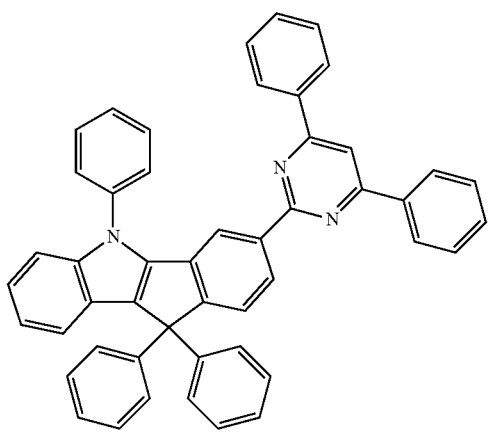

B-6
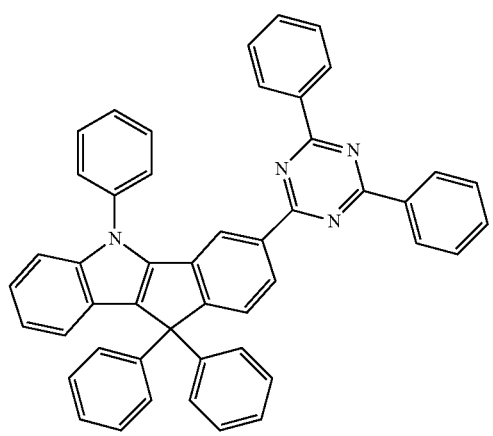
B-9
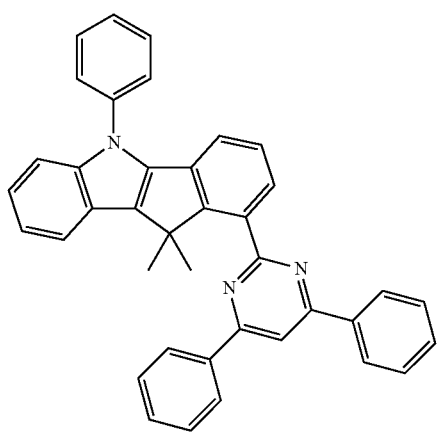
B-7
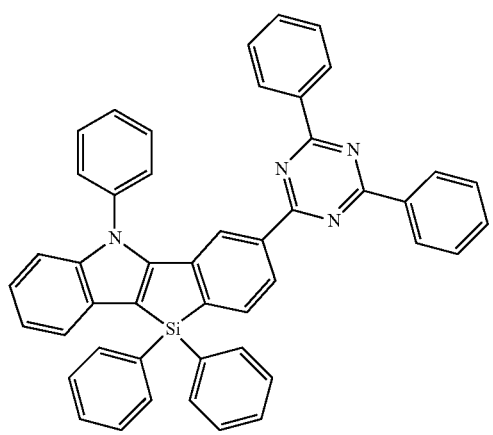
B-10
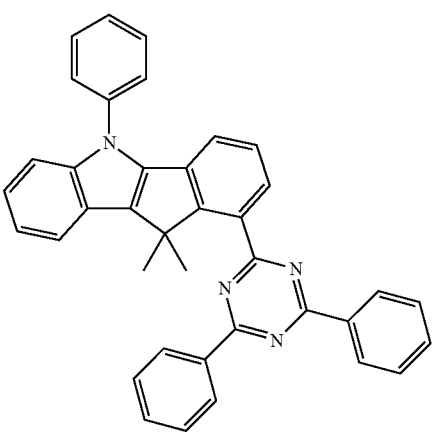
B-8
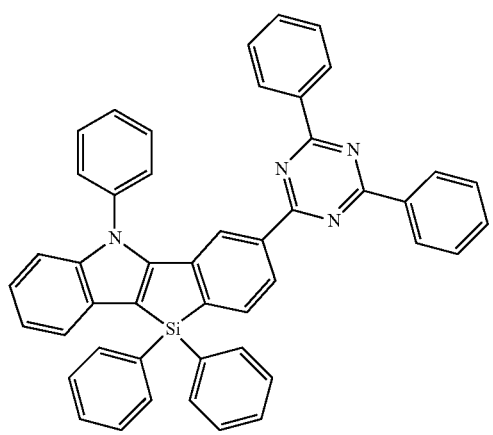
B-11
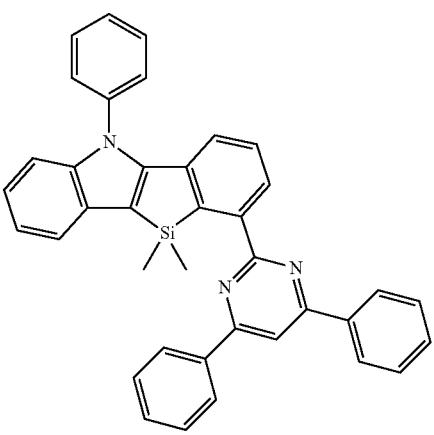

B-12
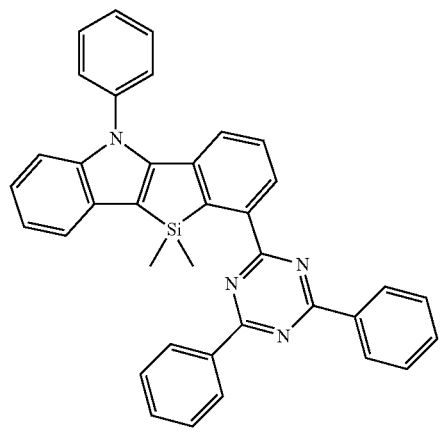
B-13
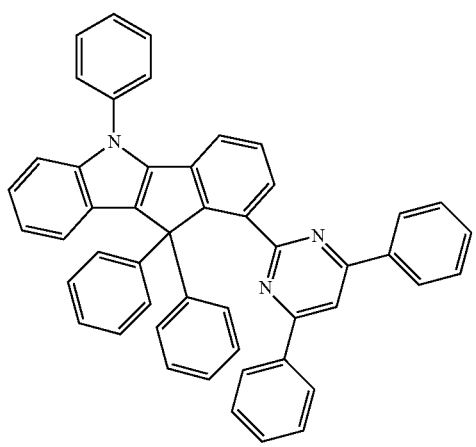
B-14
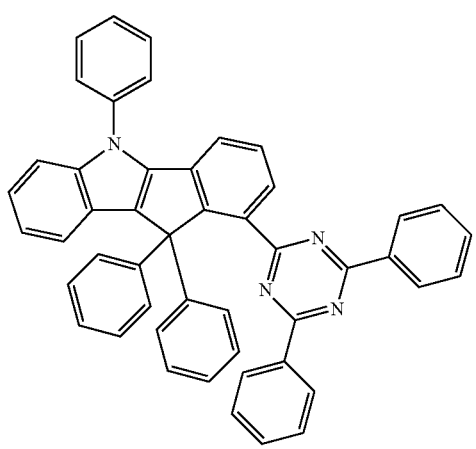
B-15
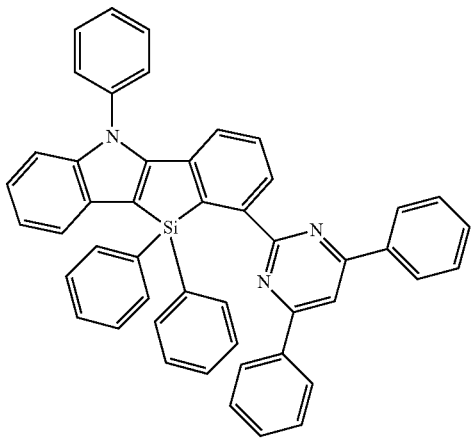
B-16
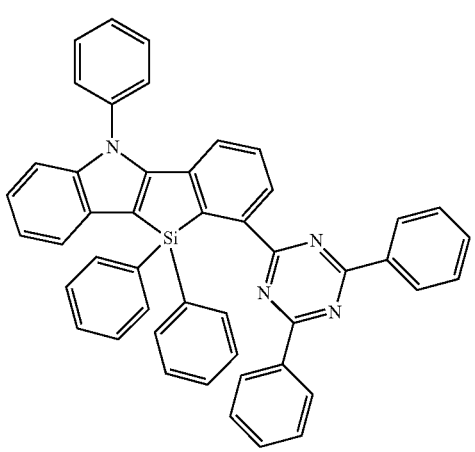
B-17
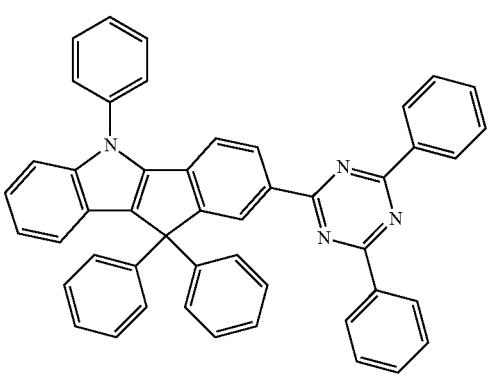
B-18
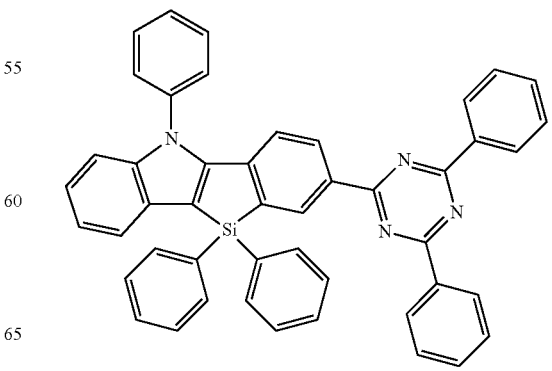

B-19
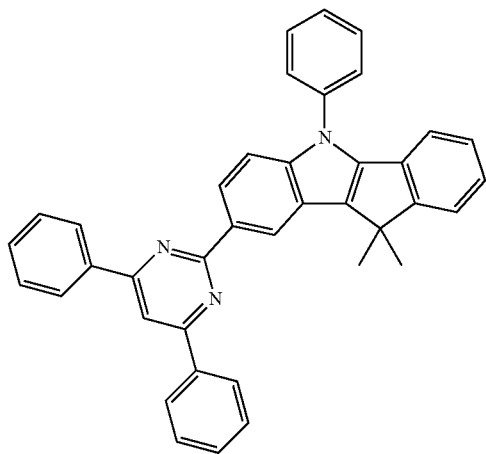
B-20
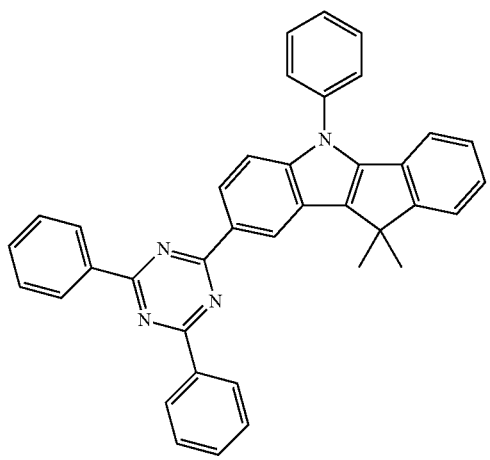
B-21
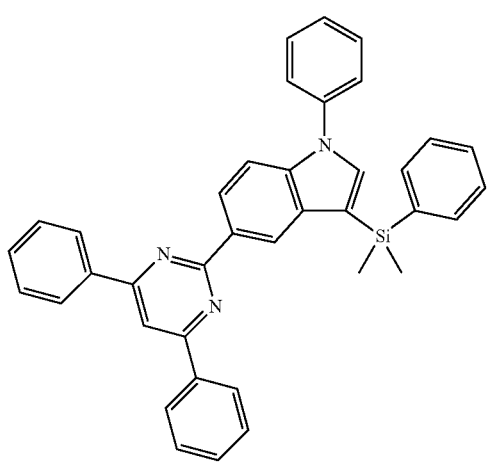
B-22
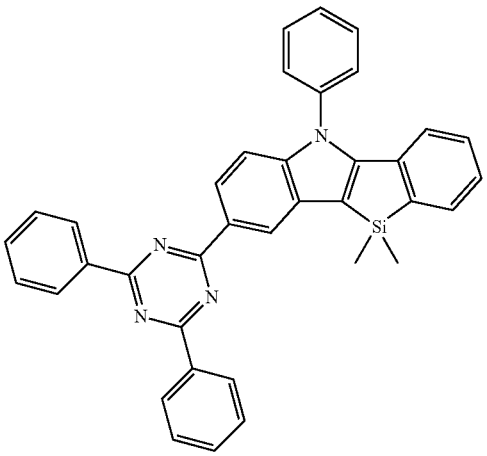
B-23
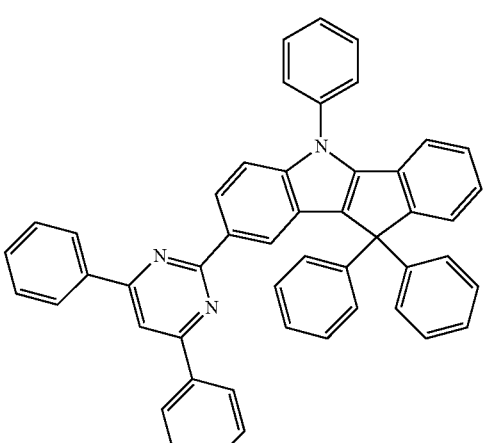
B-24
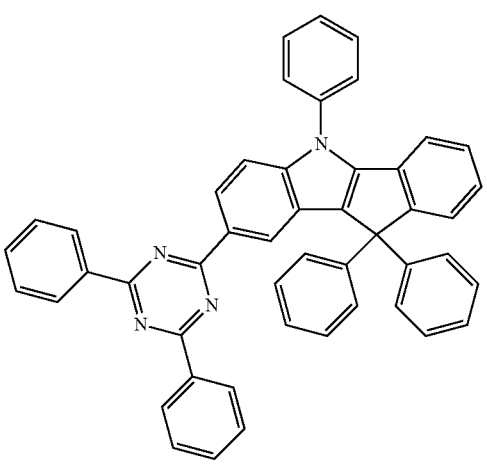

B-25
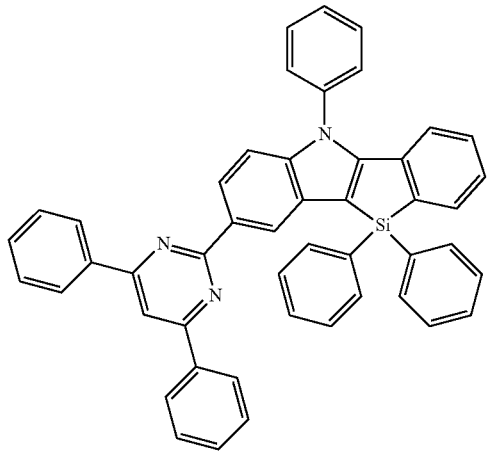
B-26
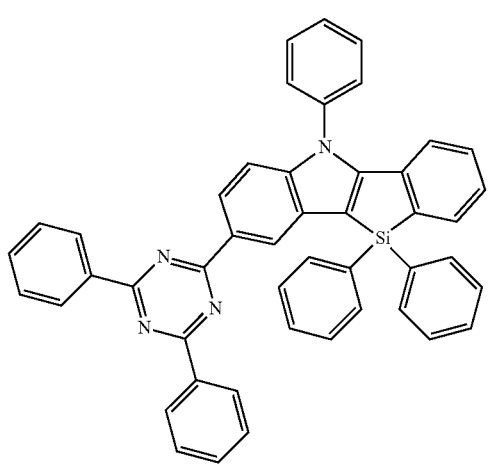
B-27
B-28
B-29
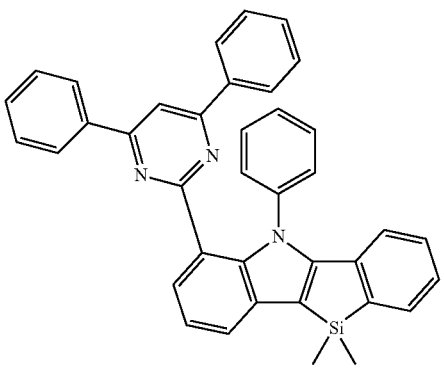
B-30
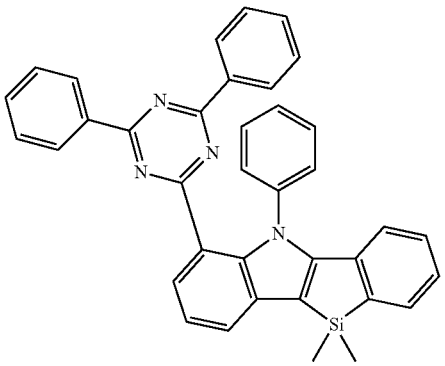
B-31
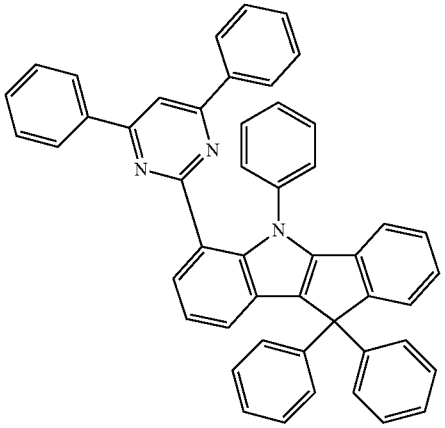
B-32
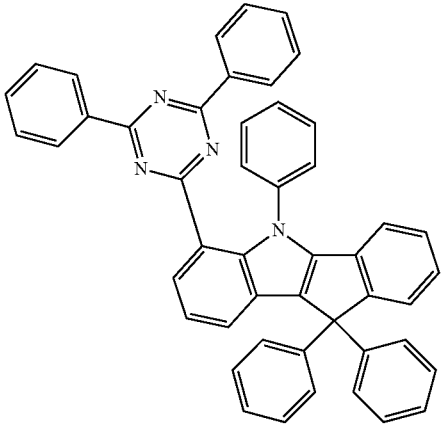

B-33 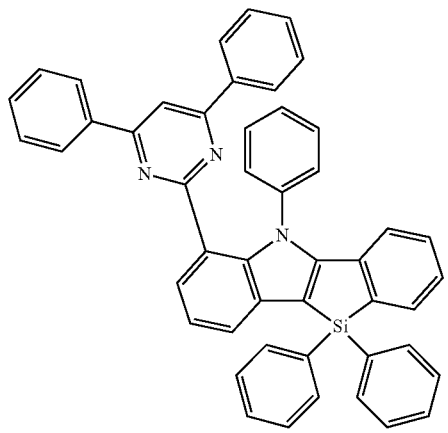
B-34 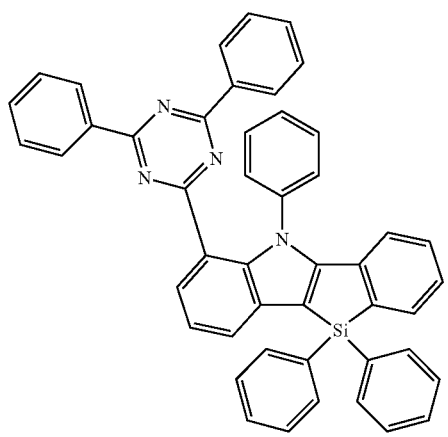
B-35 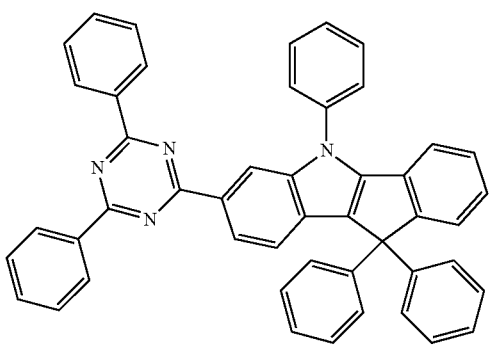
B-36 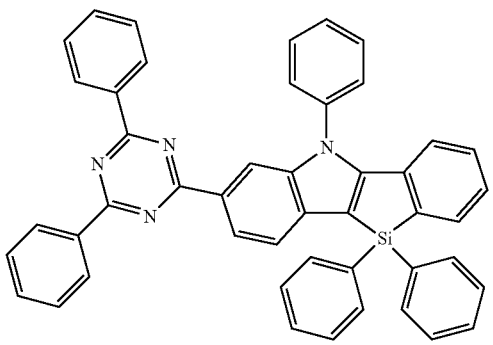
B-37 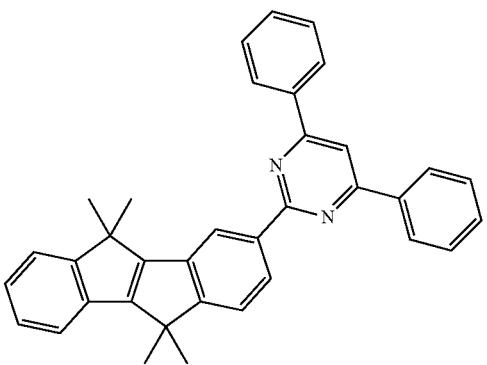
B-38 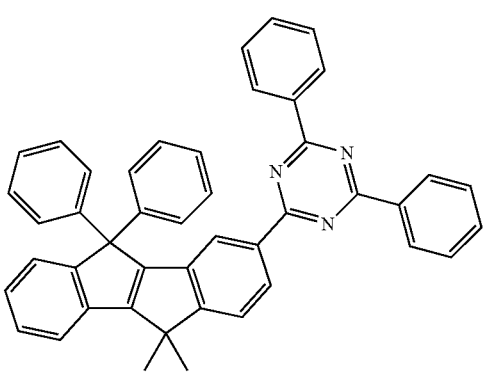
B-39 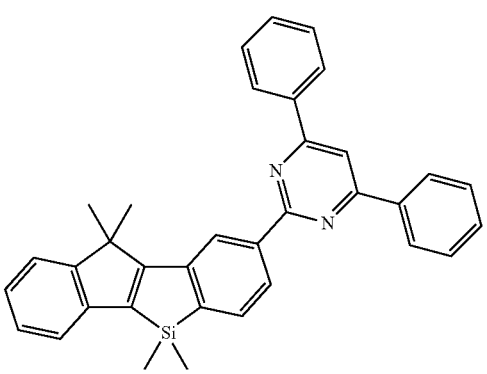
B-40 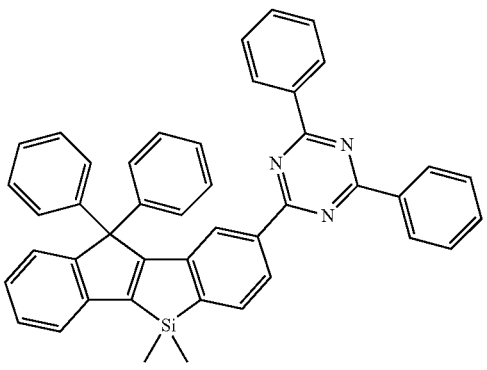

B-41
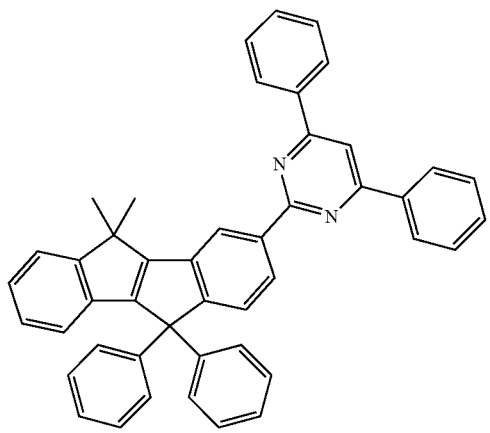
B-42
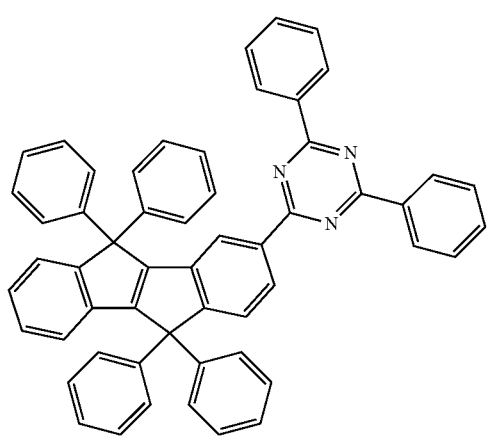
B-43
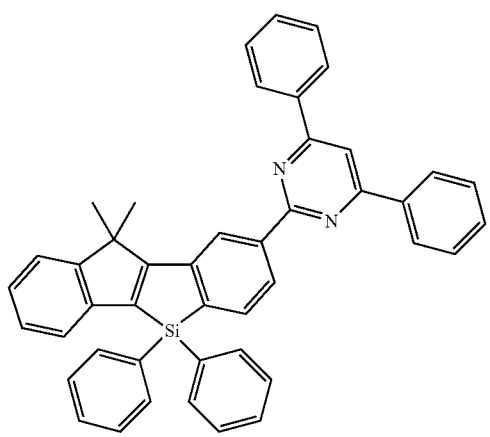
B-44
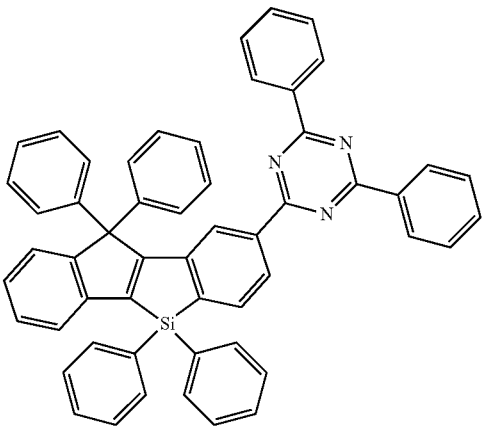
B-45
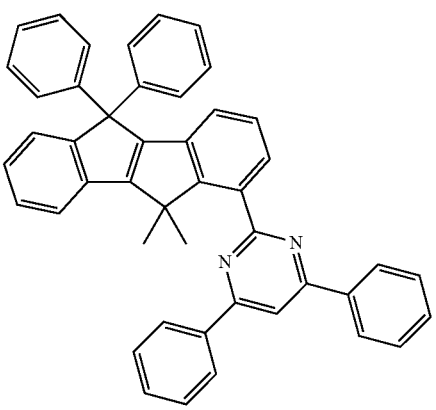
B-46
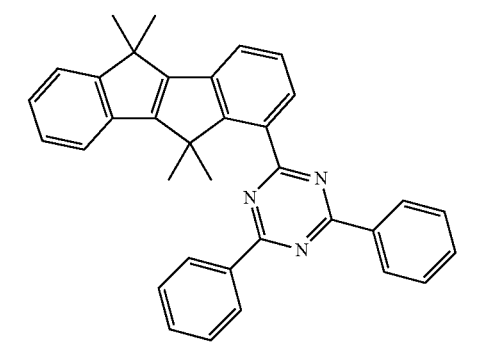
B-47
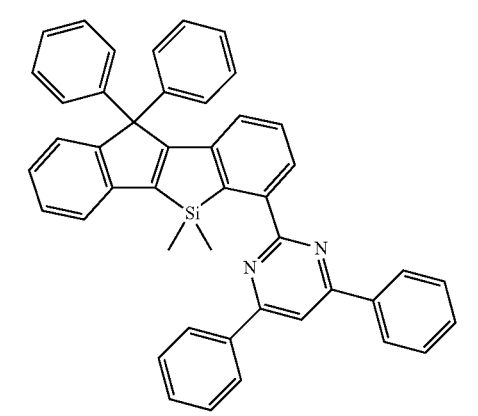

B-48 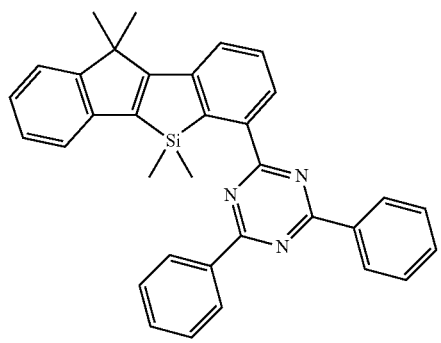
B-49 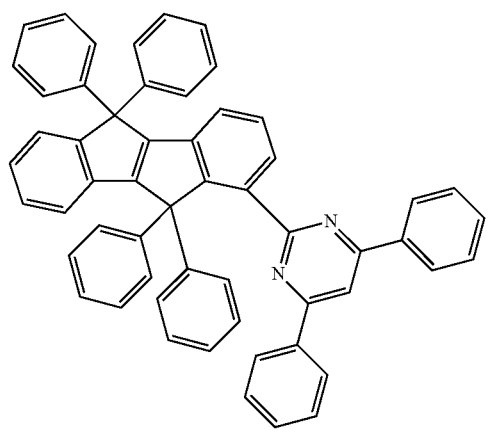
B-50 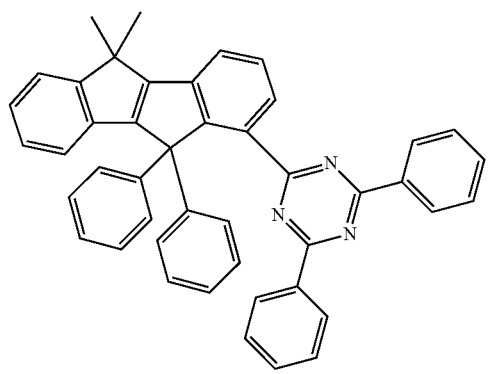
B-51 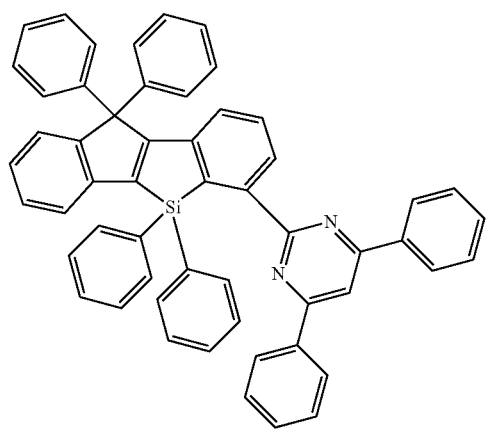
B-52 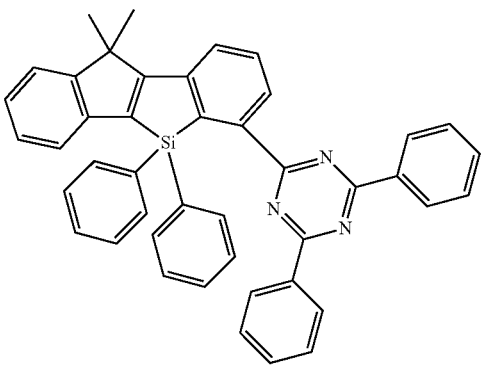
B-53 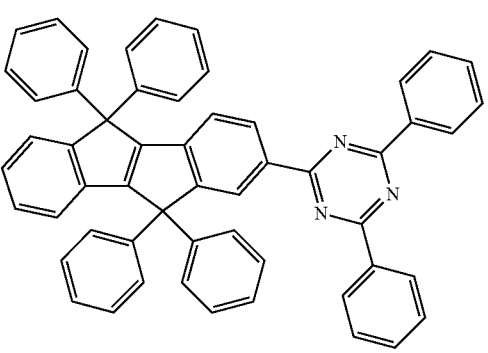
B-54 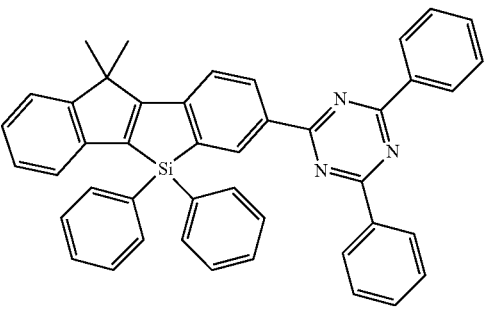
B-55 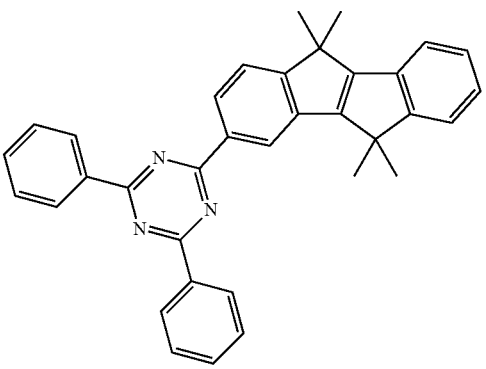

B-56 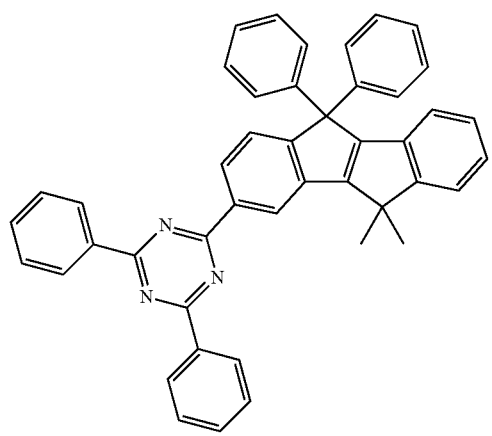
B-57 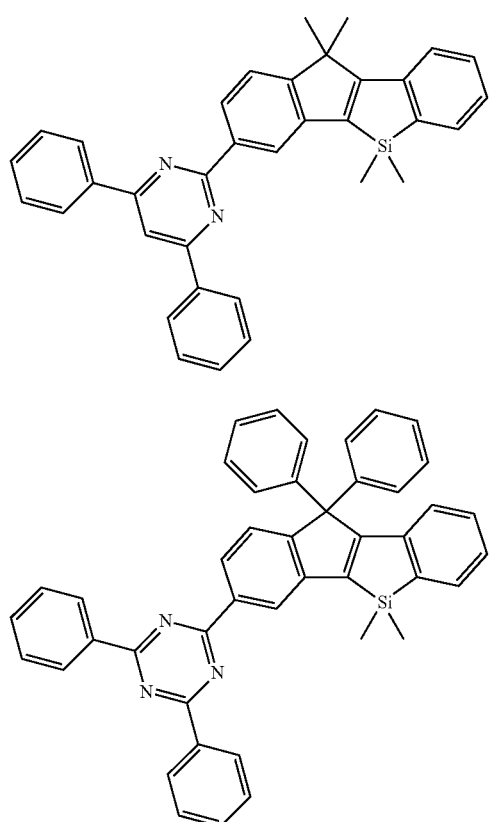
B-58 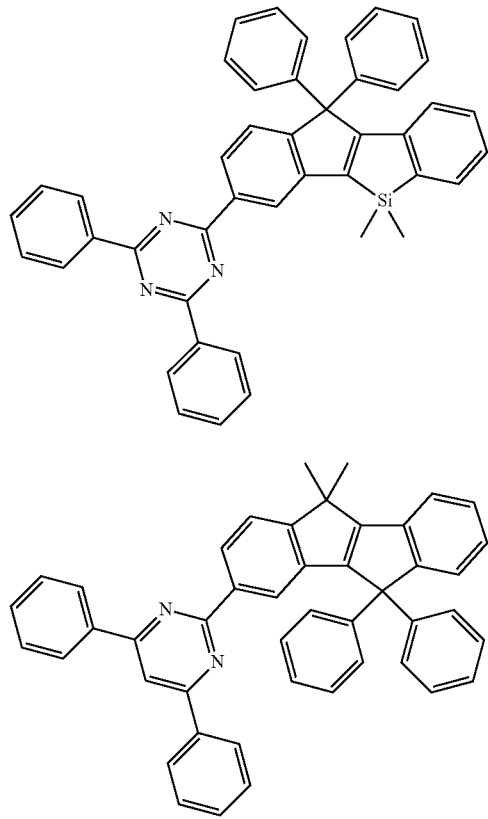
B-59 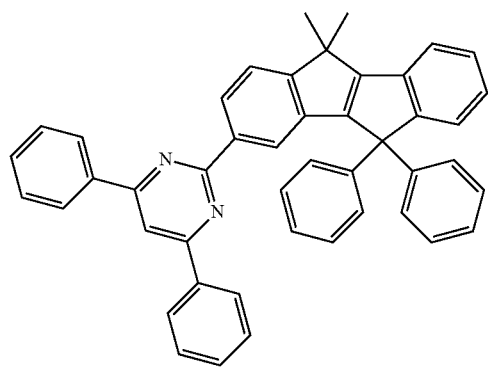
B-60 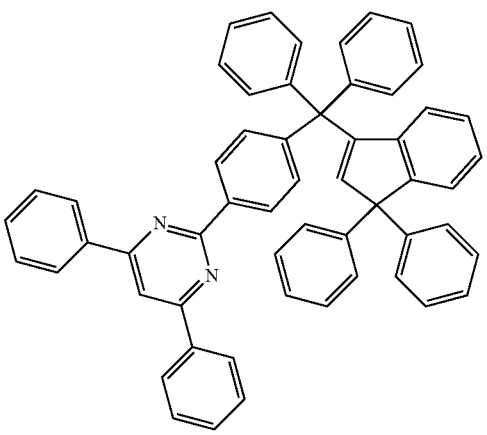
B-61 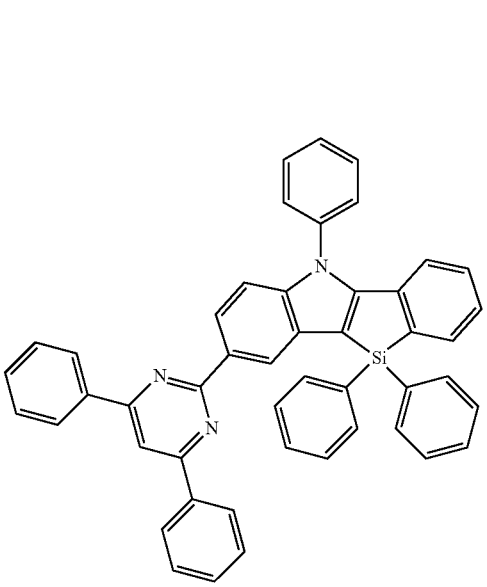
B-62 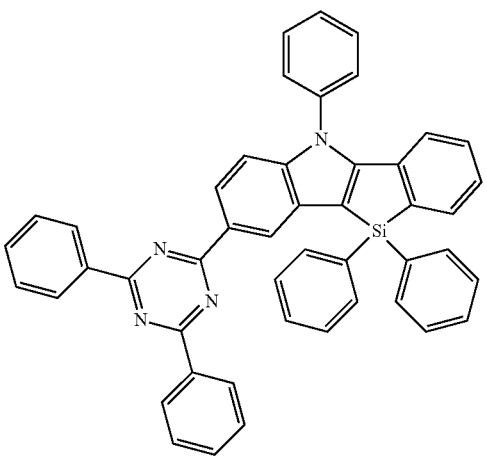

B-63
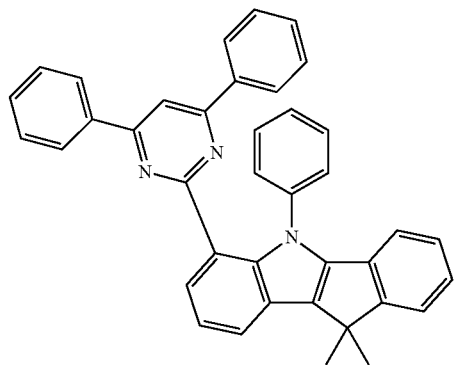
B-64
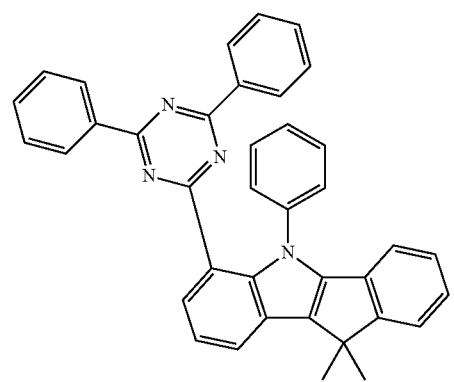
B-65
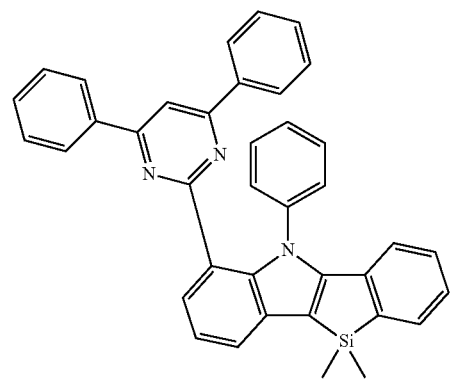
B-66
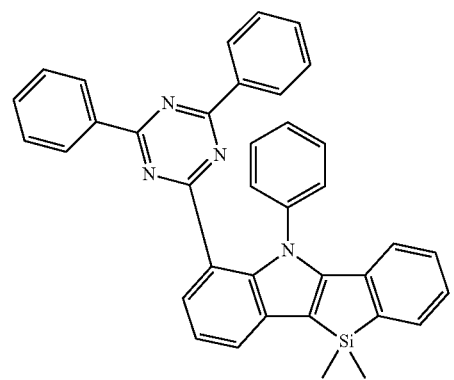
B-67
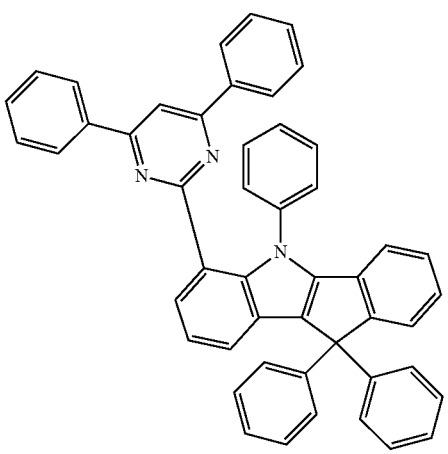
B-68
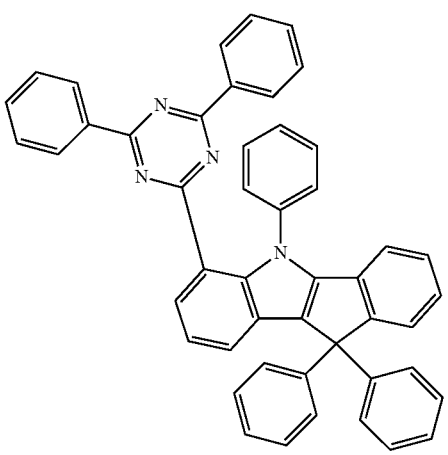
B-69
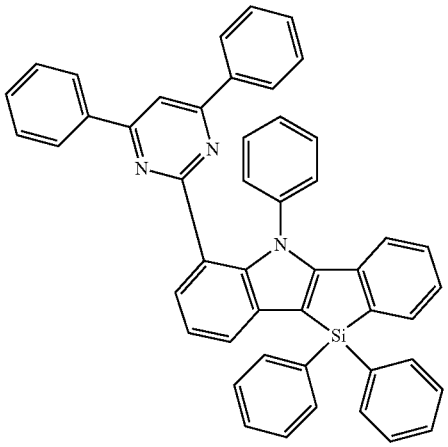

-continued

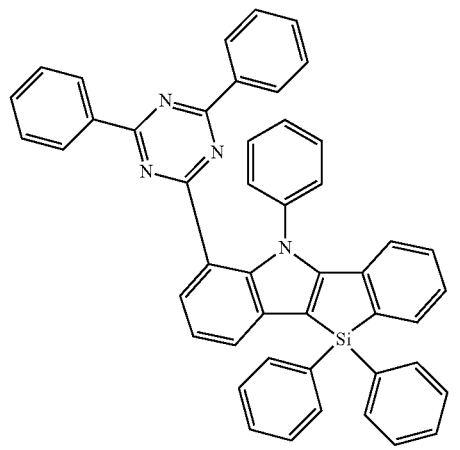
B-70

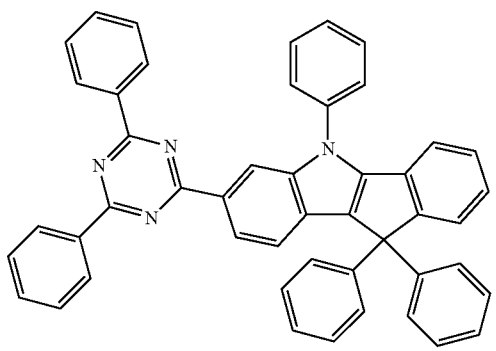
B-71

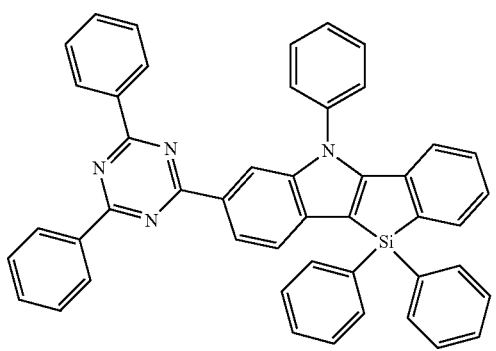
B-72

According to the embodiment, the compound includes a functional group having the electron properties when both electron and hole properties are required, and thus may effectively improve the life-span of an organic light emitting diode and decrease a driving voltage thereof.

The compound for an organic optoelectronic device has a maximum light emitting wavelength in a range of about 320 to about 500 nanometers ("nm") and a triplet excited energy ("T1") ranging from greater than or equal to about 2.0 electronovolt ("eV"), for example, from about 2.0 to about 4.0 eV, and thus may transport well a host charge having high triplet excited energy to a dopant, increase luminous efficiency of the dopant, and has freely adjusted HOMO and LUMO energy levels and decreases a driving voltage. Accordingly, it may be usefully applied as a host material or a charge transport material.

In addition, the compound for an organic optoelectronic device has photoactive and electrical activities, and thus may be usefully applied for a nonlinear optic material, an electrode material, a discolored material, a light switch, a sensor, a module, a wave guide, an organic transistor, a laser, a light absorbent, a dielectric material, a separating membrane, and the like.

The compound for an organic optoelectronic device including the above compounds has a glass transition temperature of greater than or equal to 90° C. and a thermal decomposition temperature of greater than or equal to 400° C., indicating improved thermal stability. Thereby, it is possible to produce an organic optoelectronic device having high efficiency.

The compound for an organic optoelectronic device including the above compounds may play a role of emitting light or injecting and/or transporting electrons, and may also act as a light emitting host with an appropriate dopant. In other words, the compound for an organic optoelectronic device may be used as a phosphorescent or fluorescent host material, a blue light emitting dopant material, or an electron transporting material.

The compound for an organic optoelectronic device according to an embodiment is used for an organic thin layer, and may improve the life-span characteristic, efficiency characteristic, electrochemical stability, and thermal stability of an organic photoelectric device, and decrease the driving voltage of the organic optoelectronic device.

Further, according to another embodiment, an organic optoelectronic device that includes the compound for an organic optoelectronic device is provided. The organic optoelectronic device may include an organic photoelectric device, an organic light emitting diode, an organic solar cell, an organic transistor, an organic photoconductor drum, an organic memory device, and the like. For example, the compound for an organic optoelectronic device according to an embodiment may be included in an electrode or an electrode buffer layer in an organic solar cell to improve quantum efficiency of the electrode or the electrode buffer layer. It may also be used as an electrode material for a gate, a source-drain electrode, or the like in the organic transistor.

Hereinafter, an organic light emitting diode is described. According to another embodiment, an organic light emitting diode includes
an anode,
a cathode, and
at least one organic thin layer disposed between the anode and the cathode,
wherein the at least one organic thin layer may include the compound for an organic optoelectronic device according to an embodiment. In an embodiment, the organic thin layer may have a thickness of about 5 nanometer to about 1 millimeter, or about 10 nanometers to about 100 micrometers, or about 10 nanometers to about 10 micrometers, or about 100 nanometer to about 1 micrometer.

The organic thin layer that may include the compound for an organic optoelectronic device may include an emission layer, a hole transport layer ("HTL"), a hole injection layer ("HIL"), an electron transport layer ("ETL"), an electron injection layer ("EIL"), a hole blocking layer, and a combination thereof. The at least one layer includes the compound for an organic optoelectronic device according to an embodiment. Particularly, the compound for an organic optoelectronic device according to an embodiment may be included in a hole transport layer ("HTL") or a hole injection layer ("HIL"). In addition, when the compound for an organic optoelectronic device is included in the emission layer, the compound for an organic optoelectronic device may be included as a phosphorescent or fluorescent host, for example, as a fluorescent blue dopant material.

FIGS. 1 to 5 are cross-sectional views showing organic light emitting diodes including the compound for an organic optoelectronic device according to an embodiment.

Referring to FIGS. 1 to 5, organic light emitting diodes 100, 200, 300, 400, and 500 according to an embodiment include at least one organic thin layer 105 interposed between an anode 120 and a cathode 110.

The anode 120 includes an anode material having a large work function to help hole injection into an organic thin layer. The anode material includes: a metal such as nickel (Ni), platinum (Pt), vanadium (V), chromium (Cr), copper (Cu), zinc (Zn), and gold (Au), or alloys thereof; a metal oxide such as zinc oxide, indium oxide, indium tin oxide ("ITO"), and indium zinc oxide ("IZO"); a combination of a metal and an oxide such as $ZnO:Al$ and $SnO_2:Sb$; or a conductive polymer such as poly(3-methylthiophene), poly(3,4-(ethylene-1,2-dioxy)thiophene) ("PEDT"), polypyrrole, and polyaniline, but is not limited thereto. In an embodiment, the transparent electrode may include indium tin oxide ("ITO") as an anode.

The cathode 110 includes a cathode material having a small work function to help electron injection into an organic thin layer. The cathode material includes: a metal such as magnesium, calcium, sodium, potassium, titanium, indium, yttrium, lithium, gadolinium, aluminum, silver, tin, and lead, or alloys thereof; or a multi-layered material such as LiF/Al, Liq/Al, $LiO_2$/Al, LiF/Ca, and $BaF_2$/Ca, but is not limited thereto. In one embodiment, a metal electrode may include aluminum as a cathode.

Referring to FIG. 1, the organic photoelectric device 100 includes an organic thin layer 105 including only an emission layer 130.

Figure 2:
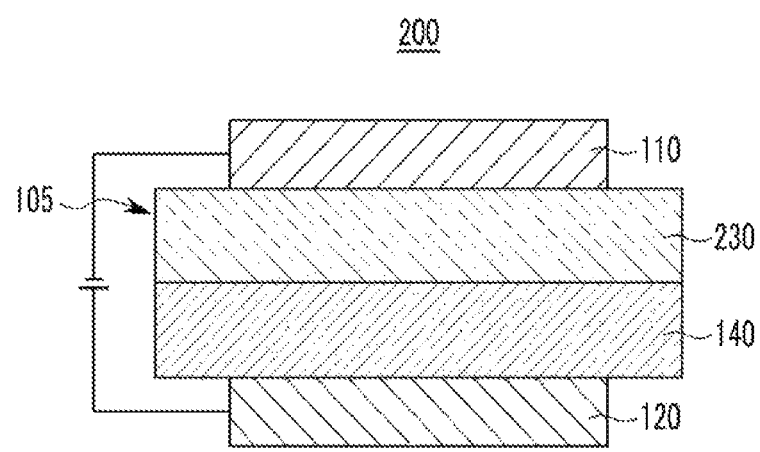

Referring to FIG. 2, a double-layered organic photoelectric device 200 includes an organic thin layer 105 including an emission layer 230 including an electron transport layer ("ETL"), and a hole transport layer ("HTL") 140. As shown in FIG. 2, the organic thin layer 105 includes a double layer of the emission layer 230 and the hole transport layer ("HTL") 140. The emission layer 130 also functions as an electron transport layer ("ETL"), and the hole transport layer ("HTL") 140 layer has an excellent binding property with a transparent electrode such as ITO or an excellent hole transport capability.

Figure 3:
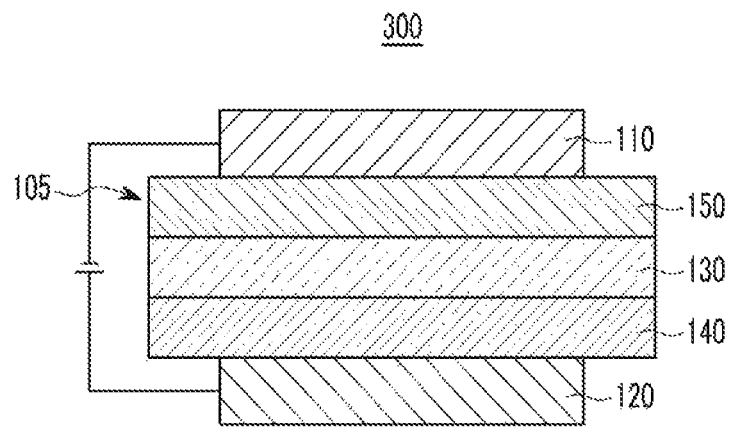

Referring to FIG. 3, a three-layered organic photoelectric device 300 includes an organic thin layer 105 including an electron transport layer ("ETL") 150, an emission layer 130, and a hole transport layer ("HTL") 140. The emission layer 130 is independently installed, and layers having an excellent electron transporting capability or an excellent hole transport capability are separately stacked.

Figure 4:
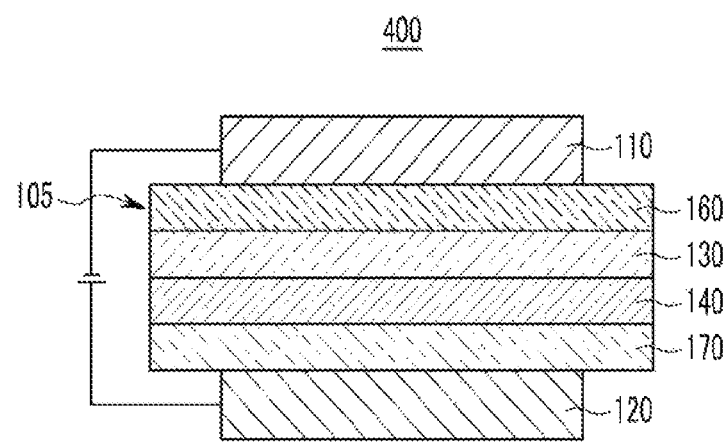

As shown in FIG. 4, a four-layered organic photoelectric device 400 includes an organic thin layer 105 including an electron injection layer ("EIL") 160, an emission layer 130, a hole transport layer ("HTL") 140, and a hole injection layer ("HIL") 170 for adherence with the cathode of ITO.

Figure 5:
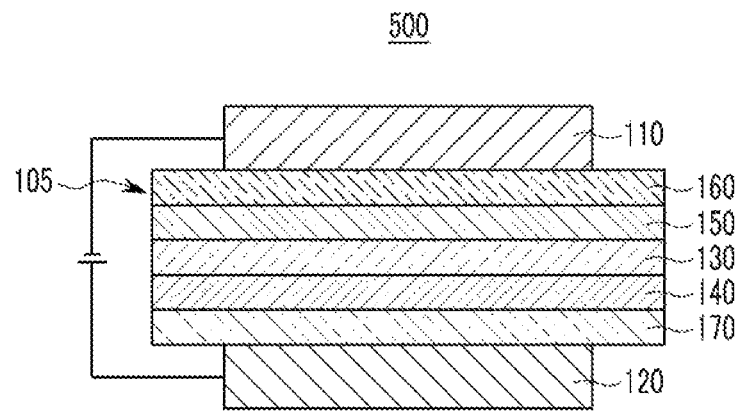

As shown in FIG. 5, a five-layered organic photoelectric device 500 includes an organic thin layer 105 including an electron transport layer ("ETL") 150, an emission layer 130, a hole transport layer ("HTL") 140, and a hole injection layer ("HIL") 170, and further includes an electron injection layer ("EIL") 160 to achieve a low voltage.

In FIGS. 1 to 5, the organic thin layer 105 including at least one of an electron transport layer ("ETL") 150, an electron injection layer ("EIL") 160, emission layers 130 and 230, a hole transport layer ("HTL") 140, a hole injection layer ("HIL") 170, and combinations thereof includes a compound for an organic optoelectronic device. The compound for an organic optoelectronic device may be used for an electron transport layer ("ETL") 150 including the electron transport layer ("ETL") 150 or electron injection layer ("EIL") 160. When it is used for the electron transport layer ("ETL"), it is possible to provide an organic photoelectric device having a more simple structure because it does not require an additional hole blocking layer (not shown).

Furthermore, when the compound for an organic photoelectric device is included in the emission layers 130 and 230, the material for the organic photoelectric device may be included as a phosphorescent or fluorescent host or a fluorescent blue dopant.

The organic light emitting diode may be manufactured by: forming an anode on a substrate; forming an organic thin layer in accordance with a dry coating method such as evaporation, sputtering, plasma plating, and ion plating, or a wet coating method such as spin coating, dipping, and flow coating; and providing a cathode thereon.

Another embodiment provides a display device including the organic photoelectric device according to the above embodiment.

Hereinafter, the embodiments are illustrated in more detail with reference to examples. These examples, however, should not in any sense be interpreted as limiting the scope of the claims.

Preparation of Compound for Organic Optoelectronic Device

Example 1: Synthesis of Compound A-141

The compound A-141 as an example of a compound for an organic optoelectronic device according to the present disclosure is synthesized according to the following Reaction Scheme 1.

Reaction Scheme 1

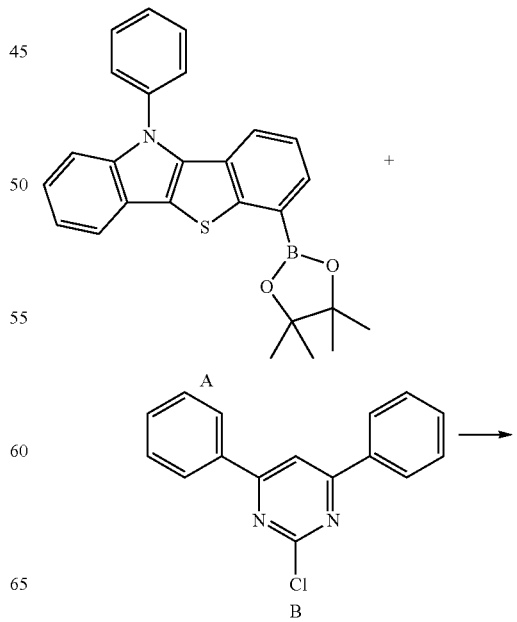

-continued

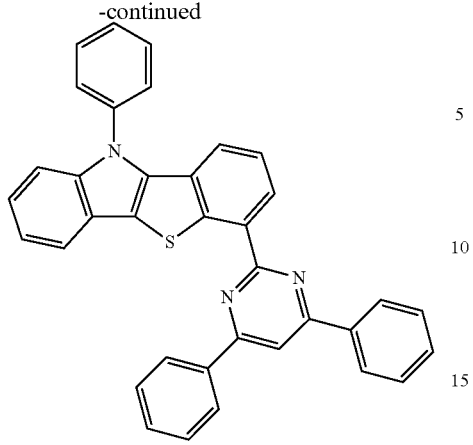

20 grams ("g") (47.01 millimoles ("mmol")) of a compound A and 15.047 g (56.41 mmol) of a compound B, 2.16 g (2.35 mmol) of tetrakis(triphenylphosphine)palladium (O), and 12.995 g (94.02 mmol) of potassium carbonate are suspended in a mixture of THF/toluene/distilled water in a ratio of 100/100/100. Then, the suspended reactant is refluxed and agitated for 18 hours. When the reaction is complete, the reactant is cooled down to room temperature, and 300 milliliters ("mL") of methanol is added thereto. The mixture is agitated, and a precipitate produced therein is filtered and cleaned with methanol and distilled water. The obtained solid is dissolved in 650 mL of toluene, and then silica-filtered. The obtained product is heated and dissolved in a mixed solvent of toluene and mono chloro benzene in a ratio of 220/220 mL. After evaporating about 110 mL of the solvent, the remaining product is cooled down for recrystallization. As a result, 18.0 g of a compound A-141 is obtained (a yield of 72%).

$^1$H-NMR (300 MHz, CDCl$_3$): δ 8.93 (d, 1H); 8.44 (d, 4H); 8.06 (s, 1H); 7.95 (m, 1H); 7.64 (m, 11H); 7.48 (d, 1H); 7.43 (d, 1H); 7.38 (m, 1H); 7.30 (m, 2H).

Example 2: Synthesis of Compound A-143

Reaction Scheme 2

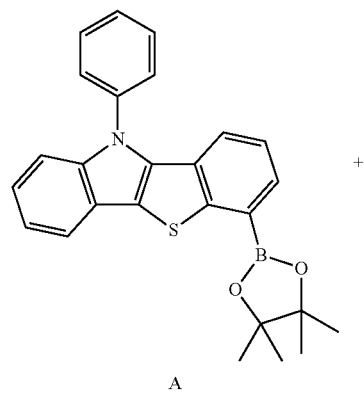

-continued

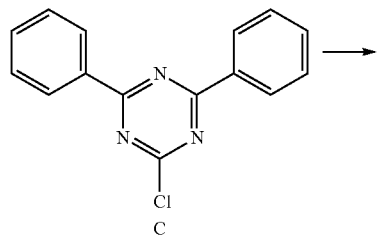

A compound A-143 is obtained through the same reaction as Example 1, except for using 15.105 g (56.42 mmol) of a compound C instead of the compound B. 21.0 g of the compound A-143 is obtained (a yield of 84%).

$^1$H-NMR (300 MHz, CDCl$_3$): δ 9.00 (d, 1H); 8.93 (m, 4H); 8.00 (m, 1H); 7.65 (m, 10H); 7.58 (d, 1H); 7.55 (d, 1H); 7.45 (d, 1H); 7.38 (m, 1H); 7.33 (m, 2H).

Example 3: Synthesis of Compound A-136

Reaction Scheme 3

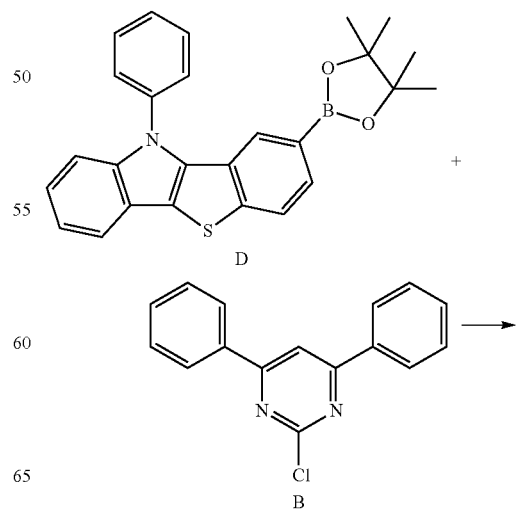

-continued

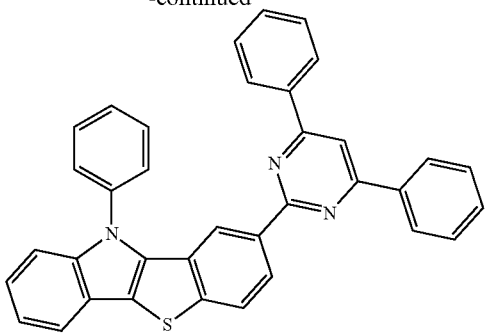

A compound A-143 is obtained through the same reaction as Example 1, except for using 20 g (47.01 mmol) of a compound D instead of the compound A. 20.5 g of the compound A-136 is obtained (a yield of 82%).

$^1$H-NMR (300 MHz, CDCl$_3$): δ 8.78 (s, 1H); 8.70 (d, 1H); 8.17 (m, 4H); 8.01 (d, 1H); 7.96 (s, 1H); 7.85 (m, 1H); 7.74 (s, 5H); 7.56 (m, 6H); 7.42 (m, 1H); 7.31 (m, 2H).

Manufacture of Organic Light Emitting Diode

An organic light emitting diode in general has a stacked structure of a anode/an organic emission layer/a cathode, but various stacked structures of an anode/a hole injection layer ("HIL")/a hole transport layer ("HTL")/an emission layer/an electron transport layer ("ETL")/an electron injection layer ("EIL")/a cathode, an anode/a hole injection layer ("HIL")/a hole transport layer ("HTL")/an emission layer/a hole blocking layer/an electron transport layer ("ETL")/an electron injection layer ("EIL")/a cathode, an anode/hole injection layer ("HIL")/a hole-producing layer/a hole transport layer ("HTL")/an emission layer/a hole-blocking layer/an electron transport layer ("ETL")/an electron injection layer ("EIL")/a cathode, or these stacked structures having no electron injection layer ("EIL") may be used. The compound represented by the above Chemical Formula 1 may be used as an emission layer material.

Preparation Example 1

An ITO glass substrate is cut into a size of 50 millimeters ("mm")×50 mm×0.5 mm, respectively ultrasonic wave cleaned with acetone isopropyl alcohol and pure water for 15 minutes, and UV ozone cleaned for 30 minutes. Next, m-MTDATA is vacuum-deposited to form a 600 Angstrom ("Å")-thick hole injection layer ("HIL") at a deposition rate of 1 Angstrom per second ("Å/sec") on the substrate, and α-NPD is vacuum-deposited to form a 300 Å-thick hole transport layer ("HTL") at a deposition rate of 1 Å/sec thereon. Then, a 400 Å-thick emission layer is formed by respectively vacuum-depositing a dopant material, Ir(ppy)3 and the compound according to Example 1 at each deposition rate of 0.1 Å/sec and 1 Å/sec on the hole transport layer ("HTL"). On the emission layer, a 50 Å-thick hole-blocking layer is formed by vacuum-depositing BAlq at a deposition rate of 1 Å/sec. Then, a 300 Å-thick electron transport layer ("ETL") is formed by vacuum-depositing an Alq3 compound on the hole-blocking layer. On the electron transport layer ("ETL"), an electron injection layer ("EIL") and a cathode are sequentially formed by vacuum-depositing LiF to be 10 Å thick and Al to be 2,000 Å thick, fabricating an organic light emitting diode. This organic light emitting diode is called Sample 1.

Preparation Example 2

An organic light emitting diode having a structure of ITO/m-MTDATA (600 Å)/α-NPD (300 Å)/Example 2+10% (Ir(ppy)3) (400 Å)/Balq (50 Å)/Alq3 (300 Å)/LiF (10 Å)/Al (2,000 Å) is fabricated according to the same method as Example 1, except for using the compound according to Example 2 instead of the compound according to Example 1 as a host in Preparation Example 1.

This organic light emitting diode is called Sample 2.

Preparation Example 3

An organic light emitting diode having a structure of ITO/m-MTDATA (600 Å)/α-NPD (300 Å)/Example 3+10% (Ir(ppy)3) (400 Å)/Balq (50 Å)/Alq3 (300 Å)/LiF 10 Å/Al (2,000 Å) is fabricated according to the same method as Example 1, except for using the compound according to Example 3 instead of the compound according to Example 1 as a host in Preparation Example 1. This organic light emitting diode is called Sample 3.

Comparative Preparation Example 1

An organic light emitting diode having a structure of ITO/m-MTDATA (600 Å)/α-NPD (300 Å)/CBP+10% (Ir(ppy)3) (400 Å)/Balq (50 Å)/Alq3 (300 Å)/LiF (10 Å)/Al (2,000 Å) is fabricated according to the same method as Example 1, except for using CBP instead of the compound according to Example 1 as a host in Preparation Example 1.

The organic light emitting diodes according to Preparation Examples 1 to 3 and Comparative Preparation Example 1 are evaluated regarding characteristics. The evaluation is performed according to the following references. The results are provided in the following Table 1.

(1) Measurement of Current Density Change Depending on Voltage Change

The obtained organic light emitting diodes are measured regarding current value flowing in a unit device, while their voltages are increased from −5 volts ("V") to 10 V using a current-voltage meter (Keithley 2400). The measured current value is divided by an area to calculate current density.

(2) Measurement of Luminance Change Depending on Voltage Change

The organic light emitting diodes are measured regarding luminance using a luminance meter (Minolta Cs-1000A), while their voltages are increased from −5 V to 10 V.

(3) Measurement of Luminous Efficiency

Current efficiency (candelas per ampere, cd/A) and electric power efficiency (lumens per watt, lm/W) at the same luminance (1,000 candelas per square meter, cd/m$^2$) are calculated by using the luminance and current density from (1) and (2) and a voltage.

TABLE 1

| | Luminance (cd/m$^2$) | Current efficiency (cd/A) | Driving voltage (V) |
|---|---|---|---|
| Preparation Example 1 | 3,500 | 35 | 6.2 |
| Preparation Example 2 | 3,500 | 42 | 6.0 |
| Preparation Example 3 | 3,500 | 47 | 5.8 |
| Comparative Preparation Example 1 | 3,500 | 30 | 8.1 |

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present inventive concept in any way.

What is claimed is:

1. A compound for an organic optoelectronic device represented by Chemical Formula 1:

Chemical Formula 1

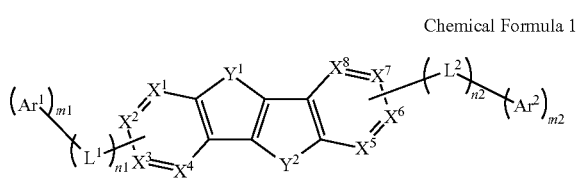

wherein, in Chemical Formula 1,
- $Y^1$ is NR', wherein R' is a substituted or unsubstituted C6 to C30 aryl group,
- $Y^2$ is —O—, —S—, or —S(O$_2$)—,
- $X^1$ to $X^8$ are independently —CR'— or —N—, any two adjacent $X^1$ to $X^8$ form a fused ring, wherein
- R' are independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthio group, a substituted or unsubstituted C6 to C20 arylthio group, a substituted or unsubstituted C1 to C20 heterocyclothio group, a substituted or unsubstituted C1 to C20 ureide group, a substituted or unsubstituted C3 to C40 silyl group, or a combination thereof,
- one of $X^1$ to $X^4$ is —CR'—, wherein R' forms a bond with an adjacent substituent,
- one of $X^5$ to $X^8$ is —CR'—, wherein the R' forms a bond with an adjacent substituent,
- one of Ar$^1$ and Ar$^2$ is hydrogen and the other of Ar$^1$ and Ar$^2$ is a substituted or unsubstituted quinolinyl group, a substituted or unsubstituted isoquinolinyl group, a substituted or unsubstituted pyridyl group, a substituted or unsubstituted pyrimidinyl group, a substituted or unsubstituted triazinyl group, or a combination thereof, wherein a substituent of the substituted quinolinyl group, the substituted isoquinolinyl group, the substituted pyridyl group, the substituted pyrimidinyl group, and the substituted triazinyl group is a C1 to C30 alkyl group, a C6 to C30 aryl group, or a combination thereof,
- $L^1$ and $L^2$ are independently a substituted or unsubstituted C2 to C20 alkenylene group, a substituted or unsubstituted C2 to C20 alkynylene group, a substituted or unsubstituted C6 to C30 arylene group, a substituted or unsubstituted C2 to C30 heteroarylene group, or a combination thereof,
- n1 and n2 are independently integers ranging from 0 to 3,
- m1 and m2 are independently integers ranging from 1 to 3.

2. The compound for an organic optoelectronic device of claim 1, wherein $Y^2$ is —O— or —S—.

3. The compound for an organic optoelectronic device of claim 1, wherein all $X^1$ to $X^8$ are —CR'—.

4. A compound for an organic optoelectronic device represented by one of Chemical Formulae A-70 to A-89, and A-110:

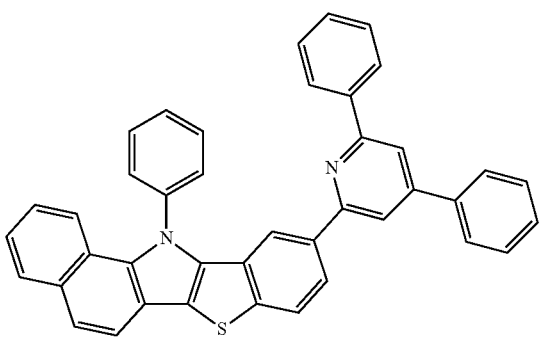

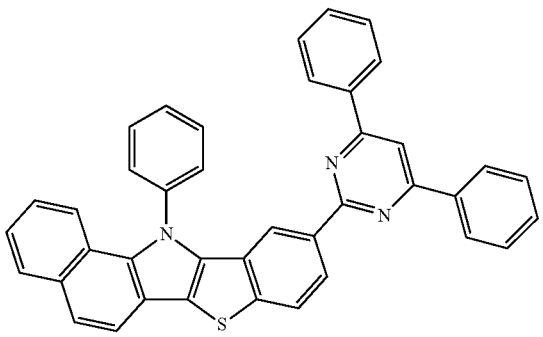

A-70

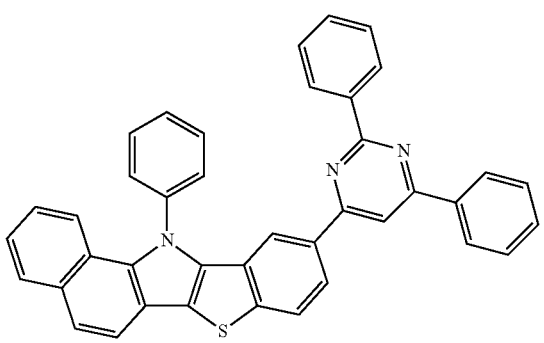

A-71
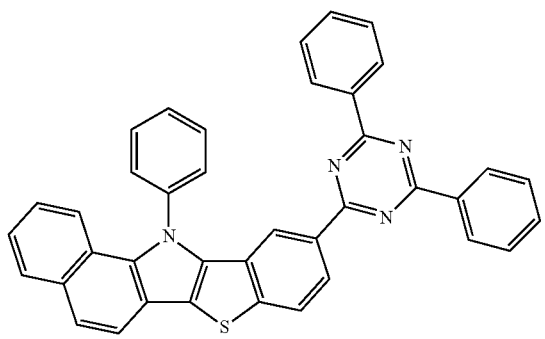
A-72
A-73
A-74
A-75
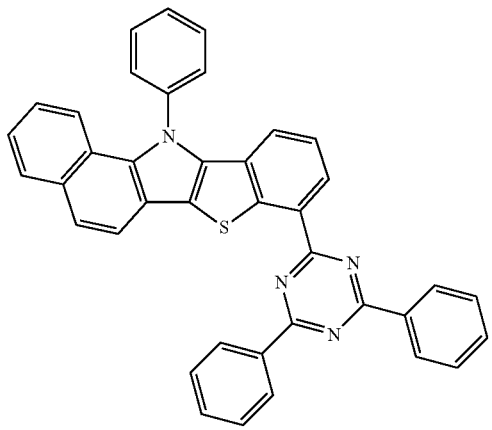
A-76
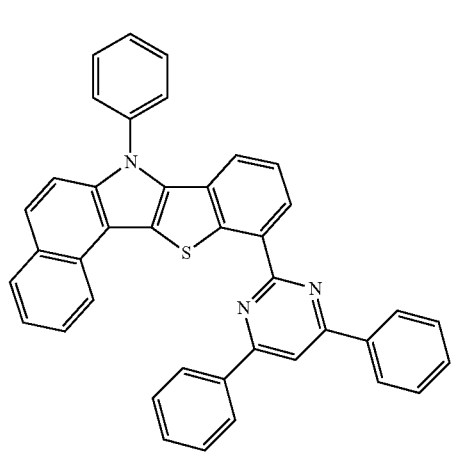
A-77
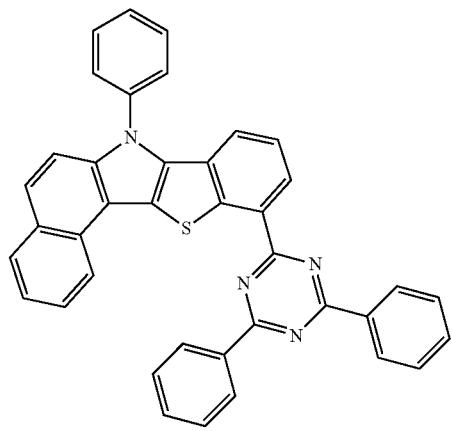

A-78
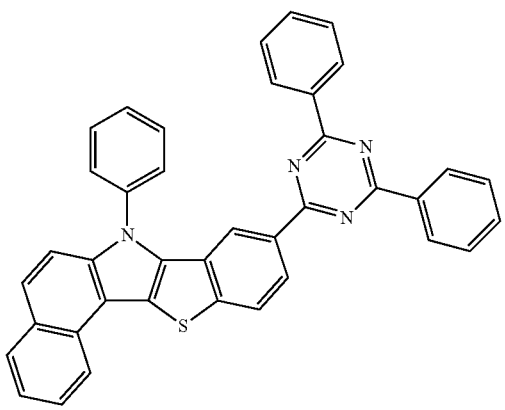
A-79
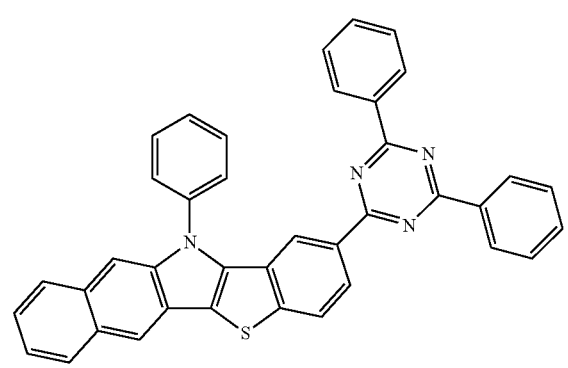
A-80
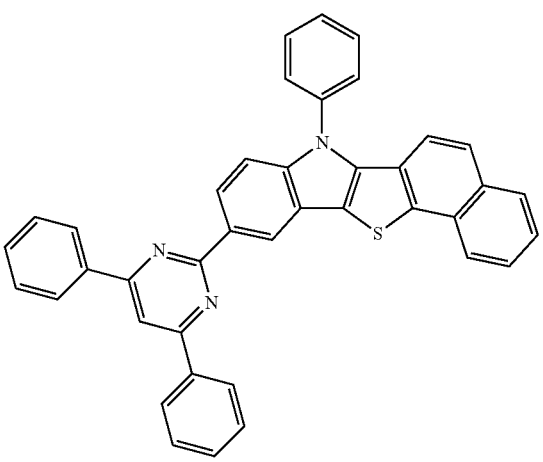
A-81
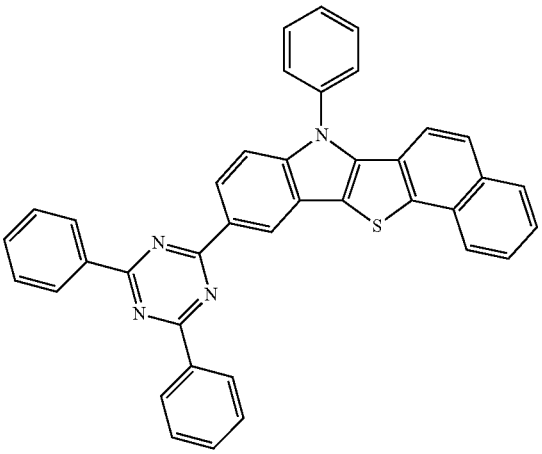
A-82
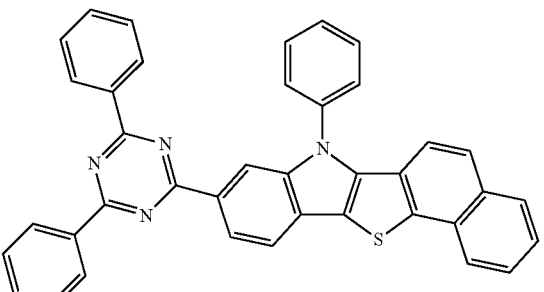
A-83
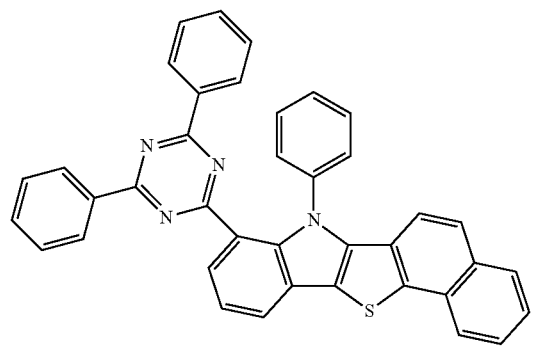
A-84
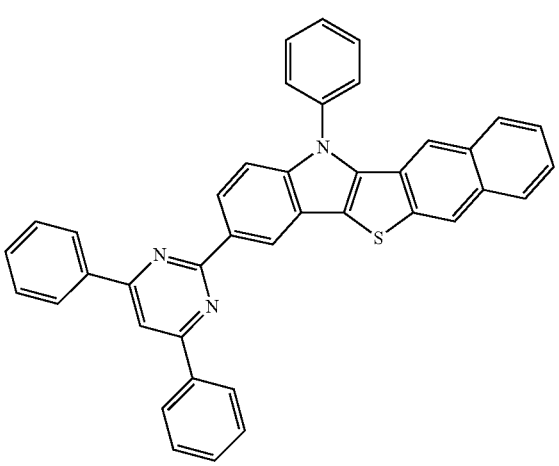

A-85

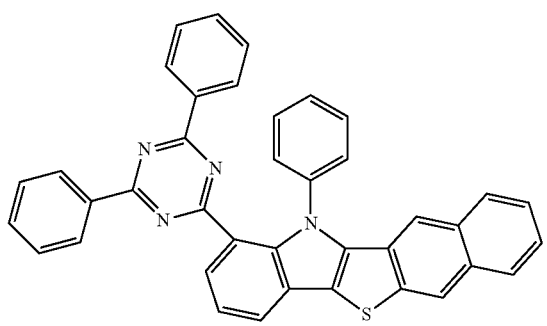

A-86

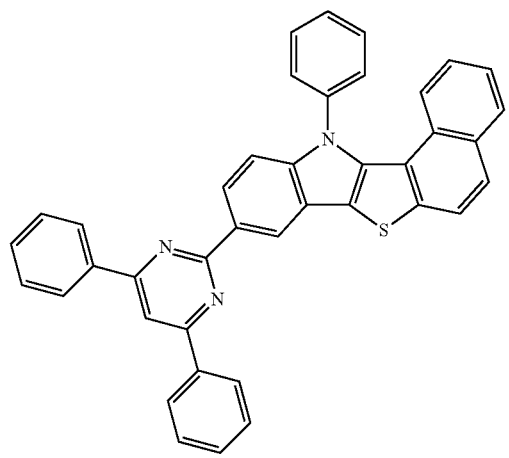

A-87

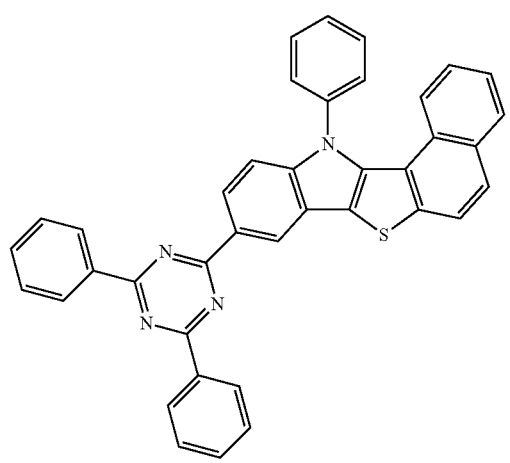

A-88

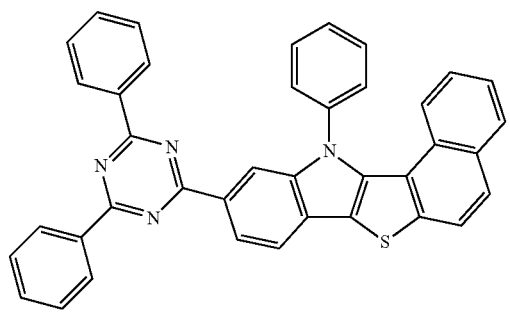

A-89

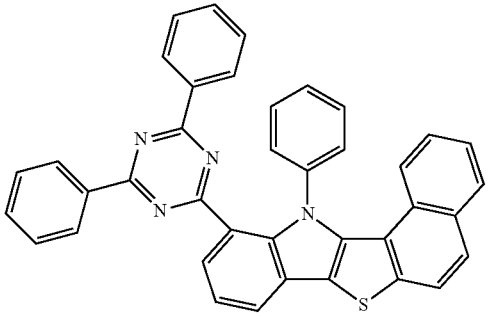

A-110

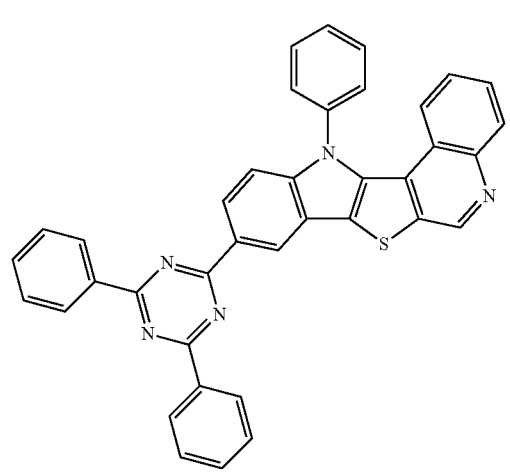

5. The compound for an organic optoelectronic device of claim 1, wherein the compound for an organic optoelectronic device has a molecular weight of less than or equal to about 900.

6. The compound for an organic optoelectronic device of claim 1, wherein the compound for an organic optoelectronic device has a molecular weight of about 600.

7. An organic light emitting diode comprising
  an anode,
  a cathode, and
  at least one organic thin layer interposed between the anode and cathode,
  wherein the at least one organic thin layer comprises the compound for an organic optoelectronic device of claim 1.

8. The organic light emitting diode of claim 7, wherein the compound for an organic optoelectronic device is a phosphorescent or fluorescent host material in an emission layer.

9. A display device comprising the organic light emitting diode according to claim 7.

* * * * *